United States Patent
Ota

(10) Patent No.: US 6,359,678 B1
(45) Date of Patent: Mar. 19, 2002

(54) EXPOSURE APPARATUS, METHOD FOR PRODUCING THE SAME, AND EXPOSURE METHOD

(75) Inventor: Kazuya Ota, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/567,971

(22) Filed: May 10, 2000

Related U.S. Application Data

(63) Continuation of application No. PCT/JP98/05118, filed on Nov. 13, 1998.

(30) Foreign Application Priority Data

Nov. 14, 1997 (JP) .............................................. 9-330861
Nov. 14, 1997 (JP) .............................................. 9-330862

(51) Int. Cl.[7] ........................ G03B 27/42; G03B 27/52; G03B 27/34; H01J 3/14
(52) U.S. Cl. ........................... 355/53; 355/55; 355/57; 355/60; 355/67; 355/77; 355/30; 359/512; 250/216; 250/492.2; 250/548
(58) Field of Search .............................. 355/53, 55, 57, 355/60, 67, 77, 30; 359/512; 250/548, 216, 492.2

(56) References Cited

U.S. PATENT DOCUMENTS

| | | |
|---|---|---|
| 4,780,617 A | 10/1988 | Umatate et al. |
| 5,153,898 A | 10/1992 | Suzuki et al. |
| 5,194,893 A | 3/1993 | Nishi |
| 5,448,332 A | 9/1995 | Sakakibara et al. |
| 5,473,410 A | 12/1995 | Nishi |
| 5,473,424 A | 12/1995 | Okumura |
| 5,581,324 A | 12/1996 | Miyai et al. |
| 5,696,623 A | * 12/1997 | Fujie et al. .................. 359/350 |
| 5,812,242 A | * 9/1998 | Tokuda ......................... 355/30 |
| 5,825,043 A | * 10/1998 | Suwa .......................... 250/548 |
| 6,235,438 B1 | 5/2001 | Suzuki et al. |

FOREIGN PATENT DOCUMENTS

| | | |
|---|---|---|
| JP | 61-44429 | 3/1986 |
| JP | A-2-180013 | 7/1990 |
| JP | A-4-155814 | 5/1992 |
| JP | 6-283403 | 10/1994 |
| JP | 7-201699 | 8/1995 |
| JP | A-8-31718 | 2/1996 |
| JP | A-8-45824 | 2/1996 |
| JP | 8-45824 | 2/1996 |

OTHER PUBLICATIONS

U.S. application Ser. No. 09/885,404, Jun. 2001, Ebihara.

* cited by examiner

*Primary Examiner*—Russell Adams
*Assistant Examiner*—Khaled Brown
(74) *Attorney, Agent, or Firm*—Oliff & Berridge PLC

(57) ABSTRACT

When an illumination light beam is radiated by an illumination system at a predetermined angle of incidence θ with respect to a pattern plane of a mask, the illumination light beam is reflected by the pattern plane. The reflected light beam is projected by a projection optical system PO onto a substrate, and a pattern in an area on the mask illuminated with the illumination light beam is transferred onto the substrate. During the transfer, a stage control system is operated to synchronously move a mask stage and a substrate stage in the Y direction, while adjusting a relative position of the mask in the Z direction with respect to the projection optical system, on the basis of predetermined adjusting position information. Accordingly, although the mask side of the projection optical system is non-telecentric, it is possible to effectively suppress the occurrence of the magnification error and the positional discrepancy in a transferred image of the pattern on the substrate due to Z displacement of the mask. As a result, the overlay accuracy is improved. The present invention is especially preferred to perform exposure at high resolution with an illumination light beam in the soft X-ray region.

111 Claims, 16 Drawing Sheets

EXPOSURE APPARATUS, METHOD FOR PRODUCING THE SAME, AND EXPOSURE METHOD

This is a Continuation of application No. PCT/JP98/05118 filed Nov. 13, 1998. The entire disclosure of the prior application(s) is hereby incorporated by reference herein in its entirety.

BACKGROUND OF THE INVENTION

1. Cross-reference

This application is a Continuation of International Application PCT/JP98/05118 which was filed on Nov. 13, 1998 claiming the conventional priority of Japanese patent application Nos. 9-330861 and 9-330862 filed on Nov. 14, 1997, respectively.

2. Field of the Invention

The present invention relates to an exposure apparatus and an exposure method based on the use of a reflecting type mask. In particular, the present invention relates to an exposure apparatus and a method for producing the same, as well as an exposure method to be used, for example, when a circuit device such as a semiconductor element and a liquid crystal display element is produced in accordance with a lithography step.

3. Description of the Related Art

At present, a circuit device (for example, D-RAM of 64 M (mega) bits) having a minimum line width of about 0.3 to 0.35 µm is mass-produced in the production site for the semiconductor device by using a reduction projection exposure apparatus, i.e., a so-called stepper based on the use of an illumination light beam of an i-ray of a mercury lamp having a wavelength of 365 nm. Simultaneously, an exposure apparatus has been introduced in order to produce a circuit device of the next generation having a degree of integration of about 256 M bits or 1 G (giga) bits D-RAM class with a minimum line width of not more than 0.25 µm.

A scanning type exposure apparatus based on the step-and-scan system is developed as an exposure apparatus for producing the next generation circuit device, in which the illumination light beam is an ultraviolet pulse laser beam having a wavelength of 248 nm radiated from a KrF excimer laser light source or an ultraviolet pulse laser beam having a wavelength of 193 nm radiated from an ArF excimer laser light source, and a mask or a reticle (hereinafter generally referred to as "reticle") with a depicted circuit pattern and a wafer as a photosensitive substrate are subjected to relative one-dimensional scanning with respect to a projection field of a reduction projection optical system to thereby repeat the stepping operation between shots and the scanning exposure operation for transferring the entire circuit pattern on the reticle into one shot area on the wafer.

It is certain that the degree of integration of the semiconductor device may be further increased to be high in future, and those having 1 G bits may be replaced with those having 4 G bits. In such a situation, the device rule is 0.1 µm, i.e., about 100 nm L/S. There are numerous technical tasks if such a situation is dealt with the exposure apparatus which uses the illumination light beam of the ultraviolet pulse laser beam having the wavelength of 193 nm as described above. The resolution of the exposure apparatus to represent the device rule (practical minimum line width) is generally represented by the following expression (1) with the exposure wavelength λ and the numerical aperture N.A. of the projection optical system.

$$(\text{Resolution})=k\cdot\lambda/\text{N.A.} \quad (1)$$

In the expression, k represents a positive constant called "k factor" of not more than 1, and it differs depending on, for example, the characteristic of the resist to be used.

As clarified from the foregoing expression (1), it is extremely effective to decrease the wavelength λ in order to enhance the resolution. Therefore, recently, the development is started for an EUV exposure apparatus which uses, as an exposure light beam, a light beam in the soft X-ray region having a wavelength of 5 to 15 nm (in this specification, the light beam is referred to as "EUV (Extreme Ultra Violet) light beam" as well). Such an EUV exposure apparatus attracts the attention as a hopeful candidate for the next generation exposure apparatus having a minimum line width of 100 nm.

The EUV exposure apparatus generally uses a reflecting type reticle. An illumination light beam is radiated obliquely onto the reflecting type reticle. A reflected light beam from the reticle surface is projected onto a wafer via a projection optical system. Thus, a pattern in an illumination area on the reticle is transferred onto the wafer. In the case of the EUV exposure apparatus, the scanning exposure method is adopted as follows, in order to transfer the pattern by utilizing only a portion of the projection optical system in which the image formation performance is excellent. That is, a ring-shaped illumination area is set on the reticle, and the entire surface of the pattern on the reticle is successively transferred onto the wafer via the projection optical system by relatively scanning the reticle and the wafer with respect to the projection optical system.

The reason why the reflecting type reticle is used is as follows. That is, there is no substance for producing a reticle which efficiently transmit the light without any absorption at the wavelength (5 to 15 nm) of light used for the EUV exposure apparatus. Further, it is also difficult to prepare a beam splitter. Therefore, it is necessary that the illumination light beam is radiated obliquely with respect to the reticle.

For this reason, the side of the reticle is non-telecentric. The displacement of the reticle in the direction along the optical axis appears as the change in magnification in the longitudinal direction and as the change in position in the transverse direction of the ring-shaped exposure area on the wafer (area on the wafer corresponding to the ring-shaped illumination area on the reticle).

Explanation will be made referring to specified numerical values. It is assumed that an EUV light beam having a wavelength of 13 nm is used as an exposure light beam to design a projection optical system having a resolution of 100 nm L/S.

The foregoing expression (1) can be converted into the following expression (2).

$$\text{N.A.}=k\cdot\lambda/(\text{resolution}) \quad (2)$$

It is now assumed that k=0.8 is given. According to the expression (2), it is comprehensive that N.A. necessary to obtain the resolution of 100 nm L/S is N.A.=0.104≈0.1. Of course, this N.A. represents a value on the wafer side, which is different from N.A. on the reticle side.

It is now assumed that the projection magnification of the projection optical system is 4:1 which is generally used for the conventional far ultraviolet ray exposure apparatus (DUV exposure apparatus) which uses the exposure light beam of i-ray, g-ray, KrF excimer laser beam, or ArF excimer laser beam. If N.A. is 0.1 on the wafer side, N.A. on the reticle side is ¼ of this value, i.e., 0.025. This fact means the fact that the illumination light beam radiated onto the reticle has a broadening of an angle of about ±25 mrad with respect to the main ray of light. Therefore, in order not to superimpose the incoming light beam an the reflected light beam with each other, it is necessary that the angle of incidence is not less than 25 mrad at the minimum.

For example, with reference to FIG. 16, it is assumed that the angle of incidence θ (=outgoing angle θ) is 50 mrad. The lateral discrepancy ϵ of the circuit pattern depicted on the reticle R with respect to the displacement ΔZ in the Z direction of the pattern plane of the reticle R (hereinafter appropriately referred to as "displacement of the reticle in the Z direction" as well) is represented by the following expression (3).

$$\epsilon = \Delta Z \cdot \tan \theta \quad (3)$$

According to the expression (3), the following fact is comprehensible. That is, for example, if the reticle R is displaced by 1 μm in the vertical direction (Z direction) in FIG. 16, the lateral discrepancy of the image on the reticle pattern plane is about 50 nm. On the wafer, the image shift occurs in an amount of ¼ of this value, i.e., 2.5 nm. It is also approved that the overlay error (superimposing error), which is allowable in the semiconductor process with the device rule of 100 nm L/S, is not more than 30 nm. The occurrence of the overlay error of 12.5 nm, which is caused by only the displacement of the reticle in the Z direction, is considered to be extremely severe. That is, the overlay error may be caused in an amount of about 10 nm respectively by other factors including, for example, the positioning accuracy (alignment accuracy) between the reticle and the wafer, the positioning accuracy of the wafer stage including the so-called stepping accuracy, and the distortion of the projection optical system.

The displacement of the reticle in the Z direction is also caused by the parallelism of the reticle and the flatness of the reticle holder for supporting the reticle. Therefore, it is now urgent to develop the technique to reduce the overlay error caused by the displacement of the reticle in the Z direction as described above.

The material, which has been developed until the present for the reflective film to be formed on the pattern plane of the reflecting type reticle, has a reflectance of about 70% at most. For this reason, the remain of 30% is absorbed, and it is converted into heat, resulting in the increase in temperature of a mirror (reflecting optical element) for constructing the reflecting optical system. In the worst case, the mirror is greatly deformed due to the increase in temperature, making it impossible to maintain a sufficient image formation characteristic. Therefore, in the conventional EUV exposure apparatus, the heat of the mirror is released by applying a forcible cooling means disposed on the back surface of the mirror, for example, by applying the liquid cooling or the cooling based on a Peltier element.

In this case, those assumed as the material for the mirror include low expansion glass and metal. The low expansion glass has an extremely small coefficient of linear expansion with respect to the temperature change. Therefore, the displacement amount thereof does not deteriorate the image formation performance with respect to a considerable degree of the temperature change. However, there is a certain limit. Therefore, it is desirable to perform the cooling.

However, the following inconvenience arises, because the low expansion glass has an extremely low coefficient of thermal conductivity. That is, in the case of the technique in which the back surface side of the mirror is merely cooled as described above, a lot of time is required until the heat generated on the front surface of the mirror is transmitted to the back surface. As a result, a temperature gradient arises from the front surface of the mirror to the back surface. It is impossible to sufficiently cool the front surface of the mirror, i.e., the reflecting surface which is most important. Consequently, the reflecting surface is deformed, and the image formation characteristic of the projection optical system is deteriorated. Therefore, it is feared that the image of the pattern transferred onto the substrate (hereinafter referred to as "transferred image" as well) may be deteriorated.

The deterioration of the transferred image may be also caused by the thermal variation (variation of radiation) due to the absorption of the illumination light beam by the mask on which the pattern is formed.

The present invention has been made under the circumstances as described above, a first object of which is to provide an exposure apparatus, especially an exposure apparatus including a reflecting optical system as a projection optical system which makes it possible to improve the overlay accuracy of the pattern during exposure.

A second object of the present invention is to provide an exposure method which makes it possible to improve the overlay accuracy of the pattern during exposure.

A third object of the present invention is to provide an exposure apparatus, especially an exposure apparatus including a reflecting optical system as a projection optical system which makes it possible to effectively suppress the deterioration of the transferred image resulting from the variation of radiation of a mask or a projection optical system caused by radiation of an illumination light beam (hereinafter referred to as "variation of radiation").

SUMMARY OF THE INVENTION

According to a first aspect of the present invention, there is provided an exposure apparatus for transferring a pattern formed on a reflecting type mask (R) onto a substrate (W), the exposure apparatus comprising a projection optical system (PO) provided with a reflecting type optical system which projects the pattern onto the substrate (W); a mask stage (RST) which holds the mask; a substrate stage (WST) which holds the substrate; an illumination system (12, 30, M, 44) which radiates an exposing illumination light beam (EL) onto the mask at a predetermined angle of incidence with respect to a pattern plane of the mask; and a stage control system (80, 34, 62) which synchronously moves the mask stage and the substrate stage in a second axis direction perpendicular to a first axis direction, while adjusting a position of the mask in the first axis direction which is a direction of an optical axis of the projection optical system, on the basis of predetermined adjusting position information, in order to transfer the pattern on the mask illuminated with the exposing illumination light beam onto the substrate via the projection optical system.

According to the exposure apparatus of the present invention, when the exposing illumination light beam is radiated at the predetermined angle of incidence onto the pattern plane of the mask by the illumination system, the illumination light beam is reflected by the pattern plane of the mask. The reflected exposing illumination light beam is projected onto the substrate by the projection optical system composed of the reflecting optical system. The pattern in the area on the mask, which is illuminated with the illumination light beam, is transferred onto the substrate. When the mask pattern is transferred, the stage control system is operated such that the mask stage and the substrate stage are synchronously moved in the second axis direction perpendicular to the first axis direction, while adjusting the position of the mask in the first axis direction as the direction of the optical axis of the projection optical system on the basis of the predetermined adjusting position information. Accordingly, the entire surface of the pattern on the mask is successively transferred onto the substrate in accordance with the scanning exposure. During this process, the position of the mask in the direction (first axis direction) of the optical axis of the projection optical system is adjusted on the basis of the adjusting position information. Therefore, although the mask side of the projection optical system is non-telecentric, it is possible to effectively suppress the occurrence of the magnification error and the positional discrepancy in the transferred image of the pattern on the substrate due to the displacement of the mask in the direction of the optical axis. As a result, it is possible to improve the overlay accuracy.

In the exposure apparatus described above, the adjusting position information includes first adjusting position information and second adjusting position information corresponding to a movement direction of the mask stage (RST) on the second axis; and the stage control system (80, 34, 62) may adjust the position of the mask in the first axis direction by using the adjusting position information corresponding to the movement direction, of the first adjusting position information and the second adjusting position information for each movement direction of the mask stage during the synchronous movement of the mask stage and the substrate stage (WST). The exposure apparatus is effective for the exposure apparatus of the so-called alternate scan type in which when the mask stage is moved to perform the scanning exposure, the scanning exposure is executed not only when the mask stage is moved from one side to the other side in the scanning direction but also when the mask stage is moved in a direction opposite to the above. That is, the stage control system adjusts the position of the mask in the first axis direction by using the adjusting position information corresponding to the movement direction, of the first adjusting position information and the second adjusting position information for each movement direction of the mask stage during the synchronous movement of the mask stage and the substrate stage. Therefore, even when the positional displacement in the first axis direction during the synchronous movement differs depending on, for example, any mechanical factor (movement characteristic of the stage) between the movement of the mask stage from one side to the other side in the second axis and the movement from the other side to one side, the position of the mask in the first axis direction can be adjusted highly accurately without being affected thereby. It is possible to effectively suppress the occurrence of the magnification error and the positional discrepancy in the transferred image of the pattern on the substrate due to the displacement of the mask in the direction of the optical axis.

In such an arrangement, for example, the adjusting position information may be previously measured information. In this arrangement, the adjustment can be made in accordance with, for example, the feedforward control on the basis of the previously measured information without measuring the displacement of the mask in the first axis direction during the synchronous movement of the mask stage and the substrate stage. Therefore, the adjusting error scarcely occurs due to any control delay upon the adjustment. Further, it is possible to use a simple constitutive component for adjusting the position of the mask in the first axis direction.

However, it is also preferable that when the exposure apparatus further comprises a measuring unit (RIFZ) which measures the position of the mask (R) in the first axis direction, then the stage control system (80, 34, 62) measures the adjusting position information by using the measuring unit during the synchronous movement of the mask stage (RST) and the substrate stage (WST), and it adjusts the position of the mask in the first axis direction by using the adjusting position information.

In this arrangement, a variety of measuring units are conceived as the measuring unit. For example, it is also preferable that the measuring unit is an interferometer (RIFZ) which measures the position of the mask in the first axis direction by radiating a measuring beam perpendicularly onto the mask and receiving a reflected light beam therefrom. In this arrangement, it is possible to measure and adjust the position of the mask in the direction of the optical axis during the synchronous movement highly accurately (for example, at an accuracy of not more than several nm to 1 nm) without affecting the exposing illumination light beam coming into the pattern plane on the mask at a predetermined angle of incidence and being reflected by the same outgoing angle as that of the angle of incidence, while the measuring beam o f the interferometer is not affected by the exposing illumination light beam.

In this arrangement, there is no special limitation concerning the position of radiation of the measuring beam radiated from the interferometer onto the mask and the number of measuring beams. However, for example, it is desirable that the interferometer (RIFZ) radiates at least two measuring beams onto an irradiated area (IA) of the mask (R) to be irradiated with the exposing illumination light beam, and it measures the position of the mask (R) in the first axis direction for each irradiated position of each of the measuring beams. In this arrangement, the two measuring beams are radiated by the interferometer onto the irradiated area of the exposing illumination light beam as the objective area for the pattern transfer at every moment. The position of the mask in the first axis direction is measured at each position. Therefore, as a result, it is possible to adjust not only the position in the first axis direction but also the inclination in the objective area for the pattern transfer on the mask at every moment on the basis of the most accurate measured data. Consequently, it is possible to further improve the overlay accuracy.

In the exposure apparatus described above, the interferometer has the following feature. That is, the interferometer radiates the measuring beam onto different positions of the mask in the second axis direction, and it measures the position of the mask in the first axis direction for each irradiated position of the measuring beam. In this arrangement, it is possible to adjust the positional discrepancy in the direction of the optical axis and the inclination discrepancy of the mask during the synchronous movement of the mask stage and the substrate stage at least for the second axis direction (direction of the synchronous movement).

In the exposure apparatus described above, it is also preferable that the interferometer (RIFZ) has a reference mirror fixed to the projection optical system (PO), and a main interferometer body arranged at a position separated from the projection optical system. In this arrangement, the main interferometer body is disposed at the position separated from the projection optical system. Therefore, it is possible to avoid any bad influence on optical characteristics of the projection optical system or various sensors such as an alignment sensor and a focus sensor fixed thereto, which would be otherwise caused by the heat generated by the main interferometer body.

In the exposure apparatus described above, it is also preferable that the stage control system (80, 34, 62) adjust the position of the mask in the first axis direction in accordance with feedforward control by using the measured adjusting position information. Alternatively, it is also preferable that the stage control system adjust the position of the mask in the first axis direction in accordance with feedback control by using the measured adjusting position information. In the case of the former, it is necessary for the stage control system to perform the so-called pre-reading control in order to measure the position of the mask in the direction of the optical axis before the objective area for the pattern transfer at every moment on the mask arrives at the irradiated area to be irradiated with the exposing illumination light beam. However, the position of the mask in the first axis direction can be adjusted by means of the feedforward control on the basis of the measured information. Therefore, the control delay scarcely occurs when the adjustment is performed. In the case of the latter, it is probable that the control delay occurs as compared with the former case. However, in addition to the fact that the pre-reading control is unnecessary, it is possible to adjust the position of the mask in the first axis direction with a higher degree of accuracy.

The exposure apparatus may further comprise a slit plate (44) arranged closely to the pattern plane of the mask (R) and including a first slit (44a) which defines a first illumination area (IA) on the mask to be irradiated with the exposing illumination light beam and a second slit (44b) which defines a second illumination area to be irradiated with the exposing illumination light beam at a mark (for example, RM1, RM4) portion formed on the mask; and a swinging mechanism (46) which switches the slit plate (44) between a first position for radiating the exposing illumination light beam onto the first slit (44a) and a second position for radiating the exposing illumination light beam onto the second slit (44b). According to this arrangement, the swinging mechanism switches the slit plate to the first position during the exposure so that the exposing illumination light beam may be radiated onto the first slit for defining the first illumination area on the mask. The swinging mechanism switches the slit plate to the second position during the position adjustment (alignment) for the mask so that the exposing illumination light beam may be radiated onto the second slit for defining the second illumination area for radiating the exposing illumination light beam onto the mark portion formed on the mask. Accordingly, the appropriate illumination area can be set during the exposure and during the alignment respectively by using the identical slit plate. It is unnecessary to provide slit plates depending on the respective purposes.

In the exposure apparatus described above, the mask stage (RST), the substrate stage (WST), and the projection optical system (PO) may be supported by different support members; and the apparatus may further comprise an interferometer system (70) which measures positions of the mask stage and the substrate stage in a plane including the second axis perpendicular to the first axis. In this arrangement, the interferometer system may measure relative positions of the mask stage and the substrate stage in the plane including the second axis perpendicular to the first axis with respect to the member for supporting the projection optical system. According to this arrangement, although the mask stage, the substrate stage, and the projection optical system are supported by the different support members, the positions of the mask stage and the substrate stage can be managed on the basis of the member for supporting the projection optical system, because the interferometer system measures the relative positions of the mask stage and the substrate stage in the plane including the second axis perpendicular to the first axis with respect to the member for supporting the projection optical system. Therefore, no inconvenience arises at all. That is, the mask stage, the substrate stage, and the projection optical system are not mechanically connected. Therefore, the image formation characteristics of the projection optical system are not badly affected by the reaction force caused by the rate of acceleration or deceleration during the movement of the mask stage and the substrate stage and by the vibration of the support members for the respective stages. Further, the reaction force caused by the rate of acceleration or deceleration during the movement of one of the stages does not badly affect the behavior of the other stage via the support member.

In the exposure apparatus described above, the exposing illumination light beam (EL) may be a light beam in a soft X-ray region; and the apparatus may further comprise, on the substrate stage (WST), a spatial image-measuring instrument (FM) which includes a fluorescence-generating substance (63), an aperture (SLT) formed on a surface thereof by a thin film of a reflective layer (64) or an absorbing layer for the exposing illumination light beam, and a photoelectric converter element (PM) which photoelectrically converts light generated by the fluorescence-generating substance when the exposing illumination light beam arrives at the fluorescence substance via the aperture. According to this arrangement, the apparatus further comprises, on the substrate stage, the spatial image-measuring instrument including the fluorescence-generating substance, the aperture formed on the surface thereof by the thin film of the reflective layer or the absorbing layer for the exposing illumination light beam, and the photoelectric converter element for photoelectrically converting the light generated by the fluorescence-generating substance when the exposing illumination light beam arrives at the fluorescence substance via the aperture. Therefore, usually, although there is no substance which transmits the light in the soft X-ray region as described above, the spatial image can be measured by using the exposing illumination light beam even when such a light beam is used as the exposing illumination light beam. Therefore, for example, it is possible to easily determine the projection position of the mask pattern on the substrate stage by using the spatial image-measuring instrument.

In the exposure apparatus described above, it is desirable that when the exposing illumination light beam (EL) is a light beam in a soft X-ray region; the pattern on the mask (R) is formed by applying a substance for absorbing the illumination light beam, onto a reflective layer for reflecting the exposing illumination light beam. In this arrangement, the pattern is formed (subjected to patterning) with the absorbing substance for the exposing illumination light beam. Therefore, unlike the case in which a multilayer film is subjected to patterning as a substance for reflecting the light beam in the soft X-ray region as the exposing illumination light beam, it is possible to repair the pattern in the case of failure. When the material for the absorbing substance is appropriately selected, it is possible to set a substantially identical reflectance for the reflective layer and the absorbing substance for the exposing illumination light beam with respect to the measuring beam (for example, light in the visible region) of the interferometer. It is possible to measure the position of the mask in the direction of the optical axis with a substantially identical accuracy over the entire surface on the mask.

As described in the second specified embodiment of the present invention, the exposure apparatus according to the first aspect of the present invention may further comprise a common base board which movably supports the mask stage and the substrate stage, and a surface plate which movably supports the base board, wherein the base board is movable in response to reaction force generated by movement of at least one stage of the mask stage and the substrate stage. In this arrangement, even when the scanning exposure is executed to perform the exposure while synchronously moving the mask stage and the substrate stage with respect to the illumination light beam, it is possible to suppress the vibration of the exposure apparatus based on the unbalanced load generated by the movement of the stage.

In the exposure apparatus according to the first aspect of the present invention, it is also preferable that the reflecting optical system includes a plurality of mirrors, the apparatus further comprises a heat exchanger, for example, a heat pipe which adjusts temperature of at least one of the mirrors, and the heat exchanger is installed on a non-irradiated area of a reflecting surface of at least one of the mirrors. Such a heat exchanger may be applied to exposure apparatuses according to second to fourth aspects and a seventh aspect of the present invention described later on.

According to a second aspect of the present invention, there is provided an exposure apparatus for transferring a pattern on a mask (R) onto a substrate (W), the exposure apparatus comprising an illumination optical system (PRM, IM, 30, M, 44) which has an optical axis inclined with respect to a first direction perpendicular to the mask and which radiates an illumination light beam onto the mask; a projection optical system (PO) which projects, onto the substrate, the illumination light beam reflected by the mask; a driving unit (RST, WST, 80, 34, 62) which synchronously moves the mask and the substrate at a velocity ratio corresponding to a magnification of the projection optical system; and a correcting unit (80, 34, RST) which corrects an image magnification error of the pattern by relatively moving the mask in the first direction with respect to the projection optical system during the synchronous movement.

According to the exposure apparatus concerning the second aspect, the illumination light beam in the direction of the optical axis, which is inclined with respect to the first direction perpendicular to the mask, is radiated from the illumination optical system. That is, the illumination light beam from the illumination optical system is radiated in the oblique direction onto the mask. The illumination light beam is reflected by the mask plane, the reflected light beam is projected onto the substrate by the aid of the projection optical system, and the pattern on the mask illuminated with the illumination light beam is transferred onto the substrate. Upon the transfer of the mask pattern, the driving unit is operated to synchronously move the mask and the substrate at the velocity ratio corresponding to the magnification of the projection optical system. During the synchronous movement, the correcting unit is operated to relatively move the mask in the first direction with respect to the projection optical system in order to correct the image magnification error of the pattern. Accordingly, the entire surface of the pattern on the mask is successively transferred onto the substrate in accordance with the scanning exposure. During this process, the correcting unit is operated to relatively move the mask in the first direction with respect to the projection optical system in order to correct the image magnification error of the pattern. Therefore, it is possible to effectively suppress the occurrence of the magnification error in the transferred image of the pattern on the substrate due to the displacement of the mask in the direction of the optical axis. As a result, it is possible to improve the overlay accuracy.

In this arrangement, it is also preferable that the illumination optical system (PRM, IM, 30, M, 44) radiates, as the illumination light beam (EL), an EUV light beam having a wavelength of 5 to 15 nm onto the mask (R); and the projection optical system (PO) is composed of only a plurality of reflecting optical elements. In this arrangement, the pattern on the mask is transferred onto the substrate via the projection optical system composed of only the reflecting optical elements by using the EUV light beam as the exposing illumination light beam. Therefore, it is possible to highly accurately transfer an extremely fine pattern, for example, a pattern of 100 nm L/S.

In the exposure apparatus described above, it is also preferable that when the correcting unit (80, RST, 34, RIFZ) has a measuring unit (RIFZ) which measures a position of the mask (R) in the first direction, the mask is moved on the basis of an output of the measuring unit.

According to a third aspect of the present invention, there is provided an exposure apparatus for transferring a pattern on a mask (R) onto a substrate (W), the exposure apparatus comprising an illumination optical system (PRM, IM, 30, M, 44) which radiates, onto the mask, an illumination light beam having a main light beam which is inclined with respect to a first direction perpendicular to the mask (R); a projection optical system (PO) which projects, onto the substrate, the illumination light beam outgoing from the mask; a driving unit (RST, WST, 80, 34, 62) which synchronously moves the mask and the substrate at a velocity ratio corresponding to a magnification of the projection optical system; and a correcting unit (80, RST, 34) which compensates change in image magnification of the pattern caused by the movement of the mask.

According to the exposure apparatus concerning the third aspect, the illumination optical system irradiates the mask with the illumination light beam having the main light beam which is inclined with respect to the first direction perpendicular to the mask. That is, the illumination light beam from the illumination optical system is radiated in the oblique direction onto the mask. The illumination light beam outgoing from the mask, which has the main light beam inclined with respect to the first direction perpendicular to the mask, is projected by the projection optical system onto the substrate. The pattern on the mask, which is irradiated with the illumination light beam, is transferred onto the substrate. During the transfer of the mask pattern, the driving unit is operated to synchronously move the mask and the substrate at the velocity ratio corresponding to the magnification of the projection optical system. The correcting unit compensates the change in image magnification of the pattern caused by the movement of the mask during the synchronous movement. Therefore, the entire surface of the pattern on the mask is successively transferred onto the substrate in accordance with the scanning exposure. During this process, the image magnification error of the pattern is compensated by the correcting unit. Accordingly, it is possible to effectively suppress the occurrence of the magnification error in the transferred image of the pattern on the substrate due to the movement of the mask. As a result, it is possible to improve the overlay accuracy.

In the exposure apparatus according to the third aspect, it is also preferable that the mask (R) is a reflecting type mask; the illumination optical system (PRM, IM, 30, M, 44) radiates, as the illumination light beam, an EUV light beam having a wavelength of 5 to 15 nm onto the mask; and the projection optical system (PO) is composed of only a plurality of reflecting optical elements (M1 to M4). In this arrangement, the pattern on the mask is transferred onto the substrate via the projection optical system composed of only the reflecting optical elements by using the EUV light beam as the exposing illumination light beam. Therefore, it is possible to highly accurately transfer an extremely fine pattern, for example, a pattern of 100 nm L/S.

In the exposure apparatus according to the third aspect described above, it is also preferable that the correcting unit (RST, 80, 34) includes a driving member (RST, 34) which moves the mask (R) in the first direction on an object plane side of the projection optical system during the synchronous movement. In this arrangement, it is sufficient that the driving member moves the mask in the first direction on the object plane side of the projection optical system during the synchronous movement. However, for example, it is also preferable that the driving member relatively inclines the mask with respect to the object plane of the projection optical system. In this arrangement, in addition to the movement of the mask in the first direction on the object plane side of the projection optical system by the driving member during the synchronous movement, it is also possible to adjust the inclination of the projection optical system with respect to the object plane. Therefore, although the object plane side of the projection optical system is non-telecentric, it is possible to effectively suppress the occurrence of the magnification error and the positional discrepancy in the transferred image of the pattern on the substrate due to the displacement of the mask in the direction of the optical axis. As a result, it is possible to improve the overlay accuracy.

According to a fourth aspect of the present invention, there is provided an exposure apparatus for transferring a pattern on a mask (R) onto a substrate (W), the exposure apparatus comprising an illumination optical system (PRM, IM, 30, M, 44) which radiates, onto the mask, an illumination light beam inclined with respect to a perpendicular line of the mask; and a projection optical system (PO) which projects, onto the substrate, the illumination light beam reflected by the mask; wherein the illumination optical system has a field diaphragm (44) which arranged adjacent to an incoming side of the illumination light beam with respect to the mask and which defines an irradiated area of the illumination light beam on the mask, and the field diaphragm adjusts at least one of a shape, a size, and a position of the illumination area. According to this aspect, the illumination light beam, which is inclined with respect to the perpendicular line of the mask, is radiated from the illumination optical system. That is, the illumination light beam is radiated from the illumination optical system obliquely with respect to the mask. The illumination light beam, which is reflected by the mask, is projected onto the substrate by the aid of the projection optical system. Thus, the pattern on the mask is transferred onto the substrate. In this arrangement, the illumination optical system has the field diaphragm arranged closely to the incoming side of the illumination light beam with respect to the mask, for defining the irradiated area of the illumination light beam on the mask. The field diaphragm is used to adjust at least one of the shape, the size, and the position of the illumination area. Therefore, the degree of freedom of the cross-sectional configuration of the illumination light beam radiated from the illumination optical system to the mask is increased as compared with a case in which there is no field diaphragm. Accordingly, it is possible to improve the degree of freedom of the design of the optical element for constructing the illumination optical system. Especially, when the field diaphragm is used to adjust the position of the illumination area of the illumination light beam on the mask, it is possible to use the identical illumination light beam for other purposes including, for example, the exposure and the detection of the mark position.

In the apparatus according to the fourth aspect, it is desirable that the field diaphragm (44) has a first aperture (44a) which radiates the illumination light beam (EL) onto a part of the pattern and a second aperture (44b) which radiates the illumination light beam onto a mark (for example, RM1 and RM2) formed on the mask; and the apparatus further comprises a switching mechanism (46) which switches the first aperture and the second aperture. In this arrangement, the swinging mechanism is operated as follows. That is, the field diaphragm is switched to use the first aperture during the exposure so that the illumination light beam may be radiated onto the part of the pattern on the mask. During the position adjustment (alignment) for the mask, the field diaphragm is switched to use the second aperture so that the illumination light beam may be radiated onto the mark formed on the mask. Accordingly, it is possible to set the suitable illumination area during the exposure and during the alignment respectively by using the identical field diaphragm.

According to a fifth aspect of the present invention, there is provided an exposure method for transferring a pattern formed on a mask onto a substrate via a projection optical system (PO) while synchronously moving the mask (R) and the substrate (W), the exposure method comprising preparing a reflecting type mask as the mask (R); using a reflecting optical system as the projection optical system (PO); and transferring the pattern on the mask illuminated with an exposing illumination light beam onto the substrate via the projection optical system by radiating the exposing illumination light beam at a predetermined angle of incidence θ with respect to a pattern plane of the mask; wherein the mask and the substrate are synchronously moved in a second axis direction perpendicular to a first axis direction which is a direction of an optical axis of the projection optical system while adjusting a position of the mask (R) in the first axis direction on the basis of predetermined adjusting position information.

According to this method, when the pattern on the mask illuminated with the exposing illumination light beam is transferred onto the substrate via the projection optical system by radiating the exposing illumination light beam at the predetermined angle of incidence with respect to the pattern plane of the mask, the mask and the substrate are synchronously moved in the second axis direction perpendicular to the first axis direction, while adjusting the position of the mask in the first axis direction as the direction of the optical axis of the projection optical system on the basis of the predetermined adjusting position information. Therefore, the entire surface of the pattern on the mask is successively transferred onto the substrate in accordance with the scanning exposure. During this process, the position of the mask in the direction of the optical axis of the projection optical system (first axis direction) is adjusted on the basis of the adjusting position information. Therefore, although the side on the mask of the projection optical system (reflecting optical system) is non-telecentric, it is possible to effectively suppress the occurrence of the magnification error and the positional discrepancy in the transferred image of the pattern on the substrate due to the displacement of the mask in the direction of the optical axis. As a result, it is possible to improve the overlay accuracy.

In this method, it is also preferable that the adjusting position information includes first adjusting position information and second adjusting position information corresponding to a movement direction of the mask (R) on the second axis; and the position of the mask in the first axis direction is adjusted by using the adjusting position information corresponding to the movement direction, of the first adjusting position information and the second adjusting position information for each movement direction of the mask during the synchronous movement of the mask (R) and the substrate (W). In this process, the position of the mask in the first axis direction is adjusted by using the adjusting position information corresponding to the movement direction, of the first adjusting position information and the second adjusting position information for each movement direction of the mask during the synchronous movement of the mask and the substrate. Accordingly, even when the positional displacement in the first axis direction during the synchronous movement differs depending on, for example, any mechanical factor (movement characteristic of the stage) between the movement of the mask from one side to the other side along the second axis and the movement from the other side to one side, the position of the mask in the first axis direction can be adjusted highly accurately without being affected thereby. It is possible to effectively suppress the occurrence of the magnification error and the positional discrepancy in the transferred image of the pattern on the substrate due to the displacement of the mask in the direction of the optical axis.

In the exposure method described above, it is also preferable that the adjusting position information is previously measured information. Alternatively, it is also preferable that the adjusting position information is measured during the synchronous movement of the mask and the substrate, and the position of the mask in the first axis direction is adjusted by using the adjusting position information. In the case of the former, the adjustment can be made in accordance with, for example, the feedforward control on the basis of the previously measured information without measuring the displacement of the mask in the first axis direction during the synchronous movement of the mask and the substrate. Therefore, the adjusting error scarcely occurs due to any control delay upon the adjustment. Further, it is possible to use a simple constitutive component for adjusting the position of the mask in the first axis direction. In the case of the latter, the position of the mask in the first axis direction can be adjusted highly accurately in accordance with the feedback control by using the information measured during the synchronous movement.

According to a sixth aspect of the present invention, there is provided an exposure method for transferring a pattern on a mask (R) onto a substrate (w) via a projection optical system (PO), the exposure method comprising radiating an illumination light beam having a main light beam inclined with respect to a direction perpendicular to the mask; relatively moving the substrate with respect to the illumination light beam reflected by the mask to pass through the projection optical system in synchronization with relative movement of the mask with respect to the illumination light beam; and compensating change of an image magnification of the pattern caused by the synchronous movement of the mask and the substrate. The phrase "change of an image magnification of the pattern caused by the synchronous movement of the mask and the substrate" herein means the change of the image magnification of the pattern caused by the movement of the mask during the synchronous movement, principally by the movement in the direction of the optical axis of the projection optical system.

According to the method concerning the sixth aspect, the change of the image magnification of the pattern caused by the synchronous movement of the mask and the substrate is compensated. Therefore, although the side of the object plane of the projection optical system is non-telecentric, it is possible to effectively suppress the occurrence of the magnification error and the positional discrepancy in the transferred image of the pattern on the substrate due to the displacement of the mask in the direction of the optical axis. As a result, it is possible to improve the overlay accuracy.

According to a seventh aspect of the present invention, there is provided an exposure apparatus for transferring a pattern on a mask (R) onto a substrate (W), the exposure apparatus comprising an illumination optical system (PRM, IM, 30, M, 44) which obliquely radiates an illumination light beam onto a pattern plane of the mask; a projection optical system (PO) which projects the illumination light beam outgoing from the mask onto the substrate; a driving unit (RST, WST, 80, 34, 62) which synchronously moves the mask and the substrate at a velocity ratio corresponding to a magnification of the projection optical system; and an adjusting unit (80, RIFZ, 34, RST) which adjusts, during the synchronous movement, at least one of a position of the mask in a direction perpendicular to an object plane of the projection optical system and an inclination of the mask relative to the object plane.

According to the exposure apparatus concerning the seventh aspect, the illumination light beam is radiated from the illumination optical system obliquely with respect to the pattern plane of the mask. The illumination light beam from the illumination optical system is radiated in the oblique direction with respect to the pattern plane of the mask. The illumination light beam is reflected by the mask surface, and the reflected light beam is projected onto the substrate by the aid of the projection optical system. Thus, the pattern on the mask illuminated with the illumination light beam is transferred onto the substrate. During the transfer of the mask pattern, the driving unit is operated to synchronously move the mask and the substrate at the velocity ratio corresponding to the magnification of the projection optical system. During the synchronous movement, the adjusting unit is operated to adjust at least one of the position of the mask in the direction perpendicular to the object plane of the projection optical system and the relative inclination of the mask with respect to the object plane. Accordingly, the entire surface of the pattern on the mask is successively transferred onto the substrate in accordance with the scanning exposure. During this process, at least one of the position of the mask in the direction perpendicular to the object plane of the projection optical system and the relative inclination of the mask with respect to the object plane is adjusted by the aid of the adjusting unit. Therefore, it is possible to effectively suppress the occurrence of the magnification error or the distortion in the transferred image of the pattern on the substrate due to the inclination or the displacement of the mask in the direction of the optical axis. As a result, it is possible to improve the overlay accuracy.

According to an eighth aspect of the present invention, there is provided an exposure apparatus for transferring a pattern formed on a mask onto a substrate (W) by irradiating the mask (R) with an illumination light beam (EL), the exposure apparatus comprising a projection optical system which has a reflecting optical system composed of a plurality of mirrors (M1 to M4) and which projects the pattern onto the substrate by the aid of the reflecting optical system; and a cooling unit (HP, 52) arranged in a non-irradiated area on a reflecting surface of at least one mirror of the plurality of mirrors.

The invention according to the eighth aspect has been made taking notice of the fact that the cooling unit can be arranged on the reflecting surface provided that the area is not irradiated with the illumination light beam, because the illumination light beam is radiated only a part of the reflecting optical element in the exposure apparatus based on the use of the cata-dioptric system or the exposure apparatus based on the use of the reflecting optical system as the projection optical system as in the EUV exposure apparatus.

The exposure apparatus described above comprises the cooling unit which is arranged in the non-irradiated area of the illumination light beam on the reflecting surface of at least one mirror of the plurality of mirrors for constructing the projection optical system. Therefore, the reflecting surface is directly cooled so as not to cause the temperature change exceeding the limit. Accordingly, it is possible to avoid the deterioration of the image formation characteristic of the projection optical system due to the irradiation with the illumination light beam. As a result, it is possible to suppress the deterioration of the transferred image due to the variation of radiation.

The at least one mirror may be composed of a material having a relatively small coefficient of thermal conductivity. For example, the at least one mirror may be composed of a material having a coefficient of thermal conductivity of 5.0 W/m·K. When the mirror is composed of the material having the small coefficient of thermal conductivity, the deformation of the mirror due to the thermal conduction is suppressed even if the temperature is considerably changed. Accordingly, it is possible to avoid the deterioration of the image formation characteristic. Those preferably usable as the material for constructing the mirror include, for example, Zerodua (trade name) as low expansion glass (coefficient of thermal conductivity: 1.6 W/m·K) available from Shot, and ULE (trade name) available from Corning. In this arrangement, it is of course allowable that the other mirrors formed of a material having a large coefficient of thermal conductivity are cooled from the back surface side in the same manner as performed in the conventional technique. In this arrangement, it is also allowable that the cooling unit is also arranged on the back surface side of the mirror for which the cooling unit is arranged on the reflecting surface.

According to a ninth aspect of the present invention, there is provided an exposure apparatus for transferring a pattern formed on a mask onto a substrate (W) via a projection optical system (PO) by irradiating the mask (R) with an illumination light beam (EL), the exposure apparatus comprising a reflecting optical system composed of a plurality of mirrors (M1 to M4) including a first mirror (M1) and a second mirror (M2) to be successively irradiated with the illumination light beam, the reflecting optical system being used as the projection optical system; a body tube-cooling unit (52) which cools a body tube (PP) that holds the plurality of mirrors; and a heat exchanger (HP) provided between the body tube and at least one mirror of the plurality of mirrors.

According to the exposure apparatus concerning this aspect, the body tube for holding the plurality of mirrors is cooled by the body tube-cooling unit. When the temperature is raised in the plurality of mirrors by being irradiated with the illumination light beam, then the heat exchange is performed between the body tube and at least one mirror of the plurality of mirrors by the aid of the heat exchanger, and the mirror is forcibly cooled. The heat exchange by the heat exchanger is continuously performed during the radiation of the illumination light beam onto the mirror. Therefore, it is possible to avoid the deformation of the mirror connected with the heat exchanger, and it is possible to avoid the deterioration of the image formation characteristic of the projection optical system. As a result, it is possible to suppress the deterioration of the transferred image due to the variation of radiation. In this context, it is of course preferable that the heat exchangers are provided between the body tube and all of the mirrors held by the body tube so as to avoid the thermal deformation of all of the mirrors. Alternatively, the heat exchanger may be connected only to the first mirror which is firstly irradiated with the illumination light beam. Further alternatively, the heat exchanger may be connected to the second mirror in addition to the first mirror. The thermal energy of the illumination light beam is maximum at the position of the first mirror. Therefore, it is desirable that the heat exchanger is provided at least between the first mirror and the body tube to forcibly cool the first mirror.

In the exposure apparatus according to the ninth aspect, it is allowable that the body tube is composed of a plurality of divided body tubes (PP, PP') which hold at least one mirror respectively; the body tube-cooling unit independently cools the respective divided body tubes; and at least one heat exchanger (HP) is provided between at least one mirror held by the divided body tube and each of the divided body tubes. In this arrangement, the body tube-cooling unit cools each of the divided body tubes in an independent manner. Therefore, the respective divided body tubes can be cooled at different cooling temperatures. As a result, the heat exchangers, which are provided between the respective divided body tubes and the mirrors held thereby, can be used to forcibly cool the mirrors concerning the respective divided body tubes up to the different temperatures. In this arrangement, it is desirable that one of the plurality of divided body tubes is the divided body tube (PP') which holds the first mirror (M1) to be firstly irradiated with the illumination light beam (EL); one of the heat exchangers is provided between the first mirror and the divided body tube which holds the first mirror; and the body tube-cooling unit cools the divided body tube which holds the first mirror at a temperature lower than those for the other divided body tubes. By doing so, it is possible to efficiently cool the first mirror which absorbs the largest amount of heat and which tends to cause the deterioration of the image formation characteristic, as compared with the other mirrors. As a result, it is possible to efficiently suppress the deterioration of the transferred image due to the variation of radiation.

The heat exchanger may be anyone provided that it performs the heat exchange between the body tube (or the divided body tube) and the mirror. For example, the heat exchanger may be a heat pipe (HP). In this arrangement, as described in a specified embodiment, the front surface and the back surface of the mirror can be interposed by the heat pipe (HP) so that the light irradiation area on the front surface (reflecting surface) of the mirror, which is intended to be cooled, is not covered with the heat pipe (HP).

In the exposure apparatuses according to the eighth and ninth aspects, it is also preferable that the mask (R) is a reflecting type mask; and the apparatus further comprises a second cooling unit (36) arranged on a side opposite to an incoming side of the illumination light beam of the mask. In this arrangement, it is also possible to suppress the variation of radiation on the mask. Therefore, it is possible to more effectively suppress the deterioration of the transferred image due to the variation of radiation.

According to a tenth aspect of the present invention, there is provided an exposure apparatus having an illumination optical system (PRM, IM, 30, M, 42) for radiating an illumination light beam (EL) onto a mask (R), for transferring a pattern formed on the mask onto a substrate (W), the exposure apparatus comprising a projection optical system (PO) which has a reflecting optical element (M1 to M4) and which projects the illumination light beam outgoing from the mask onto the substrate; and a heat exchanger (HP) provided between the reflecting optical element and a body tube (PP) which holds the reflecting optical element.

The exposure apparatus according to this aspect is provided with the heat exchanger which is disposed between the reflecting optical element for constructing the projection optical system and the body tube for holding the reflecting optical element. Accordingly, when the illumination light beam outgoing from the mask is radiated onto the reflecting optical element, and the temperature of the reflecting optical element is raised, then the heat exchange is effected by the heat exchanger between the reflecting optical element and the body tube, and the reflecting optical element is cooled. The heat exchange, which is effected by the heat exchanger, is performed until the temperature of the reflecting optical element is coincident with that of the body tube. Therefore, it is possible to avoid, to some extent, the deterioration of the image formation characteristic of the projection optical system due to the radiation of the illumination light beam, by previously cooling the body tube. As a result, it is possible to suppress the deterioration of the transferred image due to the variation of radiation.

In the exposure apparatus according to the tenth aspect, it is also preferable that the heat exchanger is connected to at least one of a part of a reflecting surface of the reflecting optical element and a back surface thereof. It is of course allowable that the projection optical system may be a cata-dioptric system having a refracting optical element, other than the reflecting optical element. It is also preferable that the projection optical system is composed of only a plurality of reflecting optical elements, and at least one of the plurality of reflecting optical elements is connected to the heat exchanger. In this arrangement, it is desirable that the reflecting optical element (M1) of the plurality of reflecting optical elements, which has the shortest optical distance with respect to the mask, is connected to the heat exchanger (HP). In this arrangement, it is possible to cool the reflecting optical element which has the largest amount of heat absorption and which tends to cause the deterioration of the image formation characteristic, because the optical distance with respect to the mask is shortest. As a result, it is possible to efficiently suppress the deterioration of the transferred image due to the variation of radiation.

In the exposure apparatuses according to the eighth to tenth aspects provided with the heat exchanger, it is also preferable that the projection optical system is an optical system which has a ring image field, which is non-telecentric on a side of an object plane, and which is telecentric on a side of an image plane. In the exposure apparatuses according to the eighth to tenth aspects, it is also preferable that the illumination light beam is an EUV light beam having a wavelength of 5 to 15 nm, because of the following reason. That is, the illumination light beam having the short wavelength such as the EUV light beam has the large radiation energy, for which it is more necessary to cool the mirror or the reflecting optical element.

According to an eleventh aspect of the present invention, there is provided a method for producing an exposure apparatus for transferring a pattern formed on a reflecting type mask onto a substrate, the method comprising the steps of:

providing a projection optical system provided with a reflecting optical system which projects the pattern onto the substrate;

providing a mask stage which holds the mask;

providing a substrate stage which holds the substrate;

providing an illumination system which radiates an exposing illumination light beam onto the mask at a predetermined angle of incidence with respect to a pattern plane of the mask; and providing a stage control system which synchronously moves the mask stage and the substrate stage in a second axis direction perpendicular to a first axis direction, while adjusting a position of the mask in the first axis direction as a direction of an optical axis of the projection optical system, on the basis of predetermined adjusting position information, in order to transfer the pattern on the mask illuminated with the exposing illumination light beam onto the substrate via the projection optical system.

According to a twelfth aspect of the present invention, there is provided a method for producing an exposure apparatus for transferring a pattern on a mask onto a substrate, the method comprising the steps of:

providing an illumination optical system which has an optical axis inclined with respect to a first direction perpendicular to the mask and which radiates an illumination light beam onto the mask;

providing a projection optical system which projects, onto the substrate, the illumination light beam reflected by the mask;

providing a driving unit which synchronously moves the mask and the substrate at a velocity ratio corresponding to a magnification of the projection optical system; and providing a correcting unit which corrects an image magnification error of the pattern by relatively moving the mask in the first direction with respect to the projection optical system during the synchronous movement.

According to a thirteenth aspect of the present invention, there is provided a method for producing an exposure apparatus for transferring a pattern on a mask onto a substrate, the method comprising the steps of:

providing an illumination optical system which radiates, onto the mask, an illumination light beam having a main light beam which is inclined with respect to a first direction perpendicular to the mask;

providing a projection optical system which projects, onto the substrate, the illumination light beam outgoing from the mask;

providing a driving unit which synchronously moves the mask and the substrate at a velocity ratio corresponding to a magnification of the projection optical system; and providing a correcting unit which compensates change in image magnification of the pattern caused by the movement of the mask.

According to a fourteenth aspect of the present invention, there is provided a method for producing an exposure apparatus for transferring a pattern on a mask onto a substrate, the method comprising the steps of:

providing an illumination optical system which radiates, onto the mask, an illumination light beam inclined with respect to a perpendicular line of the mask; and providing a projection optical system which projects, onto the substrate, the illumination light beam reflected by the mask, wherein:

the illumination optical system has a field diaphragm which is arranged closely to an incoming side of the illumination light beam with respect to the mask and which defines an irradiated area of the illumination light beam on the mask, and the field diaphragm is used to adjust at least one of a shape, a size, and a position of the illumination area.

According to a fifteenth aspect of the present invention, there is provided a method for producing an exposure apparatus for transferring a pattern on a mask onto a substrate, the method comprising the steps of:

providing an illumination optical system which obliquely radiates an illumination light beam onto a pattern plane of the mask;

providing a projection optical system which projects the illumination light beam outgoing from the mask onto the substrate;

providing a driving unit which synchronously moves the mask and the substrate at a velocity ratio corresponding to a magnification of the projection optical system; and providing an adjusting unit which adjusts, during the synchronous movement, at least one of a position of the mask in a direction perpendicular to an object plane of the projection optical system and a relative inclination of the mask with respect to the object plane.

According to a sixteenth aspect of the present invention, there is provided a method for producing an exposure apparatus for transferring a pattern formed on a mask onto a substrate by irradiating the mask, the method comprising the steps of:

providing a projection optical system which has a reflecting optical system composed of a plurality of mirrors and which projects the pattern onto the substrate; and providing a cooling unit which cools at least one mirror of the plurality of mirrors so that the cooling unit is arranged in a non-irradiated area of a reflecting surface of the at least one mirror.

According to a seventeenth aspect of the present invention, there is provided a method for producing an exposure apparatus for transferring a pattern formed on a mask onto a substrate via a projection optical system by irradiating the mask, the method comprising the steps of:

providing a reflecting optical system composed of a plurality of mirrors including a first mirror and a second mirror to be successively irradiated with an illumination light beam, the reflecting optical system being used as the projection optical system;

providing a body tube-cooling unit which cools a body tube that holds the plurality of mirrors; and providing a heat exchanger disposed between the body tube and at least one mirror of the plurality of mirrors.

According to an eighteenth aspect of the present invention, there is provided a method for producing an exposure apparatus for transferring a pattern formed on a mask onto a substrate, the method comprising the steps of:

providing an illumination optical system which radiates an illumination light beam onto the mask;

providing a projection optical system which has a reflecting optical element and which projects the illumination light beam outgoing from the mask onto the substrate; and providing a heat exchanger disposed between the reflecting optical element and a body tube which holds the reflecting optical element.

According to a nineteenth aspect of the present invention, there is provided a microdevice produced by the exposure apparatus according to the aspects of the present invention described above.

According to a twentieth aspect of the present invention, there is provided a microdevice produced by the exposure method according to the aspects of the present invention described above.

DESCRIPTION OF THE PREFERRED EMBODIMENT OF THE INVENTION

First Embodiment

A first embodiment of the present invention will be explained below on the basis of FIGS. 1 to 11.

Figure 1:
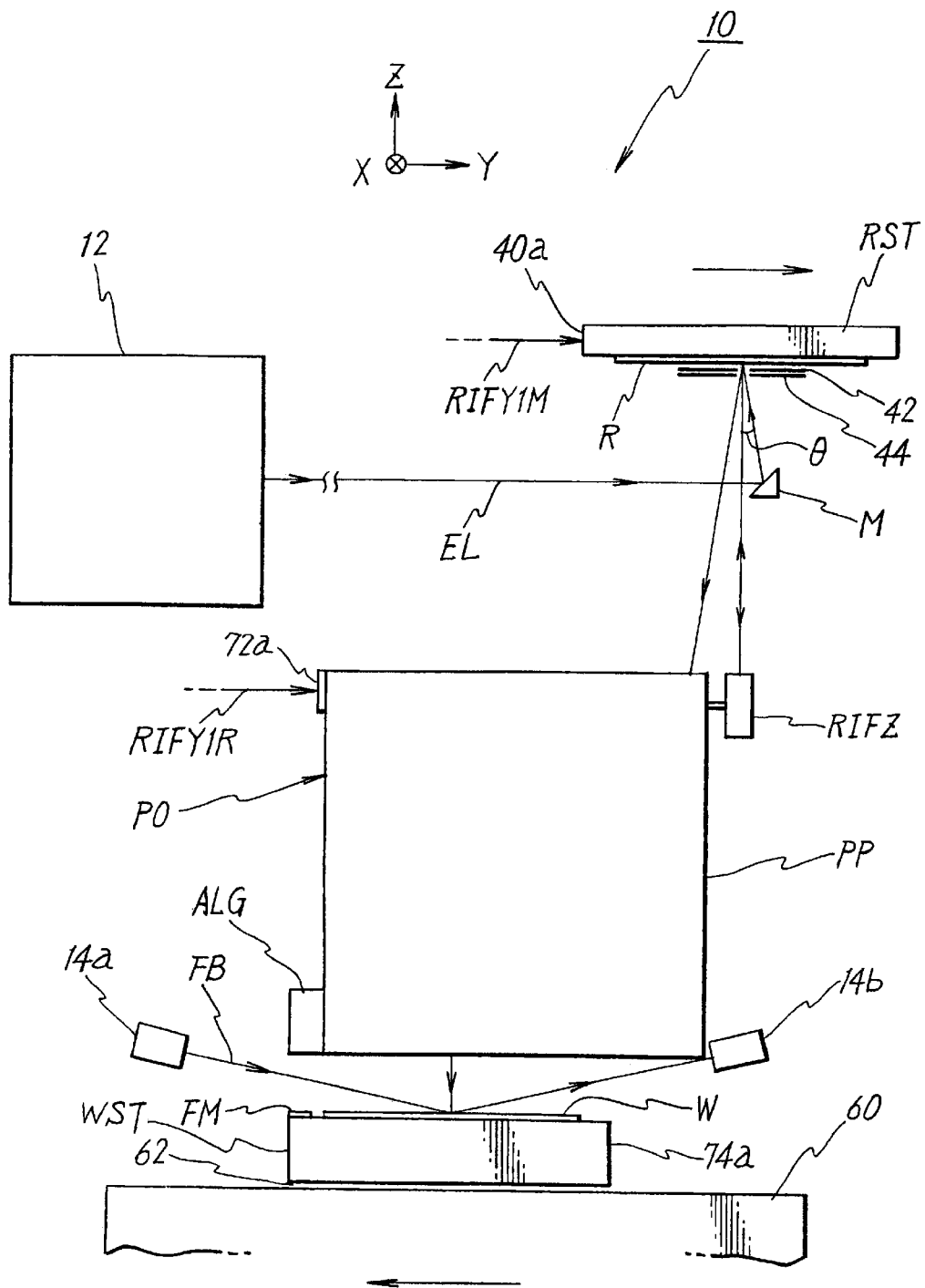
FIG. 1 schematically shows an arrangement of an exposure apparatus according to a first embodiment.

FIG. 1 schematically shows an overall arrangement of an exposure apparatus 10 according to the first embodiment. The exposure apparatus 10 is a projection exposure apparatus for performing the exposure operation in accordance with the step-and-scan system with a light beam (EUV light beam) in the soft X-ray region having a wavelength of 5 to 15 nm as an exposing illumination light beam EL. In this embodiment, a projection optical system PO, which perpendicularly projects the reflected light flux from a reticle R as a mask onto a wafer W, is used as described later on.

Therefore, in the following description, the direction of projection of the illumination light beam EL from the projection optical system PO onto the wafer W is referred to as "optical axis direction of the projection optical system PO". Explanation will be made provided that the optical axis direction is the Z axis direction, the direction in the plane of paper in FIG. 1, i.e., in the plane perpendicular thereto is the Y axis direction, and the direction perpendicular to the plane of paper is the X axis direction.

The exposure apparatus 10 is operated such that the entire circuit pattern on the reticle R is transferred to a plurality of shot areas on the wafer W respectively in accordance with the step-and-scan system by relatively scanning the reticle R and the wafer W in the one-dimensional direction (in the Y axis direction in this case) with respect to the projection optical system PO, while projecting, onto the wafer W as the substrate via the projection optical system PO, a part of the image of the circuit pattern depicted on the reflecting type reticle R as the mask.

The exposure apparatus 10 comprises, for example, a light source unit 12 for radiating the EUV light beam EL horizontally in the Y direction, a turning mirror M (part of an illumination optical system) for reflecting the EUV light beam EL from the light source unit 12 to fold it so that it comes into a pattern plane (lower surface of the Z reticle R in FIG. 1) of the reticle R at a predetermined angle of incidence θ (θ is about 50 mrad in this case), a reticle stage RST for holding the reticle R, the projection optical system PO composed of a reflecting optical system for perpendicularly projecting the EUV light beam EL reflected by the pattern plane of the reticle R onto an exposing surface of the wafer W, a wafer stage WST for holding the wafer W, a focus sensor (14a, 14b), and alignment optical system ALG.

Figure 2:
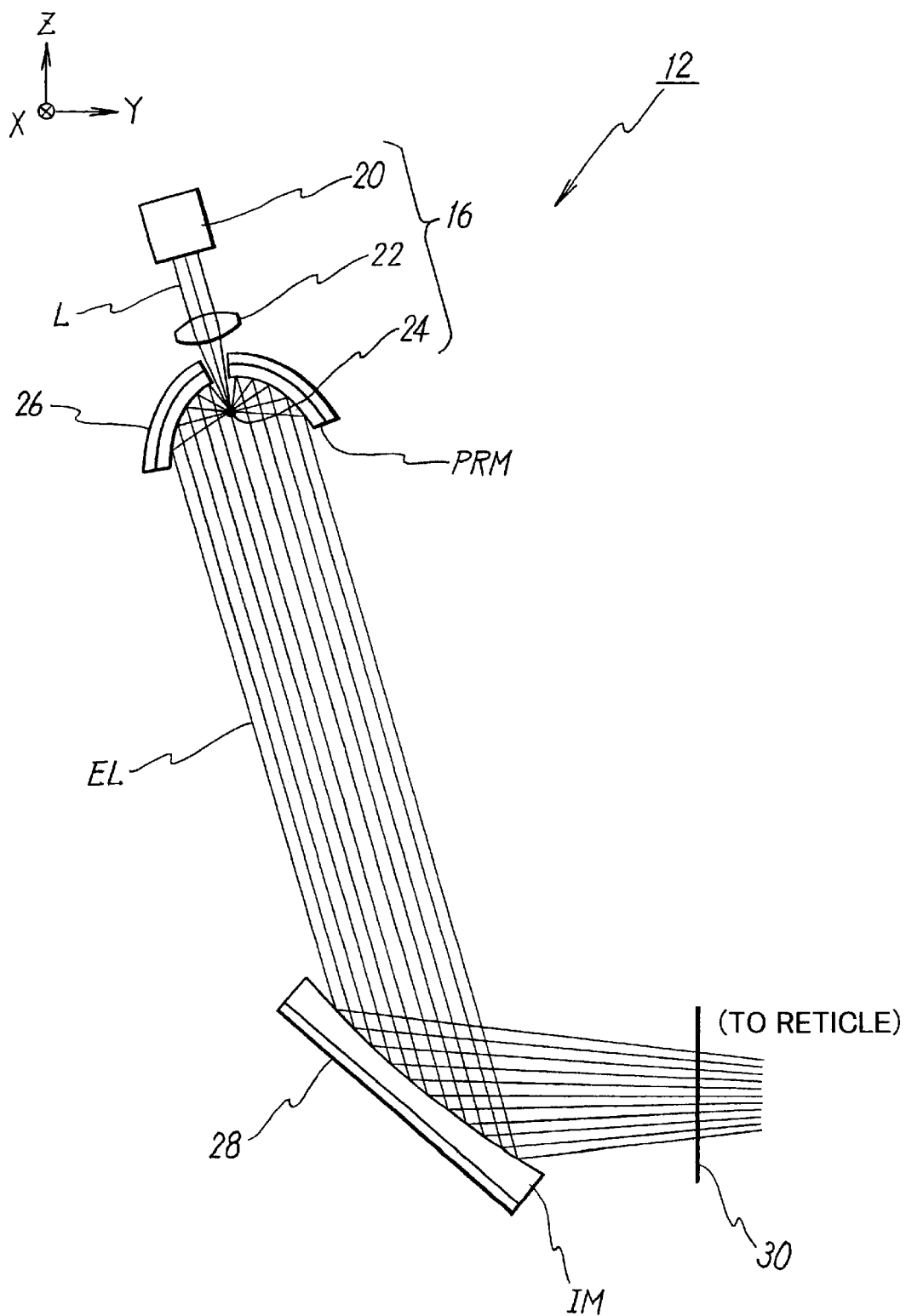
FIG. 2 shows an internal structure of a light source unit shown in FIG. 1.

As shown in FIG. 2, the light source unit 12 is composed of a light source 16 and a part of the illumination optical system (PRM, IM, 30). The light source 16 includes a high output laser 20 such as an excimer laser and a YAG laser based on, for example, excitation by a semiconductor laser, a light-collecting lens 22 for collecting the laser beam L from the high output laser 20 at a predetermined light-collecting point, and an EUV light-emitting substance 24 such as a copper tape arranged at the light-collecting point.

The mechanism for emitting the EUV light beam will now be briefly explained. When the laser beam L from the high output laser 20 is radiated onto the EUV light-emitting substance 24 arranged at the light-collecting point of the light-collecting lens 22, then the EUV light-emitting substance 24 is at a high temperature caused by the energy of the laser beam, and it is excited into a high energy state as a plasma state. The EUV light beam EL is emitted during the transition to a low potential state from the excited state.

The EUV light beam emitted as described above is emanated in all directions. Therefore, a parabolic mirror PRM is provided in the light source unit 12 in order to collect the EUV light beam. The EUV light beam EL is collected by the parabolic mirror PRM, and it is converted into a parallel light flux. An EUV light beam-reflecting layer for reflecting the EUV light beam is formed on the inner front surface of the parabolic mirror PRM. A cooling unit 26 is attached to the back surface of the parabolic mirror PRM. In view of the cooling efficiency, those based on the use of a cooling liquid may be preferably used for the cooling unit 26. However, there is no limitation thereto. Metal is suitable for the material for the parabolic mirror PRM in view of the heat conduction. It is known that only the light beam having a specified wavelength is reflected by using a multilayered film comprising two types of substances which are alternately stacked, as the EUV light beam-reflecting layer formed on the front surface of the parabolic mirror PRM. For example, it is known that the EUV light beam having a wavelength of about 13 nm is selectively reflected when molybdenum Mo and silicon Si are coated in several tens layers. The light having the wavelength, which is not reflected, is absorbed by the multilayered film or the like, and it is converted into the heat. Therefore, the temperature of the parabolic mirror PRM is raised. The cooling unit 26 is required in order to cool the parabolic mirror PRM. The EUV light beam EL, which is converted into the parallel light beam by the parabolic mirror PRM, is the parallel light beam having a uniform intensity distribution with a circular cross-sectional configuration thereof perpendicular to the optical axis.

Those further included in the light source unit 12 are an illumination mirror IM for reflecting the EUV light beam EL converted into the parallel light beam as described above and deflecting it in a direction toward the turning mirror M shown in FIG. 1, and a wavelength-selecting window (wavelength-selecting filter) 30 arranged on the backward side (right side on the plane of the paper in FIG. 2) in the traveling direction of the EUV light beam EL with respect to the illumination mirror IM. As shown in FIG. 2, the illumination mirror IM has a curved surface of the surface on the side onto which the EUV light beam EL is radiated. A reflective layer, which is composed of a multilayered film comprising alternately stacked two substances (for example, coating of several tens layers of molybdenum Mo and silicon Si), is formed on the surface of the curved surface. The illumination mirror IM is designed such that the EUV light beam reflected by the reflective layer just forms a slender slit-shaped configuration on the reticle R.

The vertical direction on the plane of paper in FIG. 2 corresponds to the direction perpendicular to the longitudinal direction of a circular arc-shaped illumination area (see the illumination area 1A shown in FIG. 5) having a predetermined areal size for illuminating the pattern plane of the reticle R as described later on. The pattern plane of the reticle R is just a focal plane. In this arrangement, the light-emitting source of the EUV light beam EL has a finite size. Although the pattern plane of the reticle R is the focal plane, the EUV light beam EL has a width of about 1 mm to 10 mm on the focal plane. Therefore, the circular arc-shaped illumination area is never too slender. A cooling unit 28, which is constructed in the same manner as the cooling unit 26 as described above, is provided on the back surface side of the reflecting surface of the illumination mirror IM.

In this embodiment, the wavelength-selecting window 30 is provided in order to cut the visible light. Concerning this point, the EUV-reflecting film composed of the multilayered film has considerably sharp wavelength selectivity for wavelengths near to the EUV light beam. Only the wavelength used for the exposure is selectively reflected, but the visible light and the ultraviolet light are also reflected. However, if the visible light and the ultraviolet light incoming from the outside of the apparatus are introduced into the reticle R and the projection optical system PO via the EUV-reflecting film, the heat is generated by the energy of the light in the reticle R and the mirror for constructing the projection optical system PO (as described later on). In the worst case, it is also feared that the unnecessary light is transferred onto the wafer W, resulting in deterioration of the image. Therefore, it is intended to avoid the occurrence of such situations.

Figure 3:
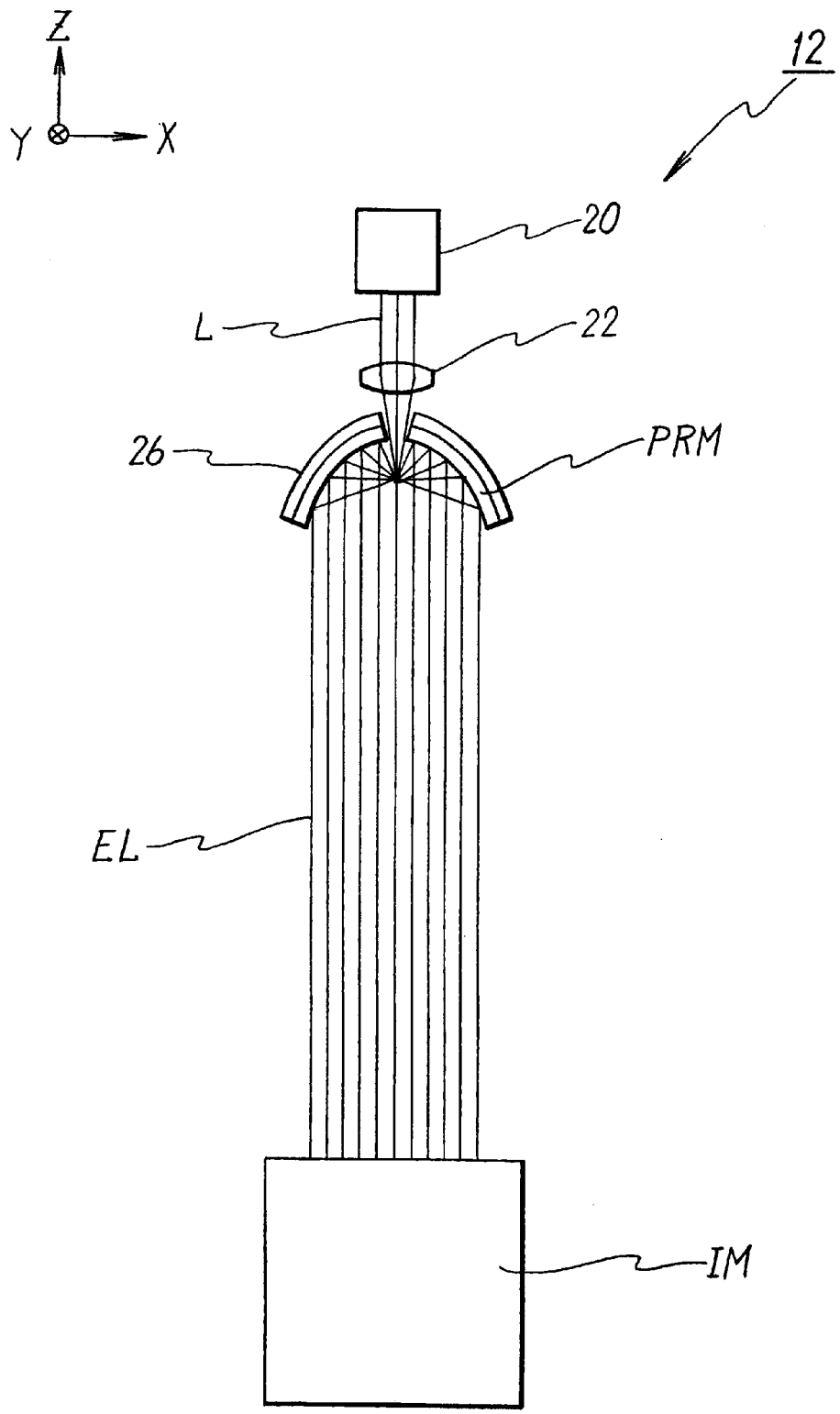
FIG. 3 shows a left side view illustrating the light source unit shown in FIG. 2.

FIG. 3 shows a state in which the light source unit 12 shown in FIG. 2 is viewed from one side in the Y direction (from the left side in FIG. 2). In FIG. 3, the turning mirror M shown in FIG. 1 is located on the back side of the plane of paper. Although the reflecting surface of the illumination mirror IM is not depicted in FIG. 3, it has an oblong configuration as viewed from the back side of the plane of paper. That is, the reflecting surface of the reflecting mirror IM has a shape similar to a part of an inner circumferential surface of a cylinder, because it is viewed as the concave curved surface in FIG. 2, and it is viewed as the oblong configuration in FIG. 3 which is the left side view. After the EUV light beam El is reflected by the illumination mirror IM, it is converged in the plane of paper in FIG. 2, but it remains as the parallel light beam in the plane of paper in FIG. 3. That is, the length of the EUV light beam in the horizontal direction in FIG. 3 is the length of the circular arc-shaped illumination area in the longitudinal direction as described later on. Although the light beam is referred to be parallel, the spatial coherency is not zero, because the size of the light source is finite as described above.

Figure 4:
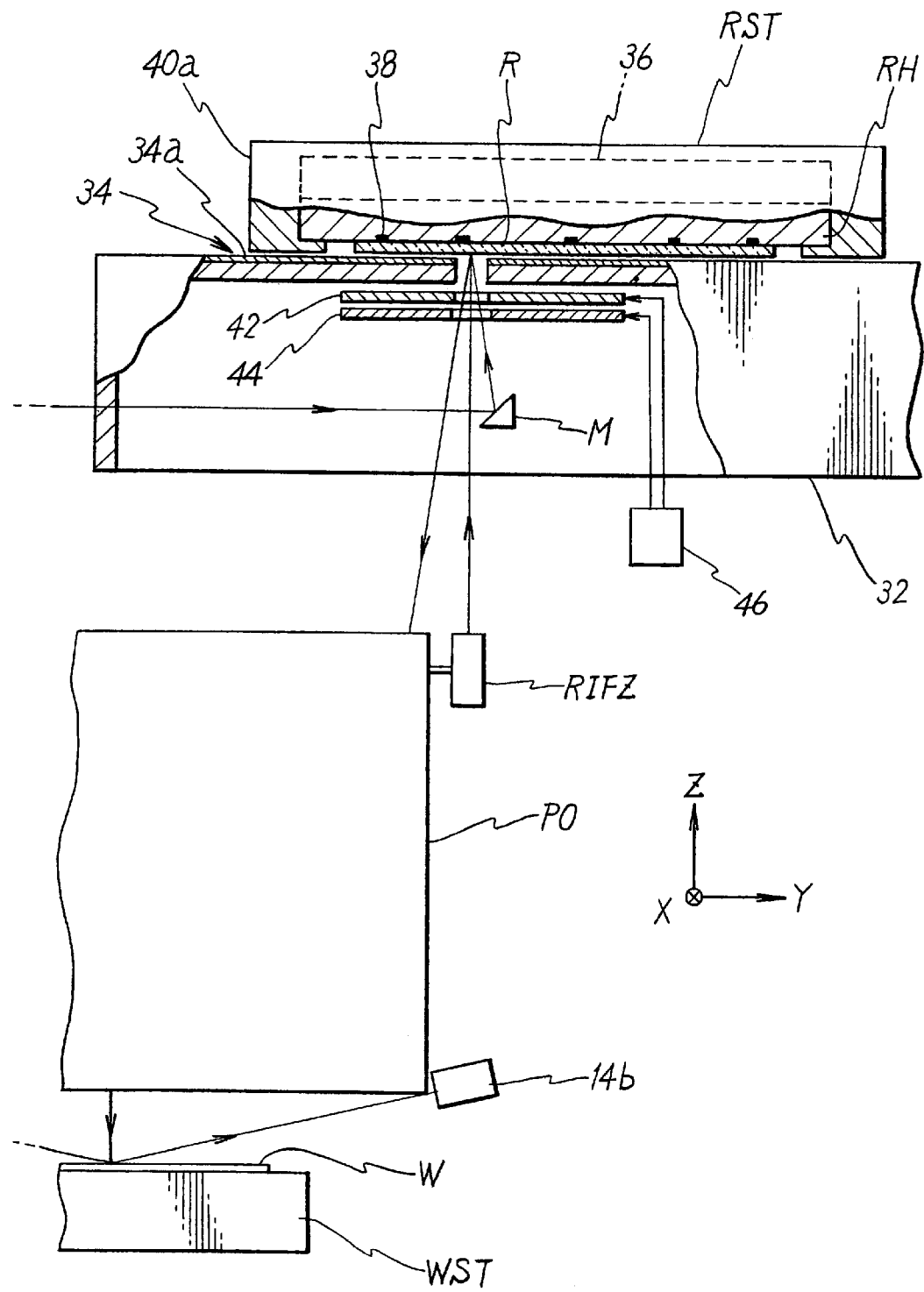
FIG. 4 shows details of respective parts of the arrangement in the vicinity of a reticle stage shown in FIG. 1.

Although not shown in the drawing in FIG. 1, the reticle stage RST is arranged on a reticle stage base 32 disposed along the XY plane as shown in FIG. 4. The reticle stage RST is supported in a floating manner over the reticle stage base 32 by the aid of a magnetically floating type two-dimensional linear actuator 34. The reticle stage RST is driven in a predetermined stroke in the Y direction by the aid of the magnetically floating type two-dimensional linear actuator 34, and it is also driven in a minute amount in the X direction and in the θ direction (direction of rotation about the Z axis). The reticle stage RST can be also driven in a minute amount in the Z direction and in the direction inclined with respect to the XY plane by the aid of the magnetically floating type two-dimensional linear actuator 34.

A permanent magnet (not shown) is provided at the circumferential bottom of the reticle stage RST. The magnetically floating type two-dimensional linear actuator 34 is constructed by the permanent magnet and a coil 34a which is spread in the XY two-dimensional directions on the reticle stage base 32. The position and the attitude of the reticle stage RST in the six-dimensional directions are controlled by controlling the current allowed to flow through the coil 34a by the aid of a main control unit 80 as described later on.

As shown in FIG. 4 in magnification, the reticle stage RST comprises a reticle holder RH for holding the reticle R opposing to the reticle stage base 32, a main stage body 35 for holding the circumference of the reticle holder RH, and a temperature control unit 36 provided on the back surface side (upper surface side) of the reticle holder RH at the inside of the main stage body 35, for controlling the temperature of the reticle holder RH. A reticle holder based on the electrostatic chuck system is used for the reticle holder RH, because of the following reason. That is, the exposure apparatus 10 according to the embodiment of the present invention is actually accommodated in an unillustrated vacuum chamber, because the EUV light beam is used for the exposing illumination light beam. For this reason, it is impossible to use a reticle holder based on the vacuum chuck system. As for the material for the reticle holder RH, it is allowable to adopt those used for the conventional DUV exposure apparatus, such as the low expansion glass and the ceramic.

A plurality of temperature sensors 38 are arranged at predetermined intervals on the reticle-attracting surface of the reticle holder RH. The temperature sensors 38 are used to correctly measure the temperature of the reticle R. The temperature is controlled by the temperature control unit 36 on the basis of the measured temperature so that the temperature of the reticle R is maintained at a predetermined target temperature. Those adoptable for the cooling unit for constructing the temperature control unit 36 include, for example, the liquid cooling system for introducing the cooling liquid from the outside via a flexible tube, the system based on the use of an electronic element such as a Peltier element, and the system based on the use of a heat exchanger such as a heat pipe.

Figure 6:
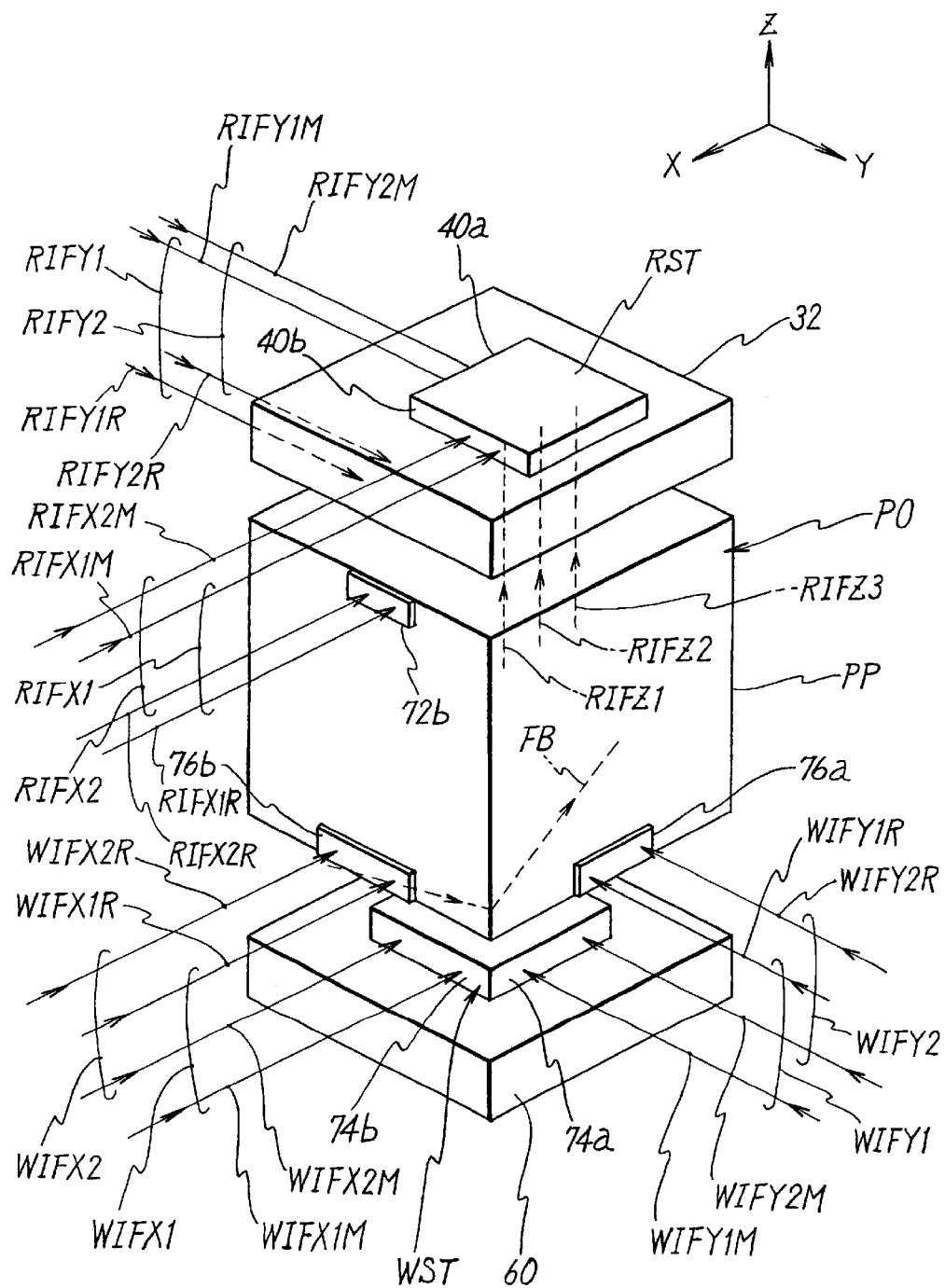
FIG. 6 illustrates an arrangement of an interferometer system for measuring positions of the reticle stage and a wafer stage in the XY plane.

A first side surface of the reticle stage RST in the Y direction is mirror-finished to form a reflecting surface 40a for the light in the visible region. Although not shown in FIG. 4, a first side surface of the reticle stage RST in the X direction is also mirror-finished as shown in FIG. 6 to form a reflecting surface 40b for the light in the visible region. In the exposure apparatus 10, the position of the reticle stage RST in the XY plane is managed by an interferometer system for radiating measuring beams onto the reflecting surfaces 40a, 40b, in the same manner as in the conventional exposure apparatus based on the use of the DUV light source. The interferometer system will be described in detail later on.

A reflective film for reflecting the EUV light beam is formed on the surface (pattern plane) of the reticle R. The reflective film is, for example, a multilayered film composed of alternately stacked two substances. In this embodiment, a multilayered film of molybdenum Mo and silicon Si is used to form a reflective film having a reflectance of about 70% with respect to the EUV light beam having a wavelength of 13 nm. A substance for absorbing the EUV light beam is applied all over the reflective film as described above, followed by patterning. When a reflective article such as the multilayered film is subjected to the patterning, it is impossible to make repair in the case of failure. On the contrary, in the case of the method in which the absorbing layer is provided to preform the patterning, it is possible to perform the patterning over again, and hence the pattern can be repaired. The EUV light beam is not reflected by almost all of actually existing substances. Therefore, they can be used for the absorbing layer. In the embodiment of the present invention, the laser interferometers (RIFZ1 to RIFZ3) are used to measure the position of the reticle R in the Z direction as described later on. Therefore, the absorbing layer is formed with the substance with which a reflectance equivalent to that obtained by the reflective layer is obtained for the measuring beams (light in the visible region) from the laser interferometers. Additionally, the standard for the selection of the material for forming the absorbing layer includes, for example, easiness of patterning, tight contact performance with respect to the reflective layer, and small secular change due to oxidation of the like.

Figure 5:
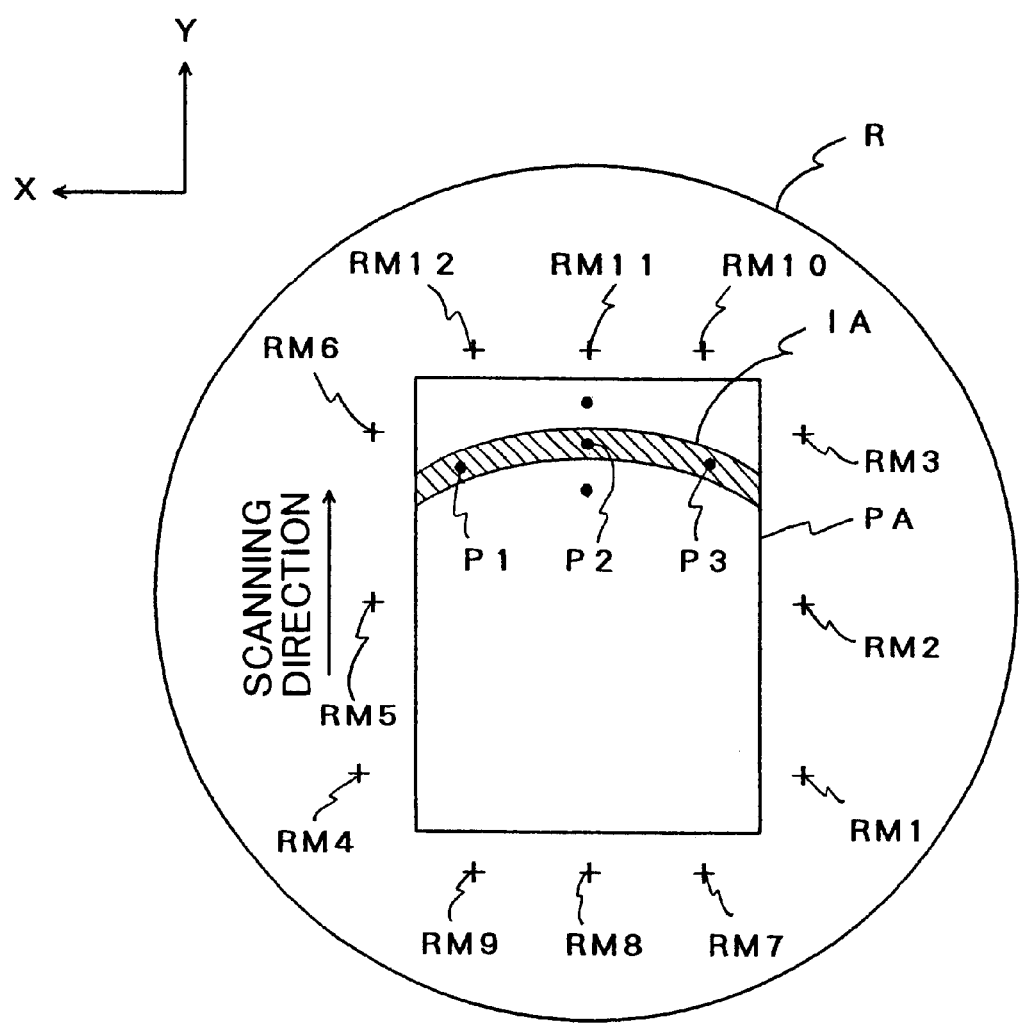
FIG. 5 shows a schematic plan view illustrating a reticle.

FIG. 5 shows an example of the reticle R. An oblong area, which is disposed at a central portion in the drawing, is a pattern area PA. A hatched area having a circular arc-shaped configuration is a circular arc-shaped illumination area IA to be illuminated with the EUV light beam EL as the exposure light beam. The reason why the exposure is performed with the circular arc-shaped illumination area in this embodiment is that it is intended to use only an area in which various aberrations of the projection optical system PO as described later on are the smallest. Reticle alignment marks RM1 to RM6 as position adjustment marks are formed at predetermined spacing distances in the Y direction at both end portions of the pattern area PA of the reticle R in the X direction. The reticle alignment marks RM1 and RM4, RM2 and RM5, RM3 and RM6 are arranged substantially in the X direction respectively.

As clarified from FIG. 5, when the circular arc-shaped illumination area IA is used, it is impossible to perform the full-area exposure (static exposure). Therefore, in the embodiment of the present invention, the scanning exposure is performed as described later on.

As for the reticle R, the material for the reticle R itself is not specifically limited, because the reflective layer is formed on its surface as described above. Those assumed as the material for the reticle R include, for example, low expansion glass, quartz glass, ceramic, and silicon wafer. As a standard for the selection of the material, for example, it is assumed that the same material as the material for the reticle holder RH is used as the material for the reticle R. In this case, the thermal expansion occurs in the reticle R and the reticle holder RH resulting from the increase in temperature, for example, due to the radiation of the exposure light beam EL. However, when the both are made of the same material, the expansion occurs in the same amount. Therefore, there is such a merit that no force to cause the discrepancy (thermal stress) is exerted between the both. The material is not limited to the foregoing case. Even when different substances are used, the same effect is obtained provided that the substances having an identical coefficient of linear expansion are used as the materials for the reticle R and the reticle holder RH. For example, it is conceived that silicon wafer is used for the reticle R, and SiC (silicon carbide) is used for the reticle holder RH. The use of silicon wafer as the material for the reticle R is also advantageous in that it is possible to use process apparatuses such as a pattern-drawing apparatus, a resist-applying apparatus, and an etching apparatus as they are. In the embodiment of the present invention, silicon wafer is used as the material for the reticle R, and the reticle holder is made of SiC, because of the reason as described above.

Returning to FIG. 1, a movable blind 42 and a slit plate 44 as a field diaphragm are arranged adjacent to the reticle R under the reticle R (on the incoming side of the EUV light beam). More specifically, the movable blind 42 and the slit plate 44 are actually arranged at the inside of the reticle stage base 32 as shown in FIG. 4.

Figure 7:
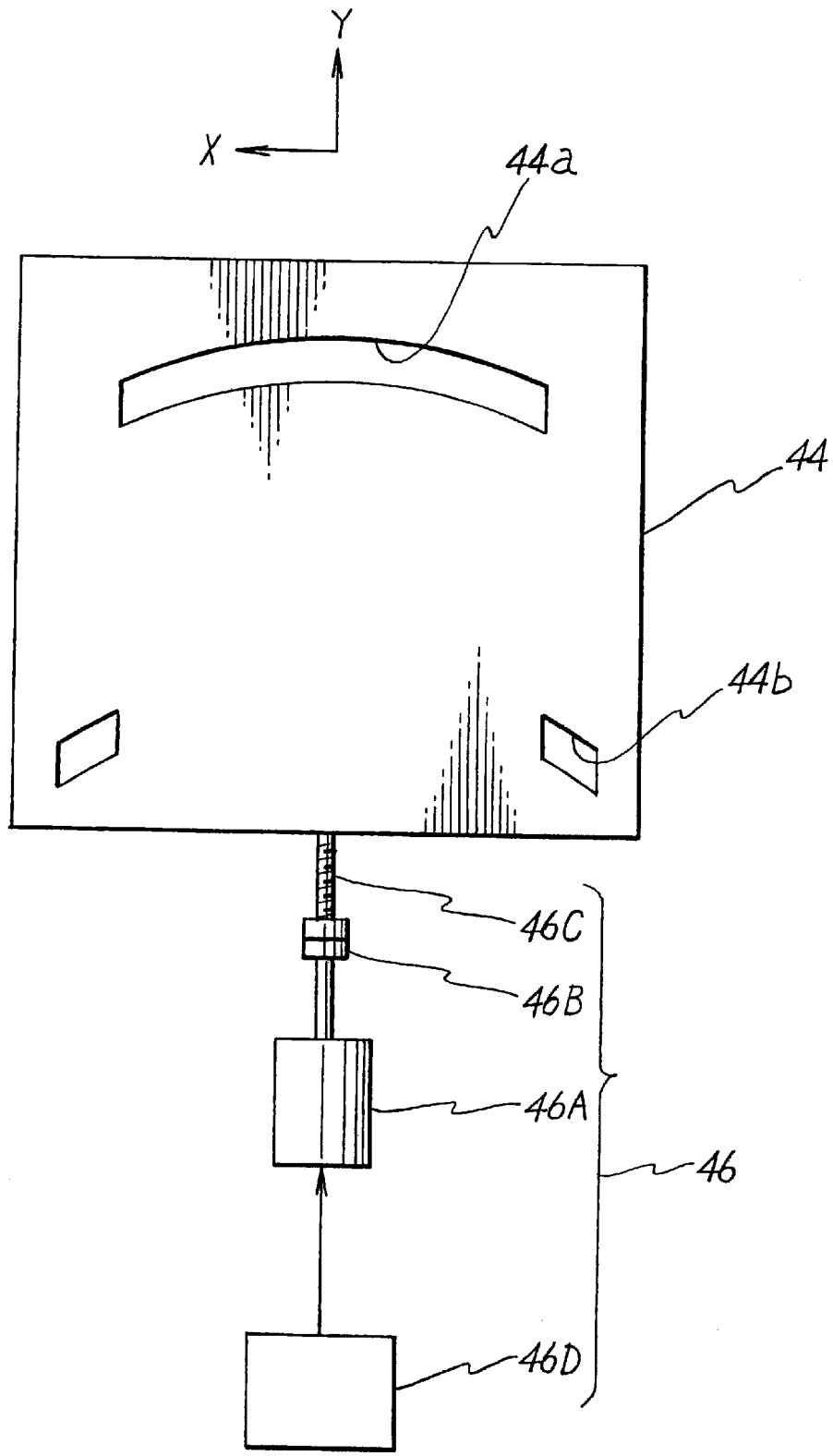
FIG. 7 shows a plan view illustrating an example of a slit plate shown in FIG. 1 and a driving unit therefor.

The slit plate 44 defines the circular arc-shaped illumination area IA. It is of course allowable that the slit plate 44 is fixed to the projection optical system PO. However, in this embodiment, the slit plate 44 is capable of being driven by a driving mechanism 46 as a switching mechanism including a motor and the like. FIG. 7 shows a plan view illustrating the slit plate 44 and the driving mechanism 46 therefor. The slit plate 44 has a first slit 44a as a first aperture for defining the circular arc-shaped illumination area (first illumination area) on the reticle R illuminated with the EUV light beam as the exposing illumination light beam, and second slits 44b as second apertures for defining second illumination areas for illuminating the exposing illumination light beam EL onto portions of alignment marks RM1 and RM4 (or RM2 and RM5, RM3 and RM6) formed on the both sides of the pattern area PA of the reticle R. The driving mechanism 46 comprises a motor 46A, a feed screw 46C connected to an output shaft of the motor via a joint 46B, and a control unit 46D for the motor 46A. The feed screw 46C is engaged with a nut section (not shown) which is provided to protrude on the slit plate 44 on the back side of the plane of paper in FIG. 7. Accordingly, the feed screw 46C is driven and rotated in accordance with the rotation of the motor 46A, and thus the slit plate 44 is driven in the axial direction (Y direction) of the feed screw 46C. The control unit 46D of the driving mechanism 46 is operated in accordance with the instruction from the main control unit 80 (see FIG. 10) as described later on such that the slit plate 44 is switched to a first position at which the exposing illumination light beam EL is radiated onto the first slit 44a during the exposure, and the slit plate 44 is switched to the second position at which the exposing illumination light beam EL is radiated onto the second slit 44b during the position adjustment (alignment) of the reticle R. Alternatively, the slit plate 44 may be driven by using a linear motor in place of the use of the feed screw.

Returning to FIG. 4, the movable blind 42 is provided in order to avoid the inclusion of the redundant circuit portion in the illumination area IA when the redundant circuit pattern depicted on the identical reticle R is not intended to be transferred to the wafer W. In this embodiment, the movement of the movable blind 42 in the Y direction is controlled in synchronization with the movement of the reticle stage RST in the Y direction by the aid of the control unit 46D for constructing the driving mechanism 46 in accordance with the instruction from the main control unit 80 (see FIG. 10) as described later on. In this arrangement, the movement of the movable blind 42 may be started to begin the scanning in the same manner as in the reticle R after the scanning of the reticle R is started. Alternatively, the movable blind 42 may start the movement in conformity with the arrival of the target pattern to be hidden. The movable blind used for the exposure apparatus is disclosed, for example, in U.S. Pat. No. 5,473,410. The content of this United States Patent is incorporated herein by reference so long as the domestic laws of the designated state designated in this international application or the selected state selected in this international application allow the incorporation of the reference.

With reference to FIG. 1 again, the reflecting optical system composed of only the reflecting optical element (mirror) is used for the projection optical system PO as described above. In this case, the system having a projection magnification of ¼-fold is used. Therefore, the EUV light beam EL, which is reflected by the reticle R and which includes the information of the pattern depicted on the reticle R, is reduced to ¼ by the projection optical system PO, and it is radiated onto the wafer W.

Figure 8:
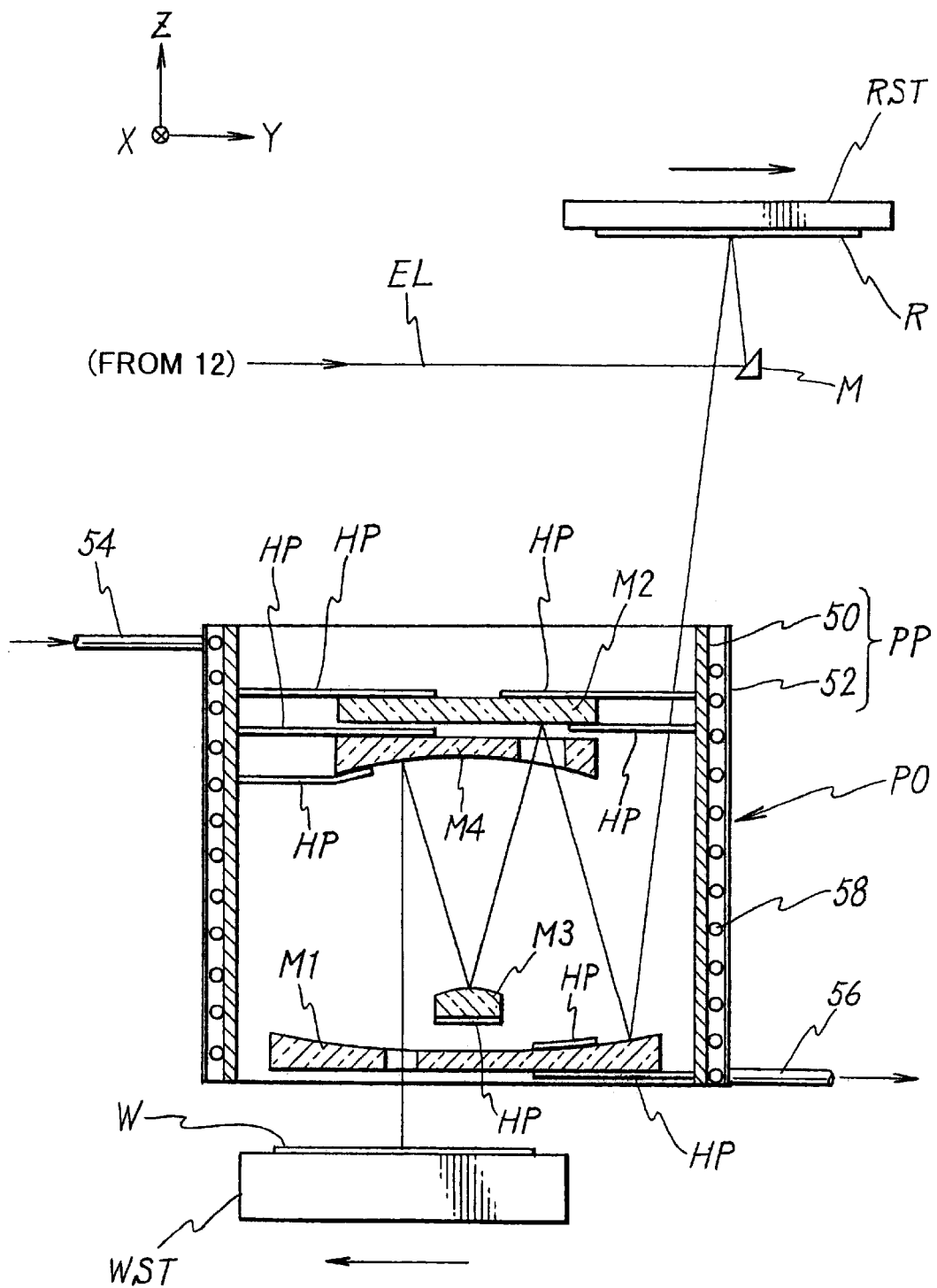
FIG. 8 schematically shows an internal structure of a projection optical system shown in FIG. 1.

The projection optical system PO will now be explained in further detail with reference to FIG. 8. As shown in FIG. 8, the projection optical system PO comprises four mirrors (reflecting optical elements) in total, i.e., a first mirror M1, a second mirror M2, a third mirror M3, and a fourth mirror M4 for successively reflecting the EUV light beam EL reflected by the reticle R, and a body tube PP for holding the mirrors M1 to M4. The reflecting surface of each of the first mirror M1 and the fourth mirror M4 has an aspherical configuration. The reflecting surface of the second mirror M2 is planar, and the reflecting surface of the third mirror M3 has a spherical configuration. The machining accuracy, which is not more than about ⅟50 to ⅟60 of the exposure wavelength, is realized for each of the reflecting surfaces with respect to the designed value, merely involving an error of not more than 0.2 nm to 0.3 nm concerning the RMS value (standard deviation). The material for each of the mirrors is low expansion glass or metal. A reflective layer for the EUV light beam is formed on the surface, which is composed of a multilayered film obtained by alternately stacking two substances in the same manner as in the reticle R.

In this embodiment, the material for the first mirror M1 and the second mirror M2 is low expansion glass having a small coefficient of thermal expansion. The material for the third mirror M3 and the fourth mirror M4 is metal. The reflective layer for the EUV light beam is formed on the surface of each of the mirrors M1 to M4, which is composed of the multilayered film obtained by alternately stacking two substances in the same manner as in the reticle R. The low expansion glass to be used for the mirror for constructing the projection optical system PO includes, for example, Zerodua (trade name) produced by Shot. Zerodua contains a crystalline layer having a high-quartz structure in an amount of 70 to 80% by weight. Therefore, its coefficient of linear expansion is $0\pm0.05\times10^{-6}$. The coefficient of thermal conductivity of Zerodua is 1.6 W/(m·K). In place of the low expansion glass such as Zerodua, it is also preferable to use low expansion ceramics such as those based on alumina ($Al_2O_3$) and those based on cordierite ($2MgO_2.2Al_2O_3.6SiO_2$).

In this arrangement, as shown in FIG. 8, a hole is bored through the fourth mirror M4 so that the light beam reflected by the first mirror M1 may arrive at the second mirror M2. Similarly, a hole is bored through the first mirror M1 so that the light beam reflected by the fourth mirror M4 may arrive at the wafer W. Of course, it is also preferable that the outer configuration of the mirror has a shape with a cutout to allow the light flux to pass therethrough without forming the hole.

The environment, in which the projection optical system PO is placed, is also vacuum. Therefore, the heat, which is generated by the radiation of the exposing illumination light beam, is not released anywhere. Accordingly, in this embodiment, the space between the mirrors M1 to M4 and the body tube PP for holding the mirrors M1 to M4 is connected with a heat pipe HP as a heat exchanger. Further, there is provided a cooling unit for cooling the body tube PP. That is, the body tube PP has a double structure comprising a mirror-holding section 50 disposed at the inside, and a cooling jacket 52 as the cooling unit installed to its outer circumference. A helical pipe 58 for allowing the cooling liquid to flow from the side of an inflow tube 54 to the side of an outflow tube 56 is provided at the inside of the cooling jacket 52. In this embodiment, cooling water is used as the cooling liquid. The cooling water, which outflows from the cooling jacket 52 via the outflow tube 56, is subjected to heat exchange with a cooling medium in an unillustrated refrigeration unit. Thus, the cooling water is cooled to a predetermined temperature, and then it inflows into the cooling jacket 52 via the inflow tube 54. The cooling water is circulated as described above.

Accordingly, in the projection optical system PO of this embodiment, even when the thermal energy is applied to the mirrors M1, M2, M3, M4 by the radiation of the exposing illumination light beam (EUV light beam) EL, then the heat exchange is effected with respect to the body tube PP which is temperature-adjusted to have a constant temperature by the aid of the heat pipe HP, and thus the mirrors M1, M2, M3, M4 are cooled to the constant temperature. In this arrangement, in the embodiment of the present invention, as shown in FIG. 8, for example, as for the mirrors M1, M2, M4, the heat pipe HP is also stuck to portions to which the exposing illumination light beam is not radiated on the front surface side (side of the reflecting surface) as well as to the back surface side thereof. Therefore, the respective mirrors are effectively cooled as compared with the case in which only the back surface side is cooled. It is needless to say that the heat pipe HP, which is disposed on the back surface side of the third mirror M3 and the front surface side of the first mirror M1, arrives at the inner circumferential surface of the body tube PP in the depth direction on the plane of paper. As shown in FIG. 6, the appearance of the body tube PP has a quadratic prism-shaped configuration.

With reference to FIG. 1 again, the wafer stage WST is arranged on a wafer stage base 60 arranged along the XY plane, and it is supported in a floating manner over the wafer stage base 60 by the aid of a magnetically floating type two-dimensional linear actuator 62. The wafer stage WST is driven in a predetermined stroke in the X direction and in the Y direction by the aid of the magnetically floating type two-dimensional linear actuator 62, and it is also driven in a minute amount in the θ direction (direction of rotation about the Z axis). The wafer stage WST can be also driven in a minute amount in the Z direction and in the direction inclined with respect to the XY plane by the aid of the magnetically floating type two-dimensional linear actuator 62. The magnetically floating type two-dimensional linear actuator is disclosed in U.S. patent application Ser. No. 998,038 (filed on Dec. 23, 1997). The content of the United States Patent Application is incorporated herein by reference so long as the domestic laws of the designated state designated in this international application or the selected state selected in this international application allow the incorporation of reference.

A permanent magnet (not shown) is provided in the bottom surface of the wafer stage WST. The magnetically floating type two-dimensional linear actuator 62 is constructed by the permanent magnet and a coil (not shown) which is spread in the XY two-dimensional directions on the wafer stage base 60. The position and the attitude of the wafer stage WST in the six-dimensional directions are controlled by controlling the current allowed to flow through the coil by the aid of the main control unit 80 as described later on.

An unillustrated wafer holder based on the electrostatic chuck system is placed on the upper surface of the wafer stage WST. The wafer W is attracted and held by the wafer holder. A second side surface of the wafer stage WST in the Y direction in FIG. 1 is mirror-finished to form a reflecting surface 74a for the light in the visible region. Although not shown in FIG. 1, a first side surface of the wafer stage WST in the X direction is also mirror-finished as shown in FIG. 6 to form a reflecting surface 74b for the light in the visible region. In the exposure apparatus 10, the position with respect to the projection optical system PO is correctly measured by an interferometer system for radiating measuring beams onto the reflecting surfaces 74a, 74b. The interferometer system will be described in detail later on.

A spatial image-measuring instrument FM is provided at one end of the upper surface of the wafer stage WST, for example, for performing measurement (so-called base line measurement) of the relative positional relationship of the alignment optical system ALG (alignment microscope) with respect to the position at which the pattern depicted on the reticle R is projected onto the surface of the wafer W. The spatial image-measuring instrument FM corresponds to the fiducial mark plate of the conventional DUV exposure apparatus.

Figure 9A:
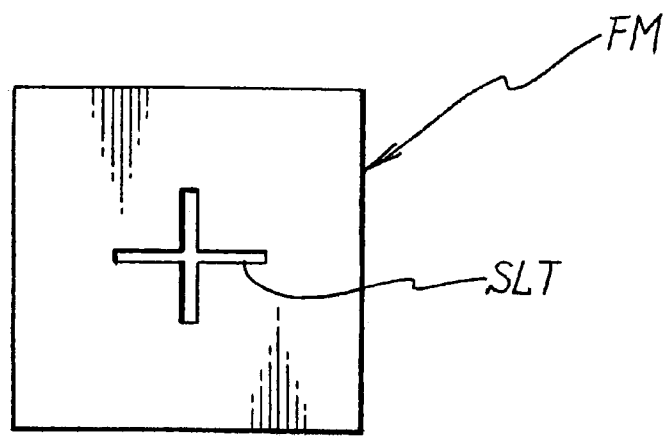
FIG. 9A shows a plan view illustrating a spatial image-measuring instrument.
Figure 9B:
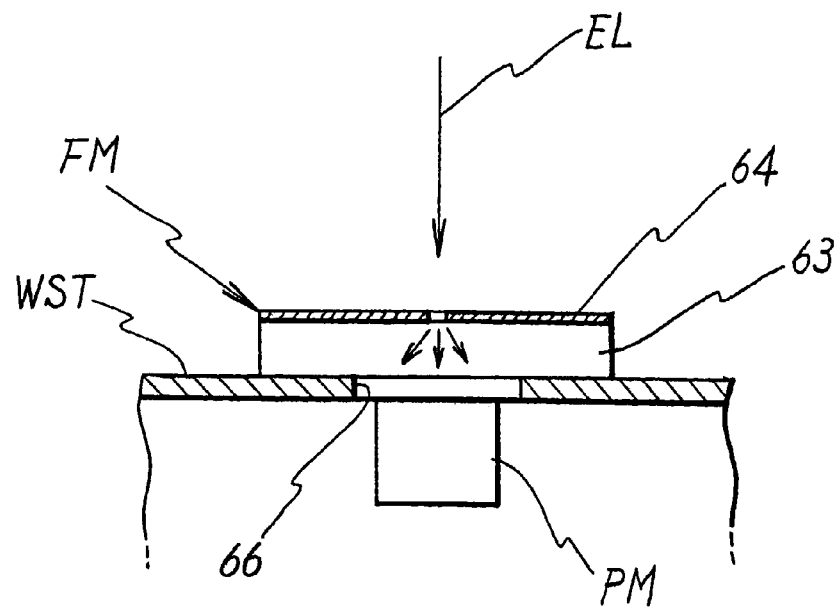
FIG. 9B shows the spatial image-measuring instrument shown in FIG. 9A.

FIGS. 9A and 9B show a plan view and a longitudinal sectional view of the spatial image-measuring instrument FM respectively. As shown in the drawings, a slit SLT as an aperture is formed on the upper surface of the spatial image-measuring instrument FM. The slit SLT is formed by means of patterning on a reflective layer 64 for the EUV light beam formed on the surface of a fluorescence-emitting substance 63 having a predetermined thickness fixed on the upper surface of the wafer stage WST. An absorbing layer for the EUV light beam may be provided in place of the reflective layer 64, and an aperture may be formed on the absorbing layer.

An aperture 66 is formed through an upper surface plate of the wafer stage WST disposed under the slit SLT. A photoelectric conversion element PM such as a photomultiplier is arranged at the inside of the wafer stage WST opposed to the aperture 66. Therefore, when the EUV light beam EL is radiated onto the spatial image-measuring instrument FM from the upward position via the projection optical system PO, the EUV light beam, which is transmitted through the slit SLT, arrives at the fluorescence-emitting substance 63. The fluorescence-emitting substance 63 emits a light beam having a long wavelength as compared with the EUV light beam. The light beam is received by the photoelectric conversion element PM, and it is converted into an electric signal corresponding to the intensity of the light. An output signal of the photoelectric conversion element PM is also supplied to the main control unit 80.

Next, with reference to FIG. 6, for example, explanation will be made in detail for the arrangement of the interferometer system 70 (see FIG. 10) for measuring the positions of the reticle stage RST and the wafer stage WST. FIG. 6 representatively shows the concerning laser interferometers with the measuring axes of the respective laser interferometers.

The interferometer system 70 comprises four laser interferometers RIFX1, RIFX2, RIFY1, RIFY2 for measuring the position of the reticle stage RST in the XY plane, and four laser interferometers WIFX1, WIFX2, WIFY1, WIFY2 for measuring the position of the wafer stage WST in the XY plane.

The interferometer RIFY1 projects a measuring beam RIFY1M onto the reflecting surface 40*a* of the reticle stage RST, and it projects a reference beam RIFY1R onto a fixed mirror (reference mirror) 72*a* (see FIG. 1) attached to the body tube PP of the projection optical system PO, so that reflected light beams therefrom are received to thereby measure the relative position of the reticle stage RST in the Y direction with respect to the fixed mirror 72*a* at the position of projection of the measuring beam RIFY1M.

Similarly, the interferometer RIFY2 projects a measuring beam RIFY2M onto the reflecting surface 40*a* of the reticle stage RST, and it projects a reference beam RIFY2R onto the fixed mirror (reference mirror) 72*a* (see FIG. 1) attached to the body tube PP of the projection optical system PO, so that reflected light beams therefrom are received to thereby measure the relative position of the reticle stage RST in the Y direction with respect to the fixed mirror 72*a* at the position of projection of the measuring beam RIFY2M.

The center of the positions of radiation of the measuring beams RIFY1M, RIFY2M of the two interferometers RIFY1, RIFY2 is coincident with the center of the illumination area IA (center of the reticle R in the X direction). Therefore, an average value of measured values of the two interferometers gives the position of the reticle stage RST in the Y direction. A value, which is obtained by dividing the difference between the both measured values by the spacing distance between the axes of the interferometers, gives the angle of rotation of the reticle stage RST (herein referred to as $\alpha 1$). The measured values of the interferometers RIFY1, RIFY2 are supplied to the main control unit 80. The main control unit 80 calculates the average value and the angle of rotation $\alpha 1$.

On the other hand, the interferometer RIFX1 projects a measuring beam RIFX1M onto the reflecting surface 40*b* of the reticle stage RST, and it projects a reference beam RIFX1R onto a fixed mirror (reference mirror) 72*b* attached to the body tube PP of the projection optical system PO, so that reflected light beams therefrom are received to thereby measure the relative position of the reticle stage RST in the X direction with respect to the fixed mirror 72*b* at the position of projection of the measuring beam RIFX1M.

Similarly, the interferometer RIFX2 projects a measuring beam RIFX2M onto the reflecting surface 40*b* of the reticle stage RST, and it projects a reference beam RIFX2R onto the fixed mirror (reference mirror) 72*b* attached to the body tube PP of the projection optical system PO, so that reflected light beams therefrom are received to thereby measure the relative position of the reticle stage RST in the X direction with respect to the fixed mirror 72*b* at the position of projection of the measuring beam RIFX2M.

The center of the positions of radiation of the measuring beams RIFX1M, RIFX2M of the two interferometers RIFX1, RIFX2 is coincident with the center of the illumination area IA (see the point P2 shown in FIG. 5). Therefore, an average value of measured values of the two interferometers gives the position of the reticle stage RST in the X direction. A value, which is obtained by dividing the difference between the both measured values by the spacing distance between the axes of the interferometers, gives the angle of rotation of the reticle stage RST (herein referred to as $\alpha 2$). The measured values of the interferometers RIFX1, RIFX2 are supplied to the main control unit 80. The main control unit 80 calculates the average value and the angle of rotation $\alpha 2$. In this embodiment, the main control unit 80 calculates any one of the angles of rotation $\alpha 1$, $\alpha 2$ or the average value thereof $(\alpha 1+\alpha 2)/2$ as the angle of rotation of the reticle stage RST in the $\theta$ direction.

The interferometer WIFY1 projects a measuring beam WIFY1M onto the reflecting surface 74*a* of the wafer stage WST, and it projects a reference beam WIFY1R onto a fixed mirror (reference mirror) 76*a* attached to the body tube PP of the projection optical system PO, so that reflected light beams therefrom are received to thereby measure the relative position of the wafer stage WST in the Y direction with respect to the fixed mirror 76*a* at the position of projection of the measuring beam WIFY1M.

Similarly, the interferometer WIFY2 projects a measuring beam WIFY2M onto the reflecting surface 74*a* of the wafer stage WST, and it projects a reference beam WIFY2R onto the fixed mirror (reference mirror) 76*a* attached to the body tube PP of the projection optical system PO, so that reflected light beams therefrom are received to thereby measure the relative position of the wafer stage WST in the Y direction with respect to the fixed mirror 76*a* at the position of projection of the measuring beam WIFY2M.

Figure 11:
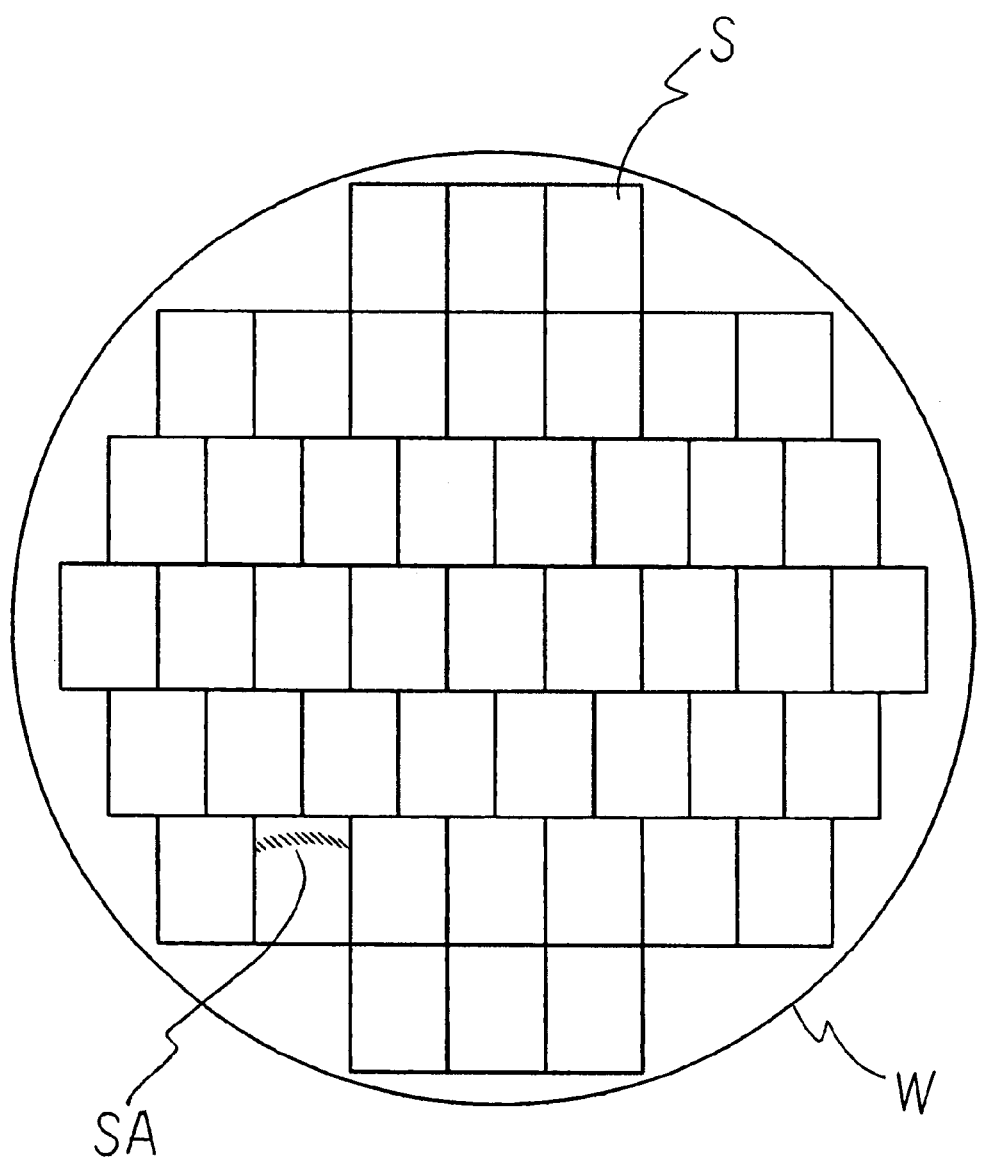
FIG. 11 shows a situation in which a reticle pattern is transferred to a plurality of shot areas on the wafer.

The center of the positions of radiation of the measuring beams WIFY1M, WIFY2M of the two interferometers WIFY1, WIFY2 is coincident with the center of the circular arc-shaped exposure area SA on the wafer corresponding to the illumination area IA (see FIG. 11). Therefore, an average value of measured values of the two interferometers gives the position of the wafer stage WST in the Y direction. A value, which is obtained by dividing the difference between the both measured values by the spacing distance between the axes of the interferometers, gives the angle of rotation of the wafer stage WST (herein referred to as $\beta 1$). The measured values of the interferometers WIFY1, WIFY2 are supplied to the main control unit 80. The main control unit 80 calculates the average value and the angle of rotation $\beta 1$.

On the other hand, the interferometer WIFX1 projects a measuring beam WIFX1M onto the reflecting surface 74*b* of the wafer stage WST, and it projects a reference beam WIFX1R onto a fixed mirror (reference mirror) 76*b* attached to the body tube PP of the projection optical system PO, so that reflected light beams therefrom are received to thereby measure the relative position of the wafer stage WST in the X direction with respect to the fixed mirror 76b at the position of projection of the measuring beam WIFX1M.

Similarly, the interferometer WIFX2 projects a measuring beam WIFX2M onto the reflecting surface 74b of the wafer stage WST, and it projects a reference beam WIFX2R onto the fixed mirror (reference mirror) 76b attached to the body tube PP of the projection optical system PO, so that reflected light beams therefrom are received to thereby measure the relative position of the wafer stage WST in the X direction with respect to the fixed mirror 76b at the position of projection of the measuring beam WIFX2M.

The center of the positions of radiation of the measuring beams WIFX1M, WIFX2M of the two interferometers WIFX1, WIFX2 is coincident with the center of the exposure area SA corresponding to the illumination area IA. Therefore, an average value of measured values of the two interferometers gives the position of the wafer stage WST in the X direction. A value, which is obtained by dividing the difference between the both measured values by the spacing distance between the axes of the interferometers, gives the angle of rotation of the wafer stage WST (herein referred to as β2). The measured values of the interferometers WIFX1, WIFX2 are supplied to the main control unit 80. The main control unit 80 calculates the average value and the angle of rotation 2. In this embodiment, the main control unit 80 calculates any one of the angles of rotation β1, β2 or the average value thereof (β1+β2)/2 as the angle of rotation of the wafer stage WST in the θ direction.

With reference to FIG. 1 again, a reticle plane-measuring laser interferometer RIFZ, which serves as a measuring unit for measuring the position of the reticle R in the Z direction (direction of the first axis), is provided on the body tube PP of the projection optical system PO which provides the reference for all of the measurement performed by the eight interferometers described above. Actually, as shown in FIG. 6, the laser interferometer RIFZ includes three laser interferometers RIFZ1, RIFZ2, RIFZ3 which are arranged at predetermined spacing distances and which are fixed to the body tube PP. However, in FIG. 1 (and FIG. 4), they are representatively depicted as the laser interferometer RIFZ.

Measuring beams from the laser interferometers RIFZ1 to RIFZ3 are projected pass through optical paths in the Z direction at the center of the incoming optical path and the outgoing optical path (reflecting optical path) of the exposing illumination light beam EL, and they are projected onto the pattern plane of the reticle R at different three points (P1 to P3) in the illumination area, i.e., the circular arc-shaped illumination area IA of the exposing illumination light beam EL projected onto the pattern plane of the reticle R at the predetermined angle of incidence θ via the turning mirror M (see FIGS. 1, 4, and 5). Accordingly, the laser interferometers RIFZ1, RIFZ2, RIFZ3 come into the pattern plane of the reticle R obliquely at the predetermined angle of incidence θ. Thus, the position of the reticle R in the Z direction can be measured with a high degree of accuracy (for example, with an accuracy of not more than several nm to 1 nm) without affecting the exposing illumination light beam EL reflected at the same outgoing angle as the angle of incidence and without affecting the measuring beams of the interferometers by the exposing illumination light beam EL.

In this embodiment, those of the reference mirror-containing type, in which the unillustrated reference mirror is contained in the main body, are used for the laser interferometers RIFZ1 to RIFZ3. The position in the Z direction of the position of radiation of the measuring beam on the reticle R is measured with reference to the position of the reference mirror in each case. In this embodiment, in the illumination area IA shown in FIG. 5, the measuring beam from the laser interferometer RIFZ1 is projected onto the position of the point P1, the measuring beam from the laser interferometer RIFZ2 is projected onto the position of the point P2, and the measuring beam from the laser interferometer RIFZ3 is projected onto the position of the point P3. The point P2 is the center of the illumination area IA, i.e., it is the point on the central axis of the pattern area PA in the X direction, and it is the central point of the illumination area in the Y direction. The points P1, P3 are located at the symmetric positions with respect to the central axis.

Figure 10:
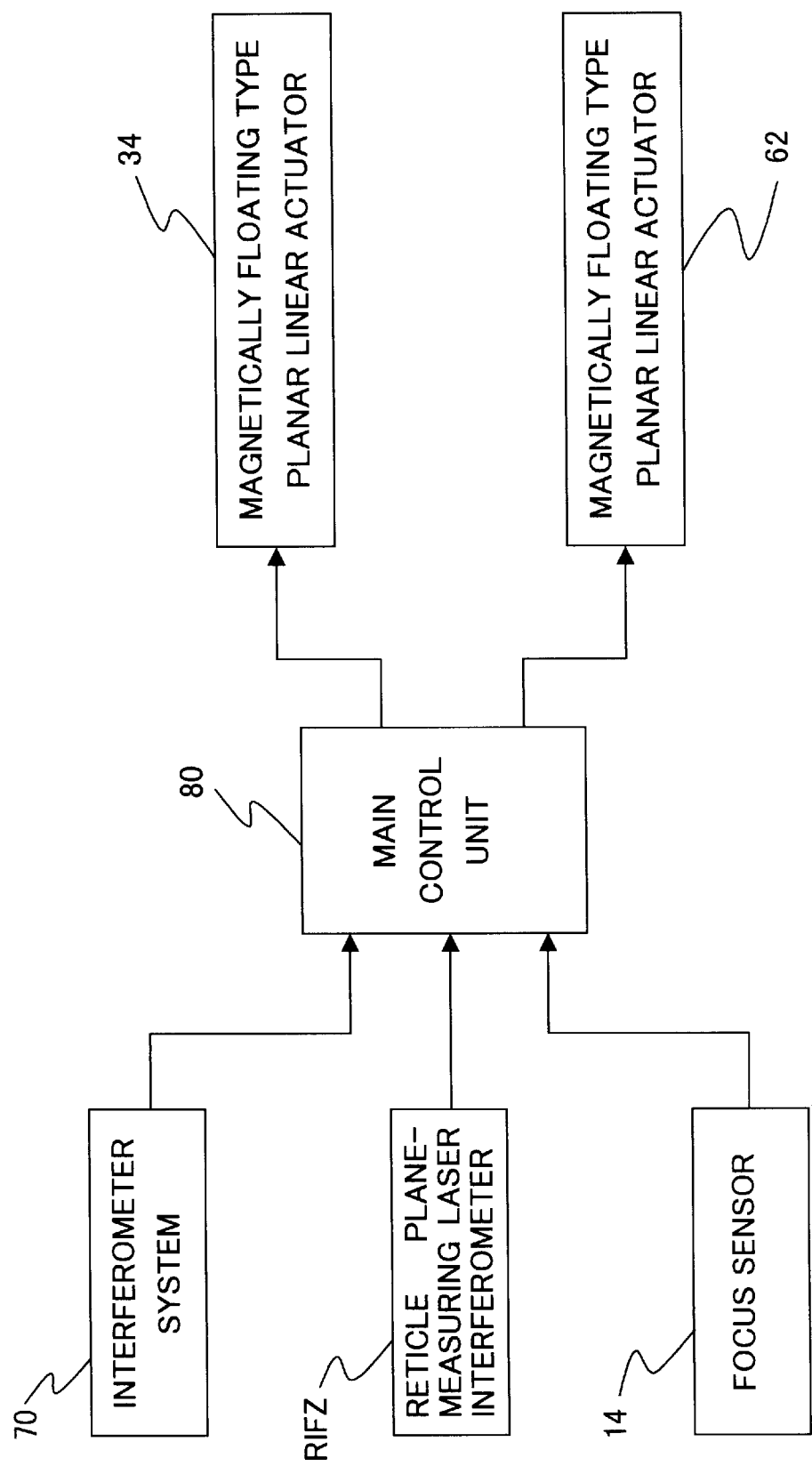
FIG. 10 shows a block diagram schematically illustrating the arrangement of a control system concerning the control of the position and the attitude of the wafer (wafer stage) and the reticle (reticle stage).

The measured values of the three laser interferometers RIFZ1 to RIFZ3 are inputted into the main control unit 80 (see FIG. 10). The main control unit 80 corrects the Z position and the inclination of the reticle stage RST, i.e., those of the reticle R on the basis of the three measured values by the aid of the magnetically floating type two-dimensional linear actuator 34 as described later on.

On the other hand, the position of the wafer W in the Z direction on the basis of the body tube PP is measured by the focus sensor 14 based on the oblique incidence system fixed to the projection optical system PO. As shown in FIG. 1, the focus sensor 14 comprises a light-feeding system 14a fixed to an unillustrated column for holding the body tube PP, for radiating a detecting beam FB in an oblique direction onto the surface of the wafer W, and a light-receiving system also fixed to the unillustrated column, for receiving the detecting beam FB reflected by the surface of the wafer W. Those usable as the focus sensor include, for example, a multiple focus position-detecting system disclosed, for example, in Japanese Patent Application Laid-Open No. 6-283403 and U.S. Pat. No. 5,448,332 corresponding thereto, and a focus leveling system described in Japanese Patent Application Laid-Open No. 7-201699 and U.S. Pat. No. 5,473,424 corresponding thereto. It is important that the focus sensor 14 (14a, 14b) is fixed integrally with the body tube PP. The content of these Japanese patent documents and these United States patents are incorporated herein by reference so long as the domestic laws of the designated state designated in this international application or the selected state selected in this international application allow the incorporation of reference.

As clarified from the foregoing explanation, in the embodiment of the present invention, the position of the reticle R in the XYZ three-dimensional directions is measured on the basis of the body tube PP of the projection optical system PO. Further, the position of the wafer W in the XYZ three-dimensional directions is measured on the basis of the body tube PP of the projection optical system PO. Therefore, it is unnecessary that the three components, i.e., the projection optical system PO, the reticle stage RST, and the wafer stage WST are supported by an identical support member. No trouble occurs at all even when they are supported by different support members respectively. That is, no trouble occurs even when no mechanical contact is made among the three components of the projection optical system PO, the reticle stage RST, and the wafer stage WST at all. The main bodies of the respective interferometers for constructing the interferometer system 70 described above also perform the measurement with reference to the respective fixed mirrors attached to the body tube PP. Therefore, no mechanical contact is required with respect to the projection optical system PO, the reticle stage RST, and the wafer stage WST.

In the embodiment of the present invention, as shown in FIG. 1, the alignment optical system ALG is fixed to the side surface of the projection optical system PO. A variety of ones can be used as the alignment optical system ALG, including, for example, an alignment sensor based on the image formation system for radiating a broad band light beam onto an alignment mark on the wafer W (or the spatial image-measuring instrument FM) and receiving a reflected light beam therefrom to detect the mark in accordance with the image processing system, an alignment sensor based on the LIA (Laser Interferometric Alignment) system for radiating a laser beam onto a lattice mark to detect a diffracted light beam, and a scanning type probe microscope such as AFM (interatomic force microscope).

FIG. 10 schematically shows a block diagram illustrating the arrangement of the control system in relation to the control of the position and the attitude of the wafer W (wafer stage WST) and the reticle R (reticle stage WST) having been explained everywhere. The stage control system is constructed by the main control unit 80 (composed of a microcomputer or a minicomputer) and the magnetically floating type linear actuators 34, 62 of the control system shown in FIG. 10. Further, the driving unit is constructed by these components and the reticle stage RST and the wafer stage WST.

Next, explanation will be made for the operation in the exposure step effected by the exposure apparatus 10 according to the first embodiment of the present invention constructed as described above.

At first, the reticle R is transported by an unillustrated reticle transport system, and it is attracted and held by the reticle holder RH of the reticle stage RST which is at the loading position. Subsequently, the driving unit 46 moves the slit plate 44 to the position (second position) at which the second slit 44b is irradiated with the exposing illumination light beam EL on the basis of the command from the main control unit 80. Subsequently, the main control unit 80 controls the positions of the wafer stage WST and the reticle stage RST by the aid of the magnetically floating type two-dimensional linear actuators 62, 34 so that the reticle alignment marks RM1, RM4, RM2, RM5, RM3, RM6 depicted on the reticle R are successively irradiated with the respective two exposing illumination light beams EL. Projected images of the reticle alignment marks RM1, RM4, RM2, RM5, RM3, RM6 onto the surface of the wafer W are detected by the spatial image-measuring instrument FM to thereby determine the position of projection of the reticle pattern image on the surface of the wafer W. That is, the reticle alignment is performed.

Subsequently, the main control unit 80 moves the wafer stage WST by the aid of the magnetically floating type two-dimensional linear actuator 62 so that the slit SLT of the spatial image detector FM is located just under the alignment optical system ALG to indirectly determine the image formation position of the pattern image of the reticle R on the surface of the wafer W and the relative position of the alignment optical system ALG, i.e., the base line amount on the basis of the detection signal of the alignment optical system ALG and the measured value obtained by the interferometer system 70 during this process.

When the measurement of the base line is completed as described above, the main control unit 80 detects the position of the wafer alignment mark as a previously determined sampling object of the wafer alignment marks affixed to the respective shot areas on the wafer W on the wafer stage WST by using the alignment optical system ALG while successively moving the wafer stage WST. When the detection of the position of the wafer alignment mark of the sample shot is completed as described above, the positions of all of the shot areas on the wafer W are determined in accordance with a statistic technique based on the use of the least square method by using the obtained data. For example, it is possible to use the EGA (enhanced global alignment) method as disclosed in Japanese Patent Application Laid-Open No. 61-44429 and U.S. Pat. No. 4,780,617 corresponding thereto. The content of this United States Patent is incorporated herein by reference so long as the domestic laws of the designated state designated in this international application or the selected state selected in this international application allow the incorporation of reference.

When the alignment measurement is completed, the main control unit 80 switches the slit plate 44 to the position (first position) at which the first slit 44a is irradiated with the exposing illumination light beam EL, by the aid of the driving mechanism 46.

The main control unit 80 performs the exposure in accordance with the step-and-scan system as follows by using the EUV light beam as the exposing illumination light beam EL. That is, the wafer stage WST is positioned at the scanning start position for the first shot by the aid of the magnetically floating type two-dimensional linear actuator 62 while monitoring the position information from the interferometer system 70 in accordance with the position information of each of the shot areas on the wafer W determined as described above. The reticle stage RST is performed at the scanning start position by the aid of the magnetically floating type two-dimensional linear actuator 34 to perform the scanning exposure for the first shot. During the scanning exposure, the main control unit 80 controls the velocities of the both stages by the aid of the magnetically floating type two-dimensional linear actuators 34, 62 so that the velocity ratio between the reticle stage RST and the wafer stage WST is correctly coincident with the projection magnification of the projection optical system PO. The exposure (transfer of the reticle pattern) is performed in the constant velocity synchronized state at the velocity ratio of the both stages as described above. When the scanning exposure for the first shot is completed as described above, the stepping operation is performed between the shots so that the wafer stage WST is moved to the scanning start position for the second shot. The scanning exposure is performed for the second shot in the same manner as described above. In this process, in order to improve the throughput by omitting the operation to return the reticle stage RST, the scanning exposure is performed for the first shot and the second shot in opposite directions, i.e., when the exposure for the first shot is performed in the direction from one side from the other side on the Y axis, the exposure for the second shot is performed in the direction from the other side to the one side. In other words, the alternate scanning is performed. Thus, the stepping operation between the shots and the scanning exposure operation for the shot are repeated to transfer the pattern on the reticle R to all of the shot areas on the wafer W in accordance with the step-and-scan system. FIG. 11 shows the situation in which the reticle pattern is transferred to the plurality of shot areas on the wafer W as described above. In the case of the procedure shown in FIG. 11, the number of shots accommodated in one row is appropriately even or add in order to efficiently obtain the shot having the complete form from one sheet of wafer.

In this process, during the scanning exposure and the alignment, the spacing distance between the surface of the wafer W and the projection optical system PO and the inclination with respect to the XY plane are measured by the focus sensor (14a, 14b) integrally attached to the projection optical system PO. The main control unit 80 controls the wafer stage WST by the aid of the magnetically floating type two-dimensional linear actuator 62 so as to always obtain the constant parallelism and the constant spacing distance between the surface of the wafer W and the projection optical system PO.

The main control unit 80 synchronously moves the reticle stage RST and the substrate stage WST in the Y axis direction (direction of the second axis) while adjusting the position of the reticle R in the direction of the optical axis of the projection optical system PO (direction of the first axis, Z direction) by controlling the magnetically floating type two-dimensional linear actuator 34 so that the spacing distance between the projection optical system PO and the pattern plane of the reticle R is always maintained to be constant during the exposure (during the transfer of the reticle pattern) on the basis of the predetermined adjusting position information measured by at least one of the reticle plane-measuring laser interferometers RIFZ1, RIFZ2, RIFZ3 as the measuring units. In this process, the main control unit 80 adjusts the position of the reticle stage RST in the Z direction during the synchronous movement of the reticle stage RST and the wafer stage WST based on the adjusting position information corresponding to the movement direction, of the first adjusting position information and the second adjusting position information measured by at least one of the reticle plane-measuring laser interferometers RIFZ1, RIFZ2, RIFZ3 for each movement direction of the reticle stage RST, for example, for the first shot and the second shot.

Therefore, according to the embodiment of the present invention, the entire surface of the pattern of the reticle R is successively transferred onto the wafer W in accordance with the scanning exposure. During this process, the position of the reticle R in the direction of the optical axis of the projection optical system PO (first axis direction) is adjusted on the basis of the adjusting position information. Therefore, although the reticle side of the projection optical system PO is non-telecentric, it is possible to effectively suppress the occurrence of the magnification error and the positional discrepancy in the transferred image of the pattern on the wafer W due to the displacement of the reticle R in the direction of the optical axis. As a result, it is possible to improve the overlay accuracy. Further, even when the positional displacement of the reticle R in the Z direction during the synchronous movement differs depending on, for example, any mechanical factor (movement characteristic of the stage) and any control characteristic between the movement of the reticle stage RST along the Y axis from one side to the other side and the movement from the other side to the one side, the Z position of the reticle R can be adjusted highly accurately without being affected by the difference. Thus, it is possible to more effectively suppress the occurrence of the magnification error and the positional discrepancy in the transferred image of the pattern on the wafer W due to the displacement of the reticle R in the Z direction.

In this process, the main control unit 80 may adjust the position of the reticle R in the Z direction during the exposure either by performing the feedforward control for the magnetically floating type two-dimensional linear actuator 34 on the basis of the adjusting position information (first adjusting position information, second adjusting position information) obtained by previously performing the measurement with at least one of the reticle plane-measuring laser interferometers RIFZ1, RIFZ2, RIFZ3, or by performing the feedback control for the magnetically floating type two-dimensional linear actuator 34 on the basis of the adjusting position information (first adjusting position information, second adjusting position information) obtained by performing the real-time measurement with at least one of the reticle plane-measuring laser interferometers RIFZ1, RIFZ2, RIFZ3 during the actual scanning exposure. In the case of the former, the adjustment is made in accordance with the feedforward control on the basis of the previously measured information without measuring the Z displacement of the reticle R during the synchronous movement of the reticle stage RST and the wafer stage WST. Therefore, the adjustment error is scarcely caused due to any control delay during the adjustment. In the case of the latter, it is necessary to make any artifice for the control system so that the control delay is not caused, as compared with the former. However, the latter is advantageous in that the position of the reticle R in the Z direction can be adjusted with a higher degree of accuracy.

Each of the reticle plane-measuring laser interferometers RIFZ1, RIFZ2, RIFZ3 measures the position of the reticle R in the Z direction at the position of radiation of each of the measuring beams by radiating each of the measuring beams onto the different positions in the circular arc-shaped illumination area IA of the reticle R. Therefore, it is possible to adjust not only the Z position in the objective area for the pattern transfer on the reticle R but also the inclination thereof at every moment on the basis of the most correct measurement data by using all of the reticle plane-measuring laser interferometers RIFZ1, RIFZ2, RIFZ3. As a result, it is possible to further improve the overlay accuracy.

As clarified from the foregoing explanation, in the embodiment of the present invention, the main control unit 80, the magnetically floating type two-dimensional linear actuator 34, the reticle plane-measuring laser interferometer RIFZ, and the reticle stage RST are used to construct the correcting unit which corrects the image magnification error of the reticle pattern during the synchronous movement of the reticle R and the wafer W by relatively moving the reticle R in the first direction with respect to the projection optical system PO, i.e., the correcting unit for compensating the change in image magnification of the reticle pattern caused by the movement of the reticle R. In the embodiment of the present invention, the main control unit 80, the magnetically floating type two-dimensional linear actuator 34, the reticle plane-measuring laser interferometer RIFZ, and the reticle stage RST are used to construct the adjusting unit which adjusts at least one of the position of the reticle in the direction perpendicular to the object plane of the projection optical system and the relative inclination of the reticle with respect to the object plane during the synchronous movement of the reticle R and the wafer W. Further, in the embodiment of the present invention, the magnetically floating type two-dimensional linear actuator 34 and the reticle stage RST are used to construct the driving member which drives the reticle R in the Z direction on the side of the object plane of the projection optical system PO during the synchronous movement of the reticle R and the wafer W.

As explained in detail above, according to the first embodiment of the present invention, the illumination light beam EL in the direction of the optical axis, which is inclined with respect to the Z direction perpendicular to the reticle R, is radiated onto the reticle R from the illumination optical system (PRM, IM, 30, M, 44). The illumination light beam is reflected by the pattern plane of the reticle R, and the reflected light beam is projected onto the wafer W by the aid of the projection optical system PO. Thus, the pattern on the reticle R illuminated with the illumination light beam is transferred to the wafer W. During the transfer of the reticle pattern, the driving unit (80, 34, 62, RST, WST) is operated to synchronously move the reticle R and the wafer W at the velocity ratio corresponding to the magnification of the projection optical system PO. During the synchronous movement, the correcting unit (80, 34, RST, RIFZ) is operated to relatively move the reticle R in the Z direction with respect to the projection optical system PO in order to correct the image magnification error of the pattern. During this process, it is also preferable that the correcting unit is used to move the reticle R in the Z direction on the basis of the output of the reticle plane-measuring laser interferometer RIFZ. Accordingly, in the exposure apparatus 10 according to the embodiment of the present invention, the entire surface of the pattern of the reticle R is successively transferred onto the wafer W in accordance with the scanning exposure. During this process, the correcting unit is operated to relatively move the reticle R in the Z direction with respect to the projection optical system PO in order to correct the image magnification error of the pattern. Therefore, it is possible to effectively suppress the occurrence of the magnification error in the transferred image of the pattern on the wafer W due to the displacement of the reticle R in the direction of the optical axis. As a result, it is possible to improve the overlay accuracy.

According to the embodiment of the present invention, the illumination system (12, PRM, IM, 30, M, 44) radiates the EUV light beam having the wavelength of 5 to 15 nm as the illumination light beam EL. The reflecting optical system, which is composed of only the plurality of reflecting optical elements (M1 to M4), is used as the projection optical system PO. Accordingly, the reticle pattern is transferred to the wafer W via the projection optical system PO by using the EUV light beam. Therefore, it is possible to highly accurately transfer the extremely fine pattern, for example, an L/S pattern of 100 nm.

According to the embodiment of the present invention, the interferometer system 70 measures the relative positions of the reticle stage RST and the wafer stage WST in the XY plane with respect to the projection optical system PO. The relative position of the reticle R in the Z direction with respect to the projection optical system PO is measured by the laser interferometer RIFZ. Further, the relative position of the wafer W in the Z direction with respect to the projection optical system PO is measured by the focus sensor 14. Therefore, no trouble occurs at all even when the reticle stage RST, the wafer stage WST, and the projection optical system PO are supported by the different support members. Accordingly, it is unnecessary to mechanically connect the reticle stage RST, the wafer stage WST, and the projection optical system PO. Therefore, the image formation characteristic of the projection optical system PO is not badly affected by the reaction force caused by the rate of acceleration or deceleration during the movement of the reticle stage RST and the wafer stage WST and the vibration of the support members for the respective stages. The behavior of the other stage is not badly affected via the support member by the reaction force caused by the rate of acceleration or deceleration during the movement of one stage.

According to the embodiment of the present invention, the slit plate 44 in the illumination optical system has the first slit 44a for radiating the illumination light beam EL onto the part of the reticle pattern, and the second slit 44b for radiating the illumination light beam EL onto the reticle alignment mark. The driving mechanism 46 is provided for switching the first slit 44a and the second slit 44b with respect to the illumination light beam EL. Therefore, it is possible to set the appropriate illumination area for the exposure and the alignment respectively with the identical slit plate 44. In this arrangement, the degree of freedom of the cross-sectional configuration of the illumination light beam radiated from the illumination optical system to the reticle R is increased as compared with the case in which the slit plate 44 is not provided. The degree of freedom of the design of the optical element for constructing the illumination optical system is improved corresponding thereto.

In the embodiment of the present invention, the exposing illumination light beam EL is the light beam in the soft X-ray region. The spatial image-measuring instrument FM is provided on the wafer stage WST, which comprises the fluorescence-emitting substance 63, the slit SLT formed by the thin film of the reflective layer 62 for the exposing illumination light beam EL on the surface thereof, and the photoelectric converter element PM for photoelectrically converting the light emitted by the fluorescence-emitting substance 63 when the exposing illumination light beam EL arrives at the fluorescence-emitting substance 63 via the slit SLT. Accordingly, although there is usually no substance which transmits the light in the soft X-ray region, the spatial image can be measured by the exposing illumination light beam even when the light as described above is used as the exposing illumination light beam. For example, it is possible to easily determine the projection position of the reticle pattern on the wafer stage WST by using the spatial image-measuring instrument FM.

In the embodiment of the present invention, the pattern on the reticle R is formed by the absorbing substance for the EUV light beam (exposing illumination light beam) EL, formed as the film on the reflective layer for the EUV light beam EL. Therefore, unlike the case of the patterning of the multilayered film composed of the reflecting substance for the light in the soft X-ray region as the exposing illumination light beam, it is possible to repair the pattern in the case of failure. When the material for the absorbing substance is appropriately selected, it is possible for the absorbing substance and the reflective layer for the exposing illumination light beam to set the substantially identical reflectance concerning the measuring beam (for example, the light in the visible region) of the interferometer RIFZ. The position of the reticle R in the Z axis direction can be measured with the substantial identical accuracy over the entire surface of the reticle R.

The embodiment described above is illustrative of the case in which the reference mirror-integrated type is used as the reticle plane-measuring laser interferometer RIFZ. However, the present invention is not limited thereto. The interferometer as the measuring unit for measuring the Z position of the mask may include a reference mirror fixed to the projection optical system and a main interferometer body arranged at a position separated from the projection optical system. In such a case, it is possible to avoid the bad influence on the optical characteristics of the projection optical system or the various sensors such as the focus sensor and the alignment sensor fixed thereto due to the heat generated by the main interferometer body. In the embodiment described above, explanation has been made for the case in which the three measuring beams from the laser interferometer RIFZ are radiated onto the illumination area IA on the reticle R. However, there is no limitation thereto. For example, it is also preferable that the interferometer RIFZ radiates the measuring beams onto different positions in the Y direction on the reticle R, and the position of the reticle R in the Z direction is measured for each of the positions of radiation of the respective measuring beams. In this arrangement, the inclination discrepancy and the positional discrepancy of the reticle R in the direction of the optical axis can be adjusted during the synchronous movement of the reticle R and the wafer W for at least the Y direction (direction of the synchronous movement). In this case, when at least two measuring beams are radiated from the interferometer RIFZ onto the both sides in the Y direction of the illumination area IA on the reticle, the Z position of the reticle R can be adjusted in accordance with the feedforward control by performing the so-called pre-reading control during the synchronous movement of the reticle R and the wafer W. In such a case, an adjusting unit for adjusting at least one of the position of the reticle in the direction perpendicular to the object plane of the projection optical system and the relative inclination of the reticle with respect to the object plane is constructed by the main control unit 80, the magnetically floating type two-dimensional linear actuator 34, the reticle plane-measuring laser interferometer RIFZ, and the reticle stage RST. The pre-reading control is disclosed, for example, in U.S. Pat. No. 5,448,332. This United States Patent is incorporated herein by reference so long as the domestic laws of the designated state designated in this international application or the selected state selected in this international application allow the incorporation of reference.

In the embodiment described above, explanation has been made for the case in which the driving member for moving the reticle R in the Z direction (first direction) on the side of the object plane of the projection optical system PO during the synchronous movement is constructed by the reticle stage RST for holding the reticle R and the magnetically floating type two-dimensional linear actuator 34 for driving the reticle stage. However, there is no limitation thereto. Another actuator such as a piezoelectric element may be provided on the reticle stage RST, for driving, at a plurality of points in the Z direction, the reticle holder RH for holding the reticle R, and the driving member may be constructed thereby. In any case, it is desirable that the driving member relatively inclines the reticle R with respect to the object plane of the projection optical system PO. In this arrangement, the inclination of the projection optical system PO with respect to the object plane can be also adjusted, in addition to the fact that the reticle R is moved in the Z direction on the side of the object plane of the projection optical system PO by the aid of the driving member during the synchronous movement. Therefore, although the side of the object plane of the projection optical system is non-telecentric, it is possible to effectively suppress the occurrence of the magnification error and the positional discrepancy in the transferred image of the pattern on the wafer W due to the displacement of the reticle R in the direction of the optical axis. As a result, it is possible to improve the overlay accuracy.

In the embodiment described above, explanation has been made for the case in which the circular arc-shaped illumination area IA is defined with the slit plate 44. However, there is no limitation thereto. It is not necessarily indispensable to provide the slit plate 44 disposed just under the reticle R provided that the respective optical members for constructing the illumination optical system are designed so that the illumination light beam EL has the circular arc-shaped configuration. For example, an illumination beam having a circular arc-shaped cross-sectional configuration can be formed by adjusting the curvature distribution of the reflecting mirror IM. If a laser light source for oscillating the wavelength of the illumination light beam EL is available at present or in future, in place of the light source 16 shown in FIGS. 2 and 3, it is possible to use such a laser light source with the slit plate or without the slit plate. When such an arrangement is made, the light source can be further simplified.

The reticle alignment marks may be disposed at the positions of RM7 to RM12 in FIG. 5, not at the positions of RM1 to RM6. In this case, it is enough to use a slit plate having only the first slit 44a, as the slit plate 44. Further, it is unnecessary to provide the driving mechanism 46. Alternatively, the reticle alignment marks may be formed at all of the positions RM1 to RM12, and all of them may be formed.

Second Embodiment

Next, a second embodiment of the present invention will be explained on the basis of FIG. 12 and FIG. 13. Constitutive components, which are the same as or equivalent to those of the first embodiment described above, are designated by the same reference numerals, detailed explanation of which will be omitted.

Figure 12:
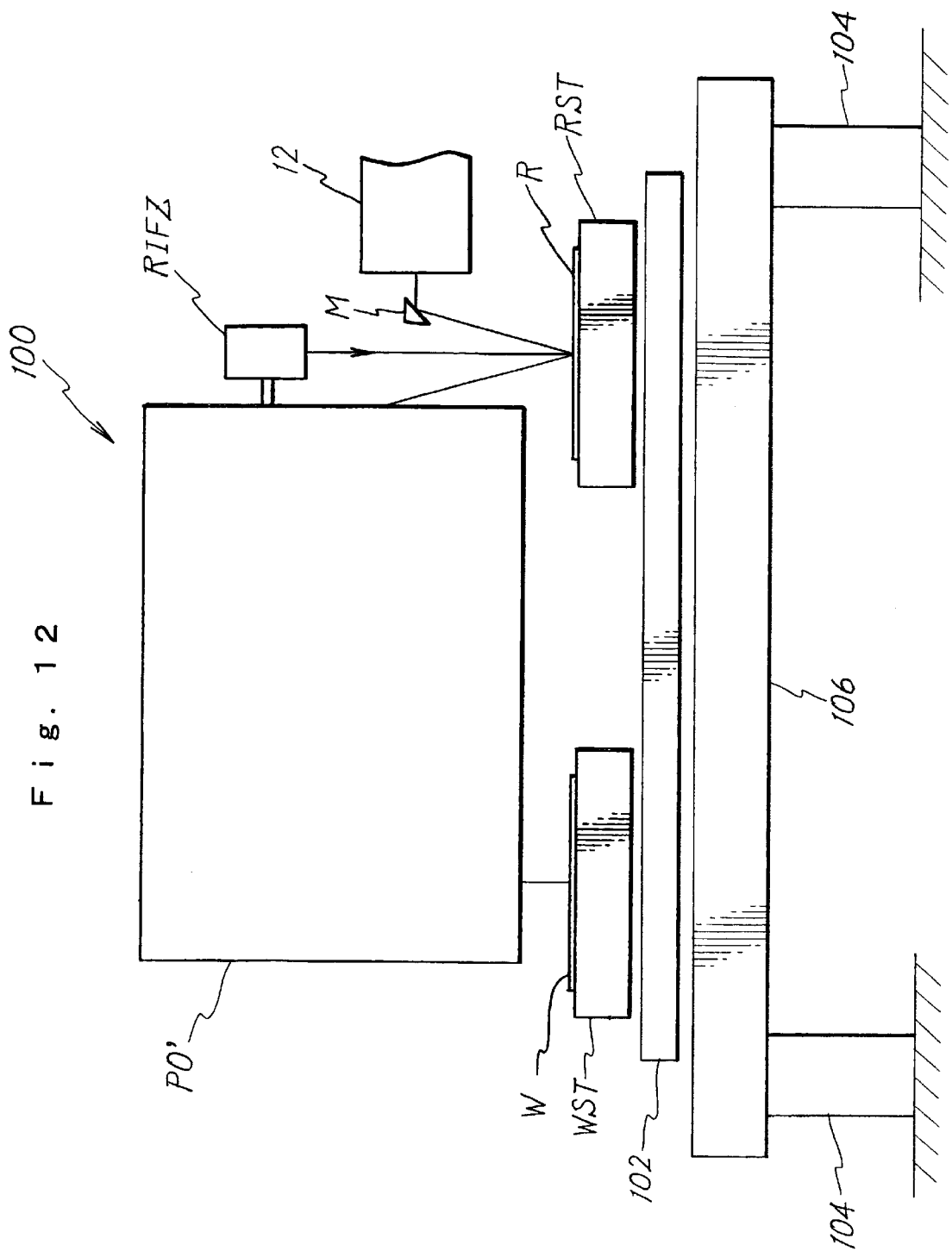
FIG. 12 schematically shows an overall arrangement of an exposure apparatus according to a second embodiment.

FIG. 12 schematically shows an overall arrangement of an exposure apparatus 100 according to the second embodiment. The exposure apparatus 100 is also a projection exposure apparatus for performing the exposure operation based on the step-and-scan system by using the light beam (EUV light beam) in the soft X-ray region having the wavelength of 5 to 15 nm as the exposing illumination light beam EL, in the same manner as the exposure apparatus 10 described above.

The exposure apparatus 100 is different from the exposure apparatus 10 described above in that a projection optical system PO' is provided in place of the projection optical system PO described above. The exposure apparatus 100 is characterized by this point.

Figure 13:
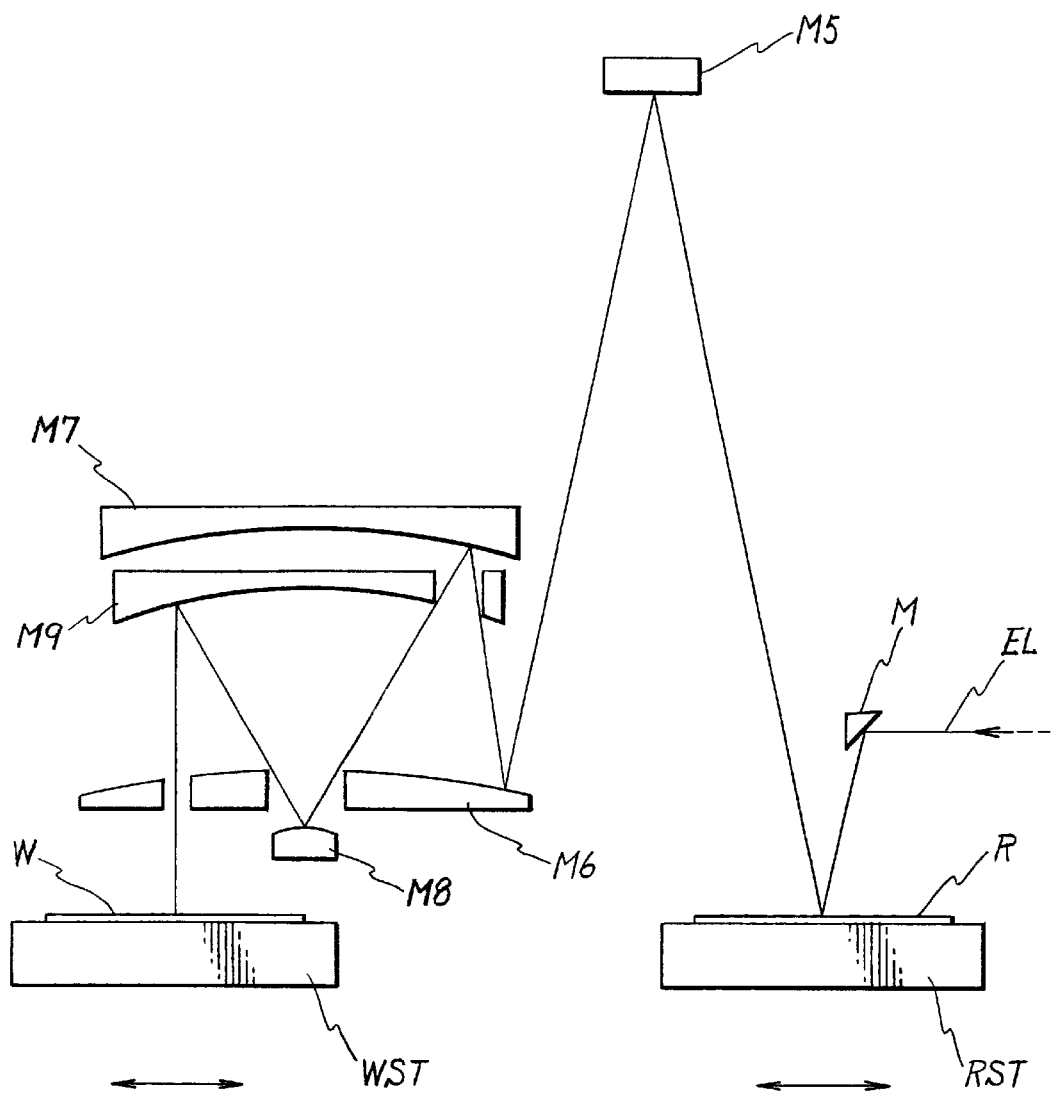
FIG. 13 shows an internal structure of a projection optical system shown in FIG. 12.

FIG. 13 shows an internal arrangement of the projection optical system PO'. As shown in FIG. 13, the projection optical system PO' comprises five mirrors M5 to M9. As a result, as shown in FIG. 12, both of the reticle stage RST and the wafer stage WST are disposed on the same side with respect to the projection optical system PO'. The arrangement and other features of the other parts are the same as those of the exposure apparatus 10 according to the first embodiment described above. Therefore, although only the reticle plane-measuring interferometer RIFZ is shown in FIG. 12, it is a matter of course that the other measuring systems, i.e., for example, the reticle XY interferometer, the wafer XY interferometer, the focus sensor, and the alignment optical system are actually provided in the same manner as in the first embodiment.

Although no cooling system is provided for the mirrors M5 to M9 in FIG. 13, it is allowable that any cooling system for the mirrors M5 to M9 is provided in the same manner as in the first embodiment.

Also in the exposure apparatus 100 according to the second embodiment constructed as described above, the spacing distance between the reticle R and the projection optical system PO' can be measured by using the reticle plane-measuring interferometer RIFZ, and it is possible to obtain the function and the effect equivalent to those of the first embodiment described above.

In the exposure apparatus explained in the first embodiment (see FIG. 1), the wafer stage WST and the reticle stage RST are supported in the floating manner over the base boards 32, 60 by the two-dimensional linear actuators 34, 62 respectively. On the contrary, in the case of the exposure apparatus 100 according to this embodiment shown in FIG.

12, the reticle stage RST and the wafer stage WST are arranged on the same side with respect to the projection optical system PO' as described above. Therefore, the stages can be supported on the common base board 102.

The exposure apparatus 100 is further provided with the surface plate 106 which is supported horizontally by the aid of unillustrated four vibration-preventive pads 104. The base board 102 is supported by a two-dimensional linear actuator (not shown) in a floating manner over the base board 106. The two-dimensional linear actuator can be constructed by a plurality of magnets embedded in the bottom surface of the base board 102 and a magnetic coil embedded over the entire surface of the surface plate 106, in the same manner as in the two-dimensional linear actuators for the reticle stage RST and the wafer stage WST shown in FIGS. 1 and 4.

When the wafer stage WST and the reticle stage RST are synchronously moved in mutually opposing directions in the exposure apparatus 100 shown in FIG. 12, the position of the center of gravity of the stage system constructed by the both stages is changed, because the wafer stage WST and the reticle stage RST are different from each other in the weight and the movement velocity. The reaction force is exerted on the base board 102 due to the change of the position of the center of gravity of the stage system. The base board 102 is moved with respect to the surface plate 106 in accordance with the reaction force. During this process, the base board 102 is moved so that the momentum of the system including the base board and the two stages is equal to the momentum of the stage. Even when the position of the center of gravity of the stage system is changed to cause the unbalanced load in the base board 102, the unbalanced load can be canceled by the movement of the center of gravity of the base board 102. Therefore, it is possible to hold the center of gravity of the entire exposure apparatus 100 at a predetermined position. Even when the two stages are moved in order to perform the scanning exposure, the exposure apparatus itself is prevented from vibration.

Third Embodiment

Figure 14A:
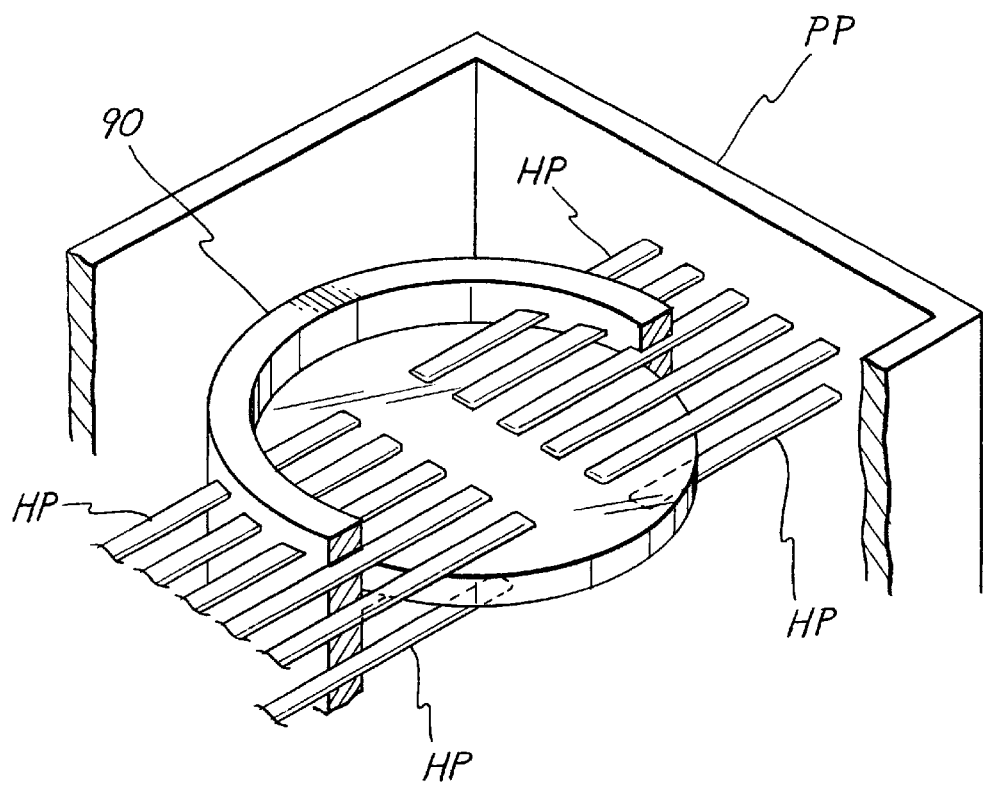
FIG. 14A shows a schematic perspective view for illustrating a support structure for each mirror shown in FIG. 8.
Figure 14B:
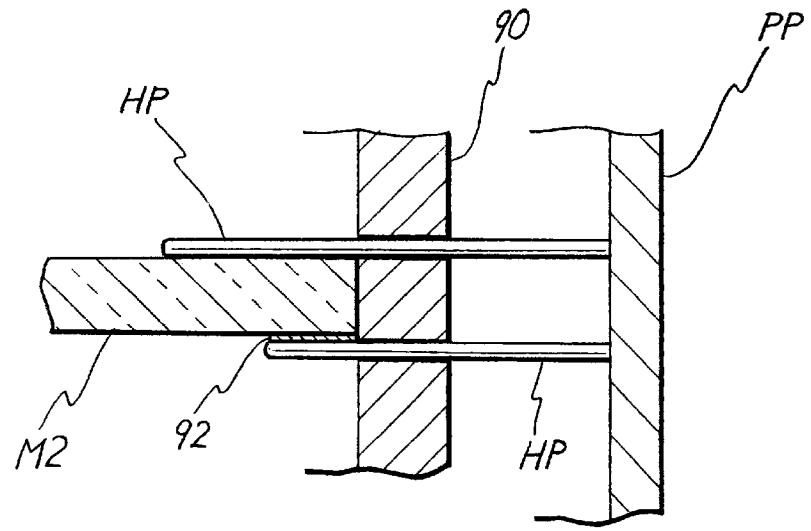
FIG. 14B shows a side view of FIG. 14A.

This embodiment is illustrative of a specified arrangement for suppressing the deterioration of the transferred image due to any variation of radiation. By way of example, FIGS. 14A and 14B schematically show a support structure for the second mirror M2 of the projection optical system PO shown in FIG. 8. As shown in FIG. 14A, the mirror M2 is supported by the lower surface of an unillustrated three-point seat which is provided inwardly to protrude at three positions of a cylindrical mirror frame 90, at its circumferential portion on the side of the back surface (upper surface in FIG. 14A) in the same manner as in the ordinary technique. The mirror M2 is fixed by an unillustrated holding plate at three positions of its circumferential portion on the side of the front surface (reflecting surface). A packing (not shown) is interposed between the mirror frame 90 and the side surface of the mirror M2 so that the mirror M2 is neither deviated nor disengaged. In this embodiment, a plurality of holes are formed at predetermined spacing distances in the mirror frame 90. Heat pipes HP are inserted into the respective holes. Each of the heat pipes HP has its heat release section (condensation section) which is connected to the body tube PP, and it has its heat input section (evaporation section) which is allowed to make contact with the back surface or front surface of the mirror M2. However, actually, as shown in FIG. 14B, the tip of the heat pipe HP provided on the front surface side of the mirror M2 abuts against the front surface of the mirror M2 via a buffer member 92 such as silicon. Accordingly, the reflecting surface of the mirror M2 is prevented from occurrence of distortion or the like.

The remaining mirrors M1, M3, M4 are also supported by support structures constructed in the same manner as described above, and the heat input section of each of the heat pipes HP is allowed to make abutment in the same manner as described above.

Each of the mirrors M1 to M4 is supported by each of the support structures as described above, and it is connected to the inner member 50 of the body tube PP by the aid of the heat pipe HP.

As explained in detail above, according to the exposure apparatus 10 concerning the third embodiment, when the temperature is raised in the plurality of mirrors M1 to M4 for constructing the projection optical system PO due to the absorption of the illumination light beam EL, the heat exchange is performed between the mirrors M1 to M4 and the body tube PP by the aid of the heat pipe HP as the heat exchanger. Accordingly, the mirrors M1 to M4 are forcibly cooled to the temperature of the body tube PP. In this arrangement, the body tube PP for holding the mirrors M1 to M4 is cooled by the cooling jacket 52 as the body tube-cooling unit. The heat exchange by the heat pipe HP is continuously performed during the radiation of the illumination light beam EL onto the mirrors M1 to M4. Therefore, it is possible to avoid the deformation of the mirrors M1 to M4 connected with the heat pipes HP. It is possible to avoid the deterioration of the image formation characteristic of the projection optical system PO. As a result, it is possible to suppress the deterioration of the transferred image due to the variation of radiation.

In this arrangement, the heat pipes HP are provided between the body tube PP and all of the mirrors M1 to M4 held by the body tube PP so that all of the mirrors M1 to M4 are prevented from any thermal deformation. However, there is no limitation thereto. It is also preferable that the heat exchanger such as the heat pipe HP is connected to only the first mirror M1 which has the shortest optical distance with respect to the reticle R and hence onto which the illumination light beam EL is firstly radiated. Alternatively, it is also preferable that the heat pipe HP is connected to the second mirror M2 in addition to the first mirror M1. The thermal energy of the illumination light beam EL is the highest at the position of the mirror M1. Therefore, it is desirable to forcibly cool the mirror M1 by providing the heat exchanger such as the heat pipe at least between the mirror M1 and the body tube PP, because of the following reason. That is, in this arrangement, it is possible to cool the mirror M1 which tends to cause the deterioration of the image formation characteristic because of the largest amount of heat absorption due to the shortest optical distance with respect to the reticle R. As a result, it is possible to efficiently suppress the deterioration of the transferred image due to the variation of radiation.

The third embodiment resides in the following arrangement. That is, the body tube PP is cooled, and the mirrors M1 to M4 are connected to the body tube PP via the heat pipes. Thus, the mirrors are cooled in accordance with the heat exchange effected by the heat pipes. In other words, the cooling unit for cooling the front surface side (reflecting surface) and the back surface side of the mirror M1 composed of the low expansion glass is constructed by combining the heat pipes HP and the cooling jacket 52. Therefore, it is possible to make the use of the advantage of the material having the small coefficient of thermal conductivity such as the low expansion glass with which the deformation thereof does not deteriorate the image formation characteristic even when the temperature is changed in a considerable degree. Further, the reflecting surface is directly cooled so as not to cause the temperature change exceeding the limit. Accordingly, it is possible to avoid the deterioration of the image formation characteristic of the projection optical system due to the radiation of the illumination light beam. As a result, it is possible to suppress the deterioration of the transferred image due to the variation of radiation. However, it is a matter of course that the present invention is not limited to the arrangement as described above. For example, when a reflecting optical system composed of a plurality of mirrors is used as the projection optical system PO, and at least one mirror of the plurality of mirrors is made of a material having a small coefficient of thermal conductivity (for example, low expansion glass), then a cooling unit (for example, Peltier element) may be directly arranged in a non-irradiated area of an illumination light beam on a reflecting surface of the mirror made of the low expansion glass, and the reflecting surface of the mirror may be directly cooled. The surface cooling is effective irrelevant to the coefficient of thermal conductivity of the mirror. However, especially in the case of a mirror having a small coefficient of thermal conductivity, the temperature gradient tends to occur when the back surface is cooled. Therefore, in such a case, it is more effective to directly cool the front surface (reflecting surface) (surface cooling effect).

The exposure apparatus 10 according to this embodiment uses the reflecting type reticle as the reticle R, and it is provided with the temperature control unit 36 including the second cooling unit arranged on the side opposite to the incoming side of the illumination light beam EL of the reticle R (side on the pattern plane). Therefore, it is also possible to suppress the variation of radiation on the reticle R. Thus, it is possible to more effectively suppress the deterioration of the transferred image due to the variation of radiation.

In this embodiment, the heat pipe HP is used as the heat exchanger. Therefore, it is possible to contribute to the realization of the light weight and the compact size of the equipment. However, there is no limitation thereto. It is allowable to use another heat exchanger.

The embodiment described above is illustrative of the case in which the body tube PP of the projection optical system PO is cooled all the time during the radiation of the illumination light beam EL. However, there is no limitation thereto. It is also preferable that the body tube is cooled beforehand. Even in such a case, when the illumination light beam EL outgoing from the reticle R is radiated onto the mirrors (reflecting optical elements) M1 to M4, and the temperatures of the mirrors M1 to M4 are raised by the thermal energy of the illumination light beam EL, then the heat exchange is effected between the mirrors and the body tube by the aid of the heat exchangers such as the heat pipes, and the mirrors are cooled. The heat exchange by the heat exchanger is performed until the temperature of the reflecting optical element is coincident with that of the body tube. Therefore, it is possible to avoid, to some extent, the deterioration of the image formation characteristic of the projection optical system PO due to the radiation of the illumination light beam EL. As a result, it is possible to suppress the deterioration of the transferred image due to the variation of radiation.

Fourth Embodiment

A fourth embodiment of the present invention will be explained on the basis of FIG. 15. Constitutive components, which are the same as or equivalent to those of the first and second embodiments described above, are designated by the same reference numerals, detailed explanation of which will be omitted.

Figure 15:
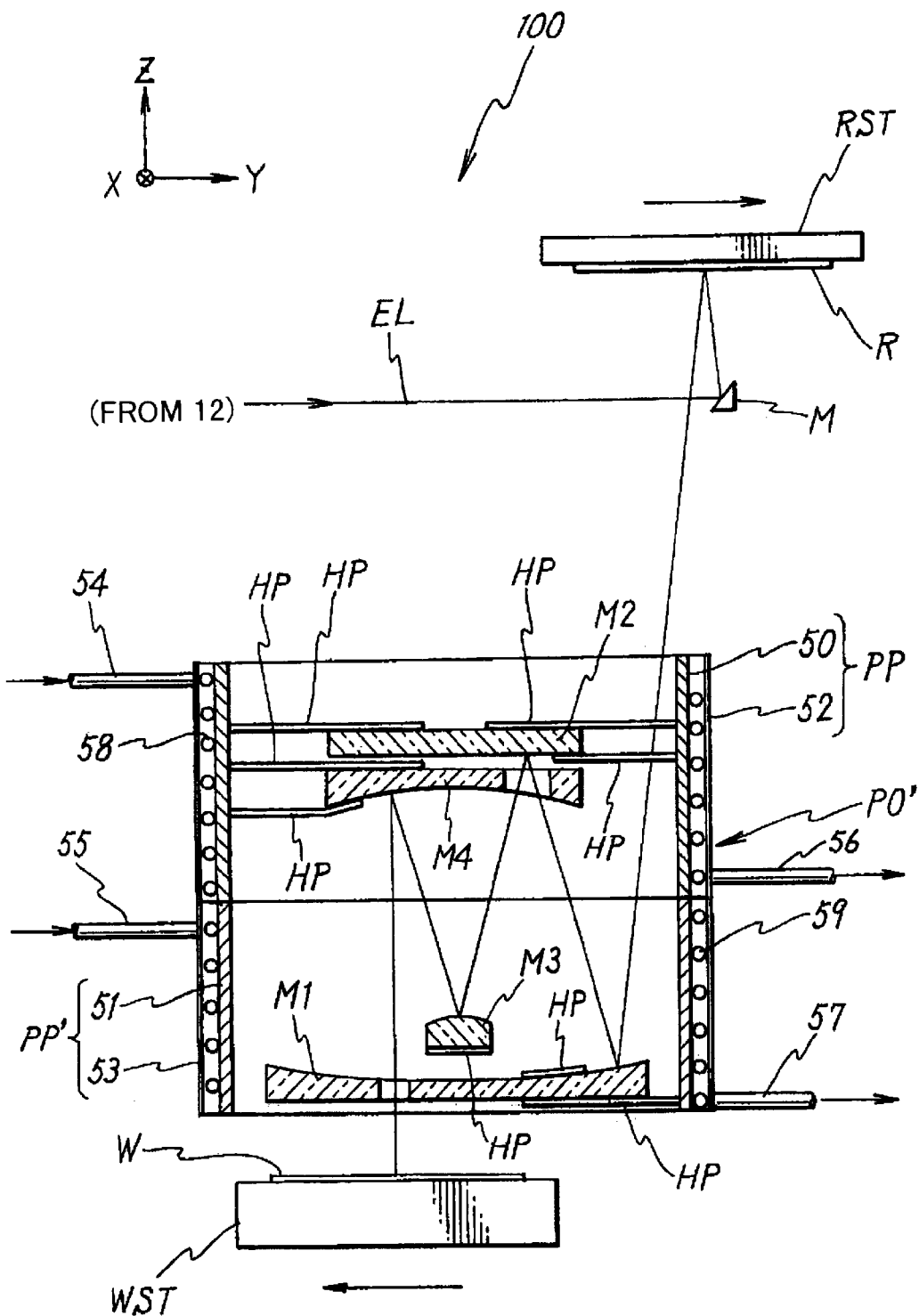
FIG. 15 schematically shows an overall arrangement of an exposure apparatus according to a fourth embodiment.
Figure 16:
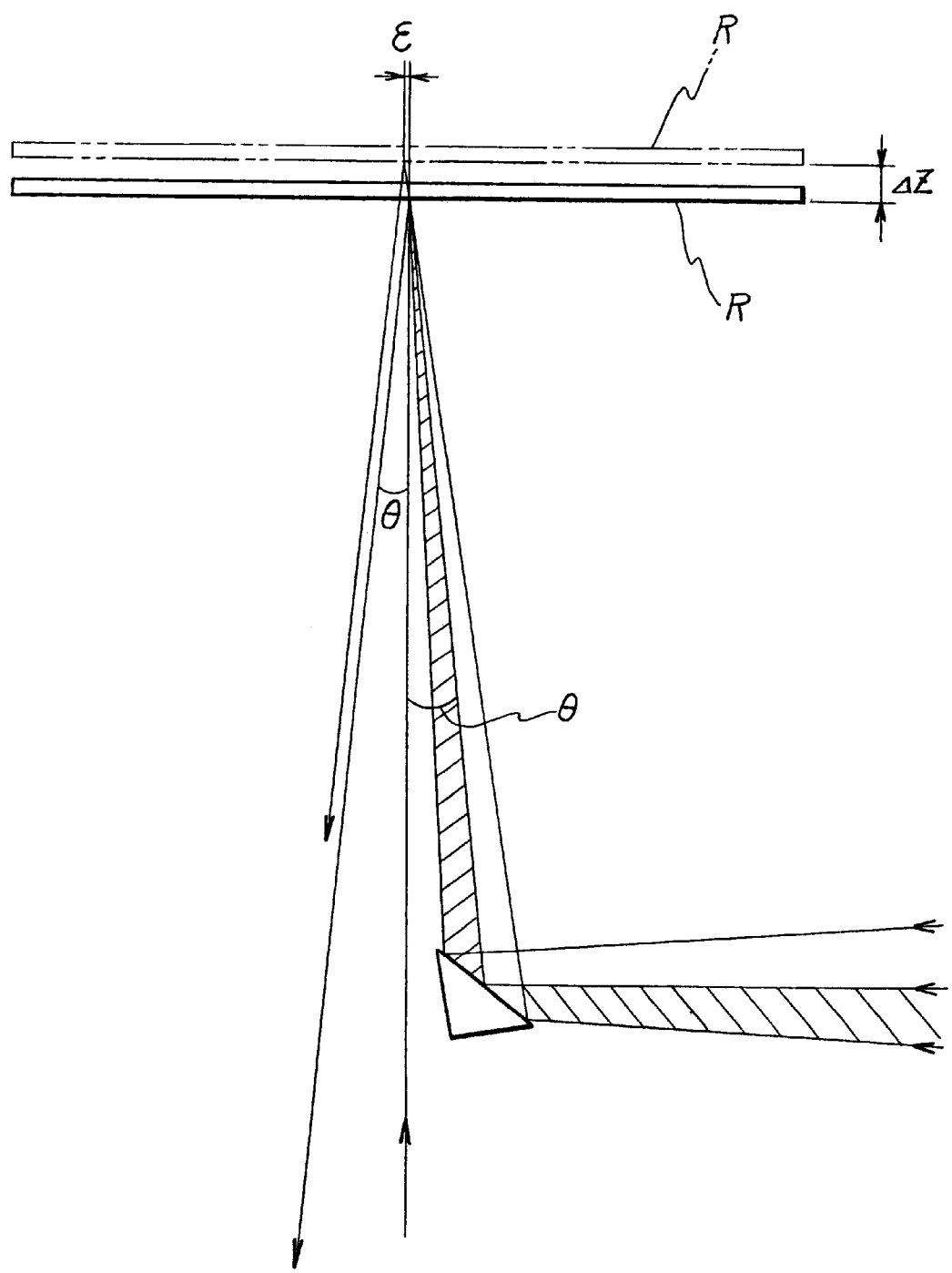
FIG. 16 illustrates the relationship concerning the angle of incidence into a reflecting type reticle, the displacement $\Delta Z$ of the reticle in the Z direction, and the lateral discrepancy of a pattern formed on the reticle.

As shown in FIG. 15, the overall arrangement of an exposure apparatus 100 according to the fourth embodiment is the same as the arrangement of the exposure apparatus schematically shown in FIG. 8 except that a projection optical system PO' is used in place of the projection optical system PO. The exposure apparatus 100 is also a projection exposure apparatus for performing the exposure operation based on the step-and-scan system by using the light beam (EUV light beam) in the soft x-ray region having the wavelength of 5 to 15 nm as the exposing illumination light beam EL, in the same manner as the exposure apparatus 10 described in the first embodiment.

As shown in FIG. 15, the projection optical system PO' comprises two parts of a first divided body tube PP and a second divided body tube PP' which are arranged in the Z direction and connected to one another. The respective divided body tubes PP, PP' are independently cooled by different cooling units respectively. That is, the first divided body tube PP has a double structure comprising an inner member 50 disposed on the inner side and a cooling jacket 52 as a body tube-cooling unit installed to the outer circumferential portion, in the same manner as in the body tube PP of the first embodiment described above. A helical pipe 58 for allowing the cooling liquid to flow from an inlet tube 54 to an outlet tube 56 is provided at the inside of the cooling jacket 52. In this embodiment, cooling water (or Florinate (trade name)) is used as the cooling liquid. The cooling water, which outflows via the outflow tube 56 from the cooling jacket 52, is subjected to heat exchange with respect to a cooling medium in an unillustrated refrigeration unit, and it is cooled to a predetermined temperature. After that, the cooling water inflows into the cooling jacket 52 via the inflow tube 54. Thus, the cooling water is circulated.

Similarly, the second divided body tube PP' has a double structure comprising an inner member 51 disposed on the inner side and a cooling jacket 53 as a body tube-cooling unit installed to the outer circumferential portion. A helical pipe 59 for allowing the cooling liquid to flow from an inlet tube 55 to an outlet tube 57 is provided at the inside of the cooling jacket 53. In this embodiment, cooling water is used as the cooling liquid. The cooling water, which outflows via the outflow tube 57 from the cooling jacket 53, is subjected to heat exchange with respect to the cooling medium in the unillustrated refrigeration unit, and it is cooled to a predetermined temperature. After that, the cooling water inflows into the cooling jacket 53 via the inflow tube 55. Thus, the cooling water is circulated.

In the fourth embodiment, mirrors M2, M4 are held in the divided body tube PP, and mirrors M1, M3 are held in the divided body tube PP'. The mirrors M2, M4 are connected to the divided body tube PP for holding them by the aid of the heat pipe HP as the heat exchanger. Similarly, the mirrors M1, M3 are connected to the divided body tubes PP' for holding them by the aid of the heat pipe HP as the heat exchanger.

An effect, which is equivalent to that obtained in the first embodiment described above, is obtained by the exposure apparatus 100 according to the fourth embodiment of the present invention constructed as described above. Additionally, the respective divided body tubes can be forcibly cooled to different temperatures by allowing the cooling water having different temperatures to flow into the cooling jackets 52, 53 of the respective divided body tubes PP, PP'. In this embodiment, the divided body tube PP', which holds the mirror M1 (and M3) for being firstly irradiated with the reflected light beam from the reticle R, is cooled at the temperature lower than that of the divided body tube PP which holds the mirror M2 (and M4). Accordingly, the mirror M1, which absorbs the largest amount of heat and which tends to deteriorate the image formation characteristic, is cooled more efficiently than the other mirrors. As a result, the deterioration of the transferred image due to the variation of radiation is efficiently suppressed.

The projection optical system and the illumination optical system described in the first to fourth embodiments are merely illustrative. The present invention is not limited thereto. For example, the present invention is also applicable not only to the exposure apparatus to be used for the production of microdevices such as semiconductor elements, liquid crystal display elements (display elements), thin film magnetic heads, and image-pickup elements (CCD) but also to the exposure apparatus for transferring the circuit pattern to the glass substrate and the silicon wafer in order to produce the reticle or the mask. The transmitting type reticle is generally used for the exposure apparatus based on the use of, for example, the DUV (far ultraviolet) light beam and the VUV (vacuum ultraviolet) light beam. In this case, for example, quartz glass, fluorine-doped quartz glass, fluorite, magnesium fluoride, or quartz crystal is used for the reticle substrate. On the other hand, the reflecting type mask is used for the EUV exposure apparatus. In this case, the transmitting type mask (stencil mask, membrane mask) is used for the electron beam exposure apparatus or the X-ray exposure apparatus based on the proximity system, and silicon wafer or the like is used for the mask substrate.

Each of the exposure apparatuses according to the embodiments described above can be produced by incorporating a projection optical system and an illumination optical system composed of a plurality of optical elements into a main exposure apparatus body to perform optical adjustment, and attaching a wafer stage and a reticle stage composed of a large number of mechanical parts to the main exposure apparatus body to connect wirings and pipings, followed by overall adjustment (for example, electric adjustment and confirmation of operation). It is desirable to produce the exposure apparatus in a clean room in which, for example, the temperature and the cleanness are managed.

The semiconductor device is produced by carrying out, for example, a step of designing the function and the performance of the device, a step of producing a reticle based on the designing step, a step of producing a wafer from a silicon material, a step of exposing the wafer with a pattern on the reticle by using any one of the exposure apparatuses according to the embodiments described above, a step of assembling the device (including a dicing step, a bonding step, and a packaging step), and an inspection step.

As explained above, according to the present invention, even in the case of the projection exposure apparatus based on the use of the reflecting type optical system as the projection optical system, it is possible to effectively suppress the occurrence of the magnification error and the positional discrepancy in the transferred image on the substrate due to the displacement of the mask in the direction of the optical axis. As a result, it is possible to improve the overlay accuracy in the overlay exposure.

Further, according to the present invention, there is provided the exposure method which makes it possible to effectively suppress the occurrence of the magnification error and the positional discrepancy in the transferred image on the substrate due to the displacement of the mask in the direction of the optical axis and which makes it possible to improve the overlay accuracy. According to the present invention, it is possible to effectively suppress the deterioration of the transferred image due to the variation of radiation. Therefore, when the present invention is used, for example, it is possible to realize the projection exposure with the high resolution based on the use of the EUV light beam. Thus, it is possible to produce the device with a high degree of integration in a highly accurate manner.

What is claimed is:

1. An exposure apparatus which transfers a pattern formed on a reflecting type mask onto a substrate, the exposure apparatus comprising:

a projection optical system provided with a reflecting optical system which projects the pattern onto the substrate;

a mask stage which holds the mask;

a substrate stage which holds the substrate;

an illumination system which radiates an exposing illumination light beam onto the mask at a predetermined angle of incidence with respect to a pattern plane of the mask; and a stage control system which synchronously moves the mask stage and the substrate stage in a second axis direction perpendicular to a first axis direction, while adjusting a position of the mask in the first axis direction which is a direction of an optical axis of the projection optical system, on the basis of predetermined adjusting position information, in order to transfer the pattern on the mask illuminated with the exposing illumination light beam onto the substrate via the projection optical system.

2. The exposure apparatus according to claim 1, wherein:

the adjusting position information includes first adjusting position information and second adjusting position information corresponding to movement directions of the mask stage on the second axis; and the stage control system adjusts the position of the mask in the first axis direction using the adjusting position information corresponding to a movement direction, of the first adjusting position information and the second adjusting position information for each movement direction of the mask stage during the synchronous movement of the mask stage and the substrate stage.

3. The exposure apparatus according to claim 1, wherein the adjusting position information is previously measured information.

4. The exposure apparatus according to claim 1, further comprising:

a measuring unit which measures the position of the mask in the first axis direction, wherein:

the stage control system measures the adjusting position information with the measuring unit during the synchronous movement of the mask stage and the substrate stage, and adjusts the position of the mask in the first axis direction based on the adjusting position information.

5. The exposure apparatus according to claim 4, wherein the measuring unit is an interferometer which measures the position of the mask in the first axis direction by radiating a measuring beam perpendicularly onto the mask and receiving a reflected light beam therefrom.

6. The exposure apparatus according to claim 5, wherein the interferometer radiates at least two measuring beams onto an irradiated area of the mask to be irradiated with the exposing illumination light beam, and measures the position of the mask in the first axis direction for each irradiated position of each of the measuring beams.

7. The exposure apparatus according to claim 5, wherein the interferometer radiates measuring beams onto different positions of the mask in the second axis direction, and measures the position of the mask in the first axis direction for each irradiated position of the measuring beams.

8. The exposure apparatus according to claim 5, wherein the interferometer has a reference mirror fixed to the projection optical system, and a main interferometer body arranged at a position separated from the projection optical system.

9. The exposure apparatus according to claim 4, wherein the stage control system adjusts the position of the mask in the first axis direction in accordance with feedforward control based on the measured adjusting position information.

10. The exposure apparatus according to claim 4, wherein the stage control system adjusts the position of the mask in the first axis direction in accordance with feedback control based on the measured adjusting position information.

11. The exposure apparatus according to claim 1, further comprising:
a slit plate arranged adjacent to the pattern plane of the mask and including a first slit which defines a first illumination area on the mask to be irradiated with the exposing illumination light beam and a second slit which defines a second illumination area to be irradiated with the exposing illumination light beam at a mark portion formed on the mask; and
a switching mechanism which switches the slit plate between a first position for radiating the exposing illumination light beam onto the first slit and a second position for radiating the exposing illumination light beam onto the second slit.

12. The exposure apparatus according to claim 11, wherein the first slit has a shape to define the first illumination area to have a circular arc-shaped configuration.

13. The exposure apparatus according to claim 1, wherein:
the mask stage, the substrate stage, and the projection optical system are supported by different support members;
the apparatus further comprises an interferometer system which measures positions of the mask stage and the substrate stage in a plane including the second axis perpendicular to the first axis; and
the interferometer system measures relative positions of the mask stage and the substrate stage in the plane including the second axis perpendicular to the first axis with respect to the member which supports the projection optical system.

14. The exposure apparatus according to claim 1, wherein:
the exposing illumination light beam is a light beam in a soft X-ray region; and
the apparatus further comprises, on the substrate stage, a spatial image-measuring instrument which includes a fluorescence-generating substance, an aperture formed on a surface thereof by a thin film of a reflective layer or an absorbing layer for the exposing illumination light beam, and a photoelectric converter element which photoelectrically converts light generated by the fluorescence-generating substance when the exposing illumination light beam arrives at the fluorescence substance via the aperture.

15. The exposure apparatus according to claim 1, wherein:

the exposing illumination light beam is a light beam in a soft X-ray region; and
the pattern on the mask is formed by applying a substance which absorbs the exposing illumination light beam, onto a reflective layer which reflects the exposing illumination light beam.

16. The exposure apparatus according to claim 1, further comprising an illumination light source, wherein the light source includes an exciting laser unit, an EUV light-emitting substance, and a mirror which collects EUV light and transmits the EUV light in a specified direction.

17. The exposure apparatus according to claim 16, wherein the mirror is a parabolic mirror with a multi-layered film formed on a reflecting surface.

18. The exposure apparatus according to claim 1, wherein the illumination system includes a wavelength selection filter.

19. The exposure apparatus according to claim 1, further comprising a common base board which supports the mask stage and the substrate stage so that the mask stage and the substrate stage are movable relative to the common base board, and a surface plate which supports the base board so that the base board is movable relative to the surface plate, wherein the base board is movable in response to reaction force generated by movement of at least one stage of the mask stage and the substrate stage.

20. The exposure apparatus according to claim 1, wherein the reflecting optical system includes a plurality of mirrors, the apparatus further comprises a heat exchanger which adjusts temperature of at least one of the mirrors, and the heat exchanger is installed on a non-irradiated area of a reflecting surface of at least one of the mirrors.

21. An exposure apparatus which transfers a pattern on a mask onto a substrate, the exposure apparatus comprising:
an illumination optical system which has an optical axis inclined with respect to a first direction perpendicular to the mask and which radiates an illumination light beam onto the mask;
a projection optical system which projects, onto the substrate, the illumination light beam reflected by the mask;
a driving unit which synchronously moves the mask and the substrate at a velocity ratio corresponding to a magnification of the projection optical system; and
a correcting unit which corrects an image magnification error of the pattern by relatively moving the mask in the first direction with respect to the projection optical system during the synchronous movement.

22. The exposure apparatus according to claim 21, wherein:
the illumination system radiates, as the illumination light beam, an EUV light beam having a wavelength of 5 to 15 nm onto the mask; and
the projection optical system consists of only a plurality of reflecting optical elements.

23. The exposure apparatus according to claim 22, wherein the reflecting optical elements are mirrors, the apparatus further comprises a heat exchanger which adjusts temperature of at least one of the mirrors, and the heat exchanger is installed on a non-irradiated area of a reflecting surface of at least one of the mirrors.

24. The exposure apparatus according to claim 21, wherein the correcting unit has a measuring unit which measures a position of the mask in the first direction, and the correcting unit moves the mask on the basis of an output of the measuring unit.

25. An exposure apparatus which transfers a pattern on a mask onto a substrate, the exposure apparatus comprising:
- an illumination optical system which radiates, onto the mask, an illumination light beam having a main light beam which is inclined with respect to a first direction perpendicular to the mask;
- a projection optical system which projects, onto the substrate, the illumination light beam outgoing from the mask;
- a driving unit which synchronously moves the mask and the substrate at a velocity ratio corresponding to a magnification of the projection optical system; and
- a correcting unit which compensates change in image magnification of the pattern caused by the movement of the mask.

26. The exposure apparatus according to claim 25, wherein:
- the mask is a reflecting type mask;
- the illumination optical system radiates, as the illumination light beam, an EUV light beam having a wavelength of 5 to 15 nm onto the mask; and
- the projection optical system consists of only a plurality of reflecting optical elements.

27. The exposure apparatus according to claim 26, wherein the reflecting optical elements are mirrors, the apparatus further comprises a heat exchanger which adjusts temperature of at least one of the mirrors, and the heat exchanger is installed on a non-irradiated area of a reflecting surface of at least one of the mirrors.

28. The exposure apparatus according to claim 25, wherein the correcting unit includes a driving member which moves the mask in the first direction on an object plane side of the projection optical system during the synchronous movement.

29. The exposure apparatus according to claim 28, wherein the driving member relatively inclines the mask with respect to the object plane of the projection optical system.

30. An exposure apparatus which transfers a pattern on a mask onto a substrate, the exposure apparatus comprising:
- an illumination optical system which radiates, onto the mask, an illumination light beam inclined with respect to a perpendicular line of the mask; and
- a projection optical system which projects, onto the substrate, the illumination light beam reflected by the mask, wherein:
- the illumination optical system has a field diaphragm which is arranged adjacent to an incoming side of the illumination light beam with respect to the mask and which defines an irradiated area of the illumination light beam on the mask, and the field diaphragm adjusts at least one of a shape, a size, and a position of the illumination area.

31. The exposure apparatus according to claim 30, wherein:
- the field diaphragm has a first aperture which radiates the illumination light beam onto a part of the pattern and a second aperture which radiates the illumination light beam onto a mark formed on the mask; and
- the apparatus further comprises a switching mechanism which switches the first aperture and the second aperture.

32. The exposure apparatus according to claim 31, wherein the first aperture is a circular arc-shaped aperture.

33. The exposure apparatus according to claim 30, wherein the projection optical system is a reflecting optical system composed of a plurality of mirrors, the apparatus further comprises a heat exchanger which adjusts temperature of at least one of the mirrors, and the heat exchanger is installed on a non-irradiated area of a reflecting surface of the at least one of the mirrors.

34. An exposure method which transfers a pattern formed on a mask onto a substrate via a projection optical system while synchronously moving the mask and the substrate, the exposure method comprising:
- preparing a reflecting type mask as the mask;
- using a reflecting optical system as the projection optical system; and
- transferring the pattern on the mask illuminated with an exposing illumination light beam onto the substrate via the projection optical system by radiating the exposing illumination light beam at a predetermined angle of incidence $\theta$ with respect to a pattern plane of the mask, wherein:
- the mask and the substrate are synchronously moved in a second axis direction perpendicular to a first axis direction which is a direction of an optical axis of the projection optical system while adjusting a position of the mask in the first axis direction on the basis of predetermined adjusting position information.

35. The exposure method according to claim 34, wherein:
- the adjusting position information includes first adjusting position information and second adjusting position information corresponding to movement directions of the mask on the second axis; and
- the position of the mask in the first axis direction is adjusted based on the adjusting position information corresponding to a movement direction of the mask, of the first adjusting position information and the second adjusting position information for each movement direction of the mask during the synchronous movement of the mask and the substrate.

36. The exposure method according to claim 34, wherein the adjusting position information is previously measured information.

37. The exposure method according to claim 34, wherein the adjusting position information is measured during the synchronous movement of the mask and the substrate, and the position of the mask in the first axis direction is adjusted based on the adjusting position information.

38. An exposure method for transferring a pattern on a mask onto a substrate via a projection optical system, the exposure method comprising:
- radiating an illumination light beam having a main light beam inclined with respect to a direction perpendicular to the mask;
- relatively moving the substrate with respect to the illumination light beam reflected by the mask to pass through the projection optical system in synchronization with relative movement of the mask with respect to the illumination light beam; and
- compensating change of an image magnification of the pattern caused by any movement of the mask during the synchronous movement of the mask and the substrate.

39. An exposure apparatus which transfers a pattern on a mask onto a substrate, the exposure apparatus comprising:
- an illumination optical system which obliquely radiates an illumination light beam onto a pattern plane of the mask;
- a projection optical system which projects the illumination light beam outgoing from the mask onto the substrate;

a driving unit which synchronously moves the mask and the substrate at a velocity ratio corresponding to a magnification of the projection optical system; and an adjusting unit which adjusts, during the synchronous movement, at least one of a position of the mask in a direction perpendicular to an object plane of the projection optical system and an inclination of the mask relative to the object plane.

40. An exposure apparatus which transfers a pattern formed on a mask onto a substrate by irradiating the mask with an illumination light beam, the exposure apparatus comprising:

a projection optical system which has a reflecting optical system consisting of a plurality of mirrors and which projects the pattern onto the substrate; and a cooling unit which cools at least one mirror of the plurality of mirrors, the cooling unit being arranged in a non-irradiated area of a reflecting surface of the at least one mirror.

41. The exposure apparatus according to claim 40, wherein the at least one mirror is composed of a material having a low coefficient of thermal conductivity.

42. The exposure apparatus according to claim 40, wherein the cooling unit is also arranged on a back surface side of the mirror for which the cooling unit is arranged on the reflecting surface.

43. An exposure apparatus which transfers a pattern formed on a mask onto a substrate via a projection optical system by irradiating the mask with an illumination light beam, the exposure apparatus comprising:

a reflecting optical system composed of a plurality of mirrors including a first mirror and a second mirror to be successively irradiated with the illumination light beam, the reflecting optical system being used as the projection optical system;

a body tube-cooling unit which cools a body tube that holds the plurality of mirrors; and a heat exchanger provided between the body tube and at least one mirror of the plurality of mirrors.

44. The exposure apparatus according to claim 43, wherein:

the body tube is composed of a plurality of divided body tubes which hold at least one mirror respectively;

the body tube-cooling unit independently cools the respective divided body tubes; and at least one heat exchanger is provided between each of the divided body tubes and at least one mirror held by the divided body tube.

45. The exposure apparatus according to claim 44, wherein:

one of the plurality of divided body tubes is the divided body tube which holds the first mirror to be firstly irradiated with the illumination light beam;

one of the heat exchangers is provided between the first mirror and the divided body tube which holds the first mirror; and the body tube-cooling unit cools the divided body tube which holds the first mirror at a temperature lower than those for the other divided body tubes.

46. The exposure apparatus according to claim 43, wherein the heat exchanger is a heat pipe.

47. The exposure apparatus according to claim 40, wherein:

the mask is a reflecting type mask; and the apparatus further comprises a second cooling unit arranged on a side opposite to an incoming side of the illumination light beam of the mask.

48. An exposure apparatus having an illumination optical system which radiates an illumination light beam onto a mask, and transferring a pattern formed on the mask onto a substrate, the exposure apparatus comprising:

a projection optical system which has a reflecting optical element and which projects the illumination light beam outgoing from the mask onto the substrate; and a heat exchanger provided between the reflecting optical element and a body tube which holds the reflecting optical element.

49. The exposure apparatus according to claim 48, wherein the heat exchanger is connected to at least one of a part of a reflecting surface of the reflecting optical element and a back surface thereof.

50. The exposure apparatus according to claim 48, wherein the projection optical system consists of only a plurality of reflecting optical elements, and at least one of the plurality of reflecting optical elements is connected to the heat exchanger.

51. The exposure apparatus according to claim 50, wherein the reflecting optical element of the plurality of reflecting optical elements, which has the shortest optical distance from the mask, is connected to the heat exchanger.

52. The exposure apparatus according to claim 50, wherein the projection optical system is an optical system which has a ring image field, which is non-telecentric on a side of an object plane, and which is telecentric on a side of an image plane.

53. The exposure apparatus according to claim 40, wherein the illumination light beam is an EUV light beam having a wavelength of 5 to 15 nm.

54. A method for producing an exposure apparatus which transfers a pattern formed on a reflecting type mask onto a substrate, the method comprising the steps of:

providing a projection optical system provided with a reflecting optical system which projects the pattern onto the substrate;

providing a mask stage which holds the mask;

providing a substrate stage which holds the substrate;

providing an illumination system which radiates an exposing illumination light beam onto the mask at a predetermined angle of incidence with respect to a pattern plane of the mask; and providing a stage control system which synchronously moves the mask stage and the substrate stage in a second axis direction perpendicular to a first axis direction, while adjusting a position of the mask in the first axis direction which is a direction of an optical axis of the projection optical system, on the basis of predetermined adjusting position information, in order to transfer the pattern on the mask illuminated with the exposing illumination light beam onto the substrate via the projection optical system.

55. A method for producing an exposure apparatus which transfers a pattern on a mask onto a substrate, the method comprising the steps of:

providing an illumination optical system which has an optical axis inclined with respect to a first direction perpendicular to the mask and which radiates an illumination light beam onto the mask;

providing a projection optical system which projects, onto the substrate, the illumination light beam reflected by the mask;

providing a driving unit which synchronously moves the mask and the substrate at a velocity ratio corresponding to a magnification of the projection optical system; and providing a correcting unit which corrects an image magnification error of the pattern by relatively moving the mask in the first direction with respect to the projection optical system during the synchronous movement.

56. A method for producing an exposure apparatus which transfers a pattern on a mask onto a substrate, the method comprising the steps of:

providing an illumination optical system which radiates, onto the mask, an illumination light beam having a main light beam which is inclined with respect to a first direction perpendicular to the mask;

providing a projection optical system which projects, onto the substrate, the illumination light beam outgoing from the mask;

providing a driving unit which synchronously moves the mask and the substrate at a velocity ratio corresponding to a magnification of the projection optical system; and providing a correcting unit which compensates change in image magnification of the pattern caused by the movement of the mask.

57. A method for producing an exposure apparatus which transfers a pattern on a mask onto a substrate, the method comprising the steps of:

providing an illumination optical system which radiates, onto the mask, an illumination light beam inclined with respect to a perpendicular line of the mask; and providing a projection optical system which projects, onto the substrate, the illumination light beam reflected by the mask, wherein:

the illumination optical system has a field diaphragm which is arranged adjacent to an incoming side of the illumination light beam with respect to the mask and which defines an irradiated area of the illumination light beam on the mask, and the field diaphragm is used to adjust at least one of a shape, a size, and a position of the illumination area.

58. A method for producing an exposure apparatus which transfers a pattern on a mask onto a substrate, the method comprising the steps of:

providing an illumination optical system which obliquely radiates an illumination light beam onto a pattern plane of the mask;

providing a projection optical system which projects the illumination light beam outgoing from the mask onto the substrate;

providing a driving unit which synchronously moves the mask and the substrate at a velocity ratio corresponding to a magnification of the projection optical system; and providing an adjusting unit which adjusts, during the synchronous movement, at least one of a position of the mask in a direction perpendicular to an object plane of the projection optical system and an inclination of the mask relative to the object plane.

59. A method for producing an exposure apparatus which transfers a pattern formed on a mask onto a substrate by irradiating the mask, the method comprising the steps of:

providing a projection optical system which has a reflecting optical system consisting of a plurality of mirrors and which projects the pattern onto the substrate; and providing a cooling unit which cools at least one mirror of the plurality of mirrors so that the cooling unit is arranged in a non-irradiated area of a reflecting surface of the at least one mirror.

60. A method for producing an exposure apparatus which transfers a pattern formed on a mask onto a substrate via a projection optical system by irradiating the mask with an illumination light beam, the method comprising the steps of:

providing a reflecting optical system composed of a plurality of mirrors including a first mirror and a second mirror to be successively irradiated with the illumination light beam, the reflecting optical system being used as the projection optical system;

providing a body tube-cooling unit which cools a body tube that holds the plurality of mirrors; and providing a heat exchanger disposed between the body tube and at least one mirror of the plurality of mirrors.

61. A method for producing an exposure apparatus which transfers a pattern formed on a mask onto a substrate, the method comprising the steps of:

providing an illumination optical system which radiates an illumination light beam onto the mask;

providing a projection optical system which has a reflecting optical element and which projects the illumination light beam outgoing from the mask onto the substrate; and providing a heat exchanger disposed between the reflecting optical element and a body tube which holds the reflecting optical element.

62. A microdevice produced by the exposure apparatus as defined in claim 1.

63. The exposure apparatus according to claim 43, wherein the illumination light beam is an EUV light beam having a wavelength of 5 to 15 nm.

64. The exposure method according to claim 38, wherein the change of the image magnification of the pattern is compensated by adjusting a position of the mask in a direction perpendicular to the mask.

65. The exposure method according to claim 64, wherein the position of the mask in the direction perpendicular to the mask is measured by radiating a measuring beam onto the mask so that the beam is directed in a direction perpendicular to the mask, and receiving a reflected light beam therefrom.

66. The exposure method according to claim 38, wherein the illumination light beam is an EUV light beam having a wavelength of 5 to 15 nm, and the projection optical system consists of only a plurality of reflecting optical elements.

67. The exposure method according to claim 66, wherein the reflecting optical elements are a plurality of mirrors, and at least one mirror of the plurality of mirrors is temperature-adjusted.

68. The exposure method according to claim 67, wherein the at least one mirror is temperature-adjusted by means of a heat exchanger installed on a non-irradiated area of a reflecting surface of the at least one mirror.

69. A method for producing a device, comprising the step of transferring the pattern formed on the mask onto the substrate using the exposure method as defined in claim 34.

70. A method for producing a device, comprising the step of transferring the pattern formed on the mask onto the substrate using the exposure method as defined in claim 38.

71. The exposure apparatus according to claim 48, wherein the illumination light beam is an EUV light beam having a wavelength of 5 to 15 nm.

72. A microdevice produced by the exposure apparatus as defined in claim 21.

73. A microdevice produced by the exposure apparatus as defined in claim 25.

74. A microdevice produced by the exposure apparatus as defined in claim 30.

75. A microdevice produced by the exposure apparatus as defined in claim 39.

76. A microdevice produced by the exposure apparatus as defined in claim 40.

77. A microdevice produced by the exposure apparatus as defined in claim 43.

78. A microdevice produced by the exposure apparatus as defined in claim 48.

79. The exposure apparatus according to claim 43, wherein the heat exchanger continuously performs heat-exchange during illumination of the illumination light beam onto the projection optical system.

80. The exposure apparatus according to claim 43, wherein the heat exchanger is connected to a mirror, which has the shortest optical distance with respect to the mask, among the plurality of mirrors of the projection optical system.

81. A light source unit comprising:
   a light source which generates a laser beam;
   a light-collecting lens which collects the laser beam generated from the light source at a predetermined light-collecting point;
   an EUV light-emitting substance which is arranged at the light-collecting point and emits an EUV light when the laser beam is radiated onto the substance;
   a parabolic mirror which is arranged between the light-collecting lens and the EUV light-emitting substance and reflects the EUV light on an inner surface of the parabolic mirror so that the EUV light is collected and converted into a parallel light flux, the parabolic mirror having a reflecting layer on the inner surface for selectively reflecting the EUV light; and
   a cooling unit which is attached to a back surface of the parabolic mirror and cools the parabolic mirror.

82. The light source unit according to claim 81, further comprising:
   a mirror which is arranged on a side of the inner surface of the parabolic mirror and deflects the EUV light converted into the parallel light flux in a predetermined direction, the mirror having a reflecting layer for selectively reflecting the EUV light on a surface onto which the EUV light is radiated; and
   a mirror cooling unit which is attached to the back surface of the mirror to cool the mirror.

83. The light source unit according to claim 82, further comprising a wavelength-selecting member which is arranged in a predetermined position with respect to the mirror to cut a visible light.

84. An exposure apparatus which transfers a pattern formed on a mask onto a substrate with an EUV light, comprising:
   a light source which generates the EUV light;
   a mask holder which holds the mask by an electrostatic chuck system;
   a temperature sensor which is arranged on the mask holder to measure a temperature of the mask holder; and
   a temperature control unit which controls the temperature of the mask holder on the basis of a measurement result of the temperature sensor.

85. The exposure apparatus according to claim 84, wherein the temperature sensor is disposed on a mask-chucking surface on the mask holder.

86. The exposure apparatus according to claim 85, wherein the temperature sensor has a plurality of sensors which are arranged at predetermined intervals on the mask holder.

87. The exposure apparatus according to claim 84, wherein the mask holder is formed of a material having an identical coefficient of linear expansion as a material of the mask.

88. An exposure apparatus which transfers a pattern formed on a mask onto a substrate with an EUV light, comprising:
   a light source which generates the EUV light; and
   a projection optical system which has a plurality of mirrors and projects an image of the pattern on the mask which is irradiated by the EUV light onto the substrate;
   wherein at least one of the plurality of mirrors is composed of low expansion glass having a small coefficient of thermal expansion and at least one of the plurality of mirrors is composed of metal.

89. The exposure apparatus according to claim 88, wherein a mirror having the shortest optical distance with respect to the mask among the plurality of the mirrors is composed of the low expansion glass.

90. The exposure apparatus according to claim 89, wherein a mirror having the longest optical distance with respect to the mask among the plurality of the mirrors is composed of the metal.

91. The exposure apparatus according to claim 90, wherein the projection optical system has first, second, third and fourth mirrors in order of shorter optical distance with respect to the mask, and the first and second mirrors are composed of the low expansion glass and the third and fourth mirrors are composed of the metal.

92. The exposure apparatus according to claim 88, wherein each of the plurality of mirrors has a reflective layer which is formed thereon to reflect the EUV light, and the reflective layer is a multi-layered film which is formed by alternately stacking two substances.

93. An exposure apparatus which transfers a pattern formed on a mask onto a substrate with an EUV light, comprising:
   a light source which generates the EUV light;
   a projection optical system which has a plurality of mirrors and projects an image of the pattern on the mask which is irradiated by the EUV light onto the substrate;
   a body tube which holds the projection optical system and has an inner body tube for holding the mirrors and an outer body tube provided at outer periphery of the inner body tube;
   a heat exchanger provided between the mirrors and the inner body tube; and
   a cooling unit provided on the outer body tube.

94. The exposure apparatus according to claim 93, wherein the heat exchanger is a heat pipe which connects the mirrors with the inner body tube.

95. The exposure apparatus according to claim 94, wherein the heat pipe is provided on both of front and back surfaces of at least one of the mirrors.

96. The exposure apparatus according to claim 93, wherein the cooling unit cools the body tube with a cooling medium flowing at an inside of the outer body tube.

97. The exposure apparatus according to claim 93, wherein the heat exchanger continuously performs heat-exchange during illumination of the EUV light onto the projection optical system.

98. The exposure apparatus according to claim 93, wherein the heat exchanger is connected to a mirror, which has the shortest distance with respect to the mask, among the plurality of mirrors of the projection optical system.

99. An exposure apparatus which transfers a pattern formed on a mask onto a substrate with an EUV light, comprising:

a light source which generates the EUV light; and a spatial image-measuring unit which measures a spatial image formed by illumination of the EUV light;

the spatial image-measuring unit including a light-emitting substance which emits a light with a longer wavelength than a wavelength of the EUV light when the EUV light is irradiated onto the light-emitting substance, and a light receiving element which receives the light emitted from the light-emitting substance to output an electrical signal corresponding to an intensity of the received light.

100. The exposure apparatus according to claim 99, wherein the spatial image-measuring unit further includes a planer member provided at a side of a light receiving surface of the light-emitting substance, the planer member being formed of a material which absorbs or reflects the EUV light and having an opening of a certain pattern.

101. The exposure apparatus according to claim 99, wherein the light-emitting substance emits a fluorescence.

102. The exposure apparatus according to claim 99, further comprising a substrate stage which holds a substrate, wherein the spatial image-measuring unit is provided on the substrate stage.

103. The exposure apparatus according to claim 102, wherein the spatial image-measuring unit constitutes a fiducial pattern member having a fiducial pattern, and is used for measuring a relative positional relationship between a position on the substrate at which the pattern of the mask is projected and a position of an alignment optical system.

104. An exposure apparatus which transfers a pattern formed on a reflecting type mask onto a substrate with an EUV light, comprising:

a light source which generates the EUV light; and an interferometer which irradiates a measuring beam onto the mask along a measuring axis to measure a position of the mask in a direction perpendicular to a pattern surface of the mask, the measuring axis having an optical path parallel to an optical path which is perpendicular to the pattern surface of the mask and passes through the middle of a plane defined by an incoming optical path and an outgoing optical path of the EUV light with respect to the mask.

105. The exposure apparatus according to claim 104, wherein the measuring axis has an optical path which is perpendicular to the pattern surface of the mask and passes through the middle of the plane defined by the incoming optical path and the outgoing optical path of the EUV light.

106. The exposure apparatus according to claim 104, wherein the measuring beam is irradiated to an area on the mask onto which the EUV light is illuminated.

107. The exposure apparatus according to claim 106, wherein the measuring axis includes a plurality of sub-measuring axes having respective sub-measuring beams which are irradiated along the sub-measuring axes onto the mask to measure positions on the area on the mask in the direction perpendicular to the pattern surface of the mask, respectively.

108. The exposure apparatus according to claim 107, wherein the respective sub-measuring beams include first, second and third measuring beams, the fist measuring beam is projected at the central point of the area on the mask onto which the EUV light is illuminated in a non-scanning direction of the mask, and the second and third beams are projected at symmetric positions with respect to a position on the mask at which the first measuring beam is projected.

109. A scanning type exposure apparatus which transfers a pattern formed on a reflecting type mask onto a substrate with an EUV light, comprising:

a light source which generates the EUV light;

a projection optical system which has a plurality of mirrors and projects the pattern illuminated by the EUV light onto the substrate;

a mask stage which is disposed at a predetermined side with respect to the projection optical system and is movable for scanning while holding the mask; and a substrate stage which is disposed at the predetermined side with respect to the projection optical system and is movable for scanning while holding the substrate.

110. The scanning type exposure apparatus according to claim 109, wherein the projection optical system has five mirrors.

111. The scanning type exposure apparatus according to claim 109, further comprising a surface plate, and a base board which is supported over the surface plate in a floating manner and supports a stage system including the mask stage and the substrate stage, wherein the base board is moved with respect to the surface plate in accordance with a reaction force exerted to the base board due to a change of a gravity position of the stage system.

\* \* \* \* \*